United States Patent
Saito et al.

(10) Patent No.: US 6,235,620 B1
(45) Date of Patent: May 22, 2001

(54) PROCESS FOR MANUFACTURING SEMICONDUCTOR INTEGRATED CIRCUIT DEVICE

(75) Inventors: Masayoshi Saito, Hachiouji; Makoto Yoshida, Ome; Hiroshi Kawakami, Hachiouji; Tadashi Umezawa, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/382,329

(22) Filed: Aug. 24, 1999

(30) Foreign Application Priority Data

Aug. 31, 1998 (JP) .................................... 10-246147

(51) Int. Cl.⁷ .................... H01L 21/3205; H01L 21/4763
(52) U.S. Cl. .......................... 438/586; 438/622; 438/624; 438/634; 438/672
(58) Field of Search .................. 438/586, 622, 438/623, 624, 634, 636, 672

(56) References Cited

U.S. PATENT DOCUMENTS

| | | | |
|---|---|---|---|
| 5,482,894 | * 1/1996 | Havemann | 438/624 |
| 5,578,524 | * 11/1996 | Fukase et al. | 438/624 |
| 5,668,052 | * 9/1997 | Matsumoto et al. | 438/624 |
| 5,795,820 | * 8/1998 | Kepler | 438/624 |
| 5,843,816 | * 12/1998 | Liaw et al. | 438/238 |
| 5,882,968 | * 3/1999 | Jun | 438/254 |
| 5,885,895 | * 3/1999 | Liu et al. | 438/637 |
| 5,994,227 | * 11/1999 | Matsuo et al. | 438/696 |
| 6,046,103 | * 4/2000 | Thei et al. | 438/624 |

FOREIGN PATENT DOCUMENTS 8125141   3/1996  (JP) .
8316313   11/1996 (JP) .

OTHER PUBLICATIONS

Akasaka, Y., et al., "Low Resistivity Poly—Metal Gate . . . ", IEEE Trans. Elec. Devices, vol. 43, No. 11, Nov. 1996, pp. 1864–1869.

* cited by examiner

Primary Examiner—T. N. Quach
(74) Attorney, Agent, or Firm—Antonelli, Terry, Stout & Kraus, LLP

(57) ABSTRACT

Described is a process for manufacturing a semiconductor integrated circuit device, to expose semiconductor regions over the surface of a semiconductor substrate in self-alignment to wiring lines (including gate electrodes) and element isolating regions when forming connection holes. The process includes a first step of coating a semiconductor substrate with a first conductive film, a first insulating film and a second insulating film sequentially, and patterning these films to form first conductive film patterns. A third insulating film is then formed over the semiconductor substrate, on the side walls of the first conductive film patterns and over the second insulating film, and a fourth insulating film is formed over the third insulating film. After forming the third and fourth insulating films, a mask for a first opening between adjoining ones of the first conductive film patterns is formed over the fourth insulating film, and the fourth insulating film exposed from the first opening of the mask is etched, under conditions that the fourth insulating film is more easily etched off than the third and second insulating films, to form a second opening in the fourth insulating film. Thereafter, the third insulating film, as exposed through the second opening, is anisotropically etched under conditions that the third insulating film is more easily etched off than the first insulating film and the fourth insulating film, to form a third opening.

43 Claims, 49 Drawing Sheets

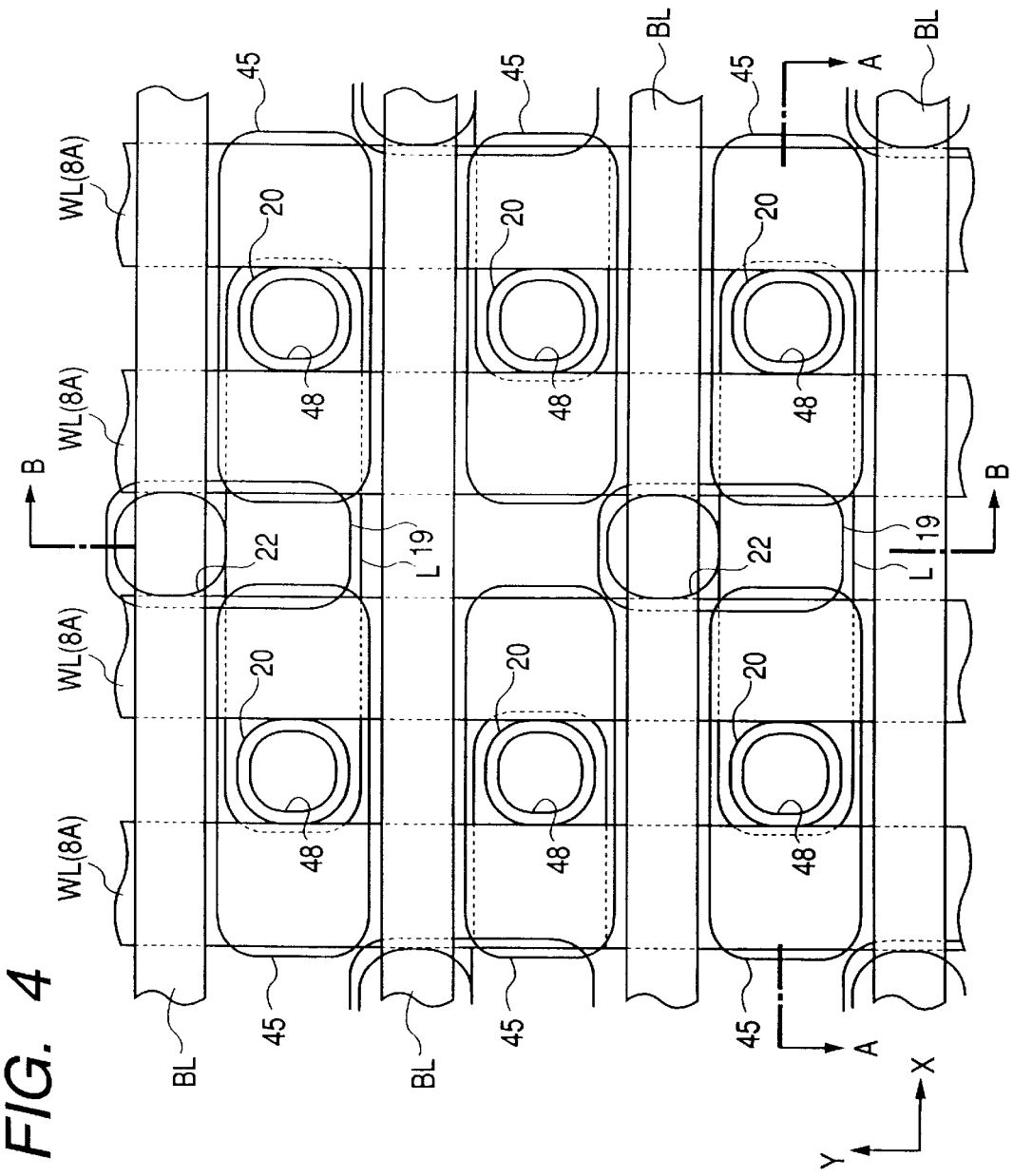

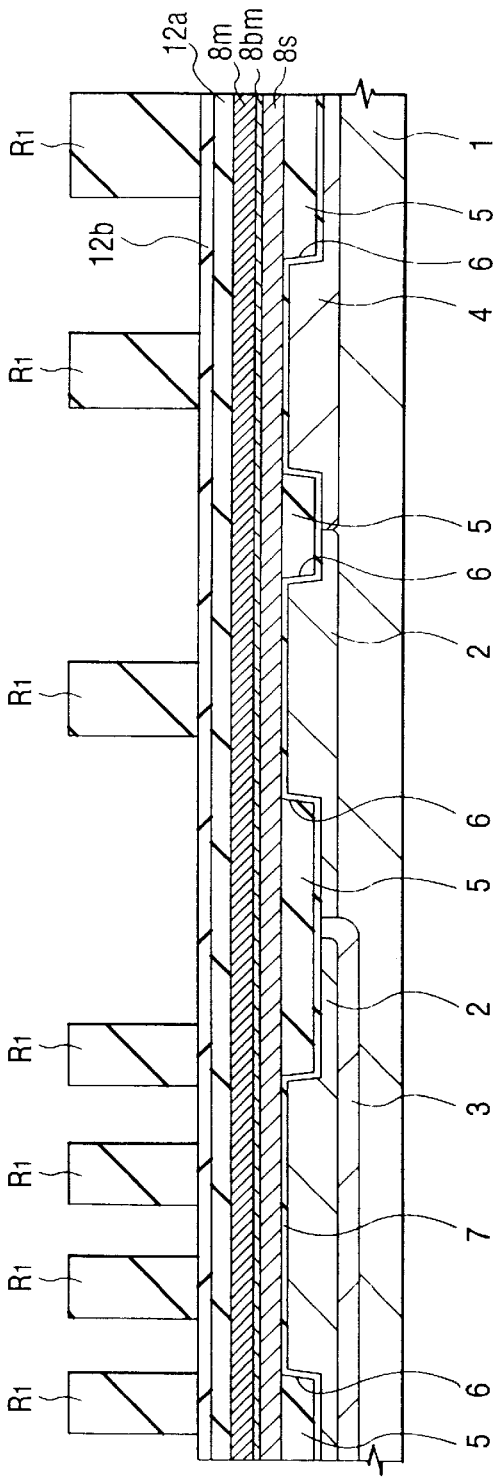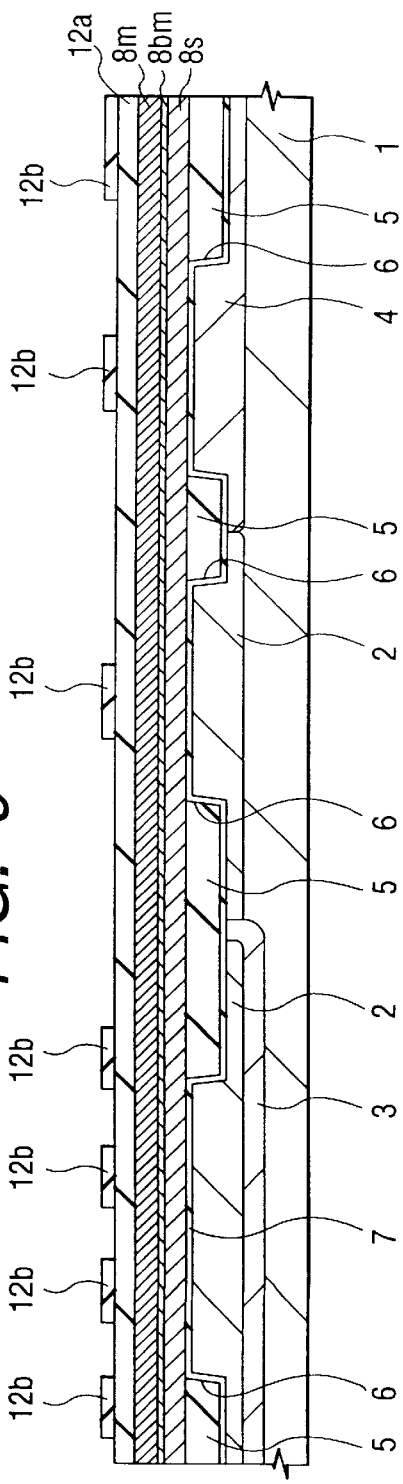

PROCESS FOR MANUFACTURING SEMICONDUCTOR INTEGRATED CIRCUIT DEVICE

BACKGROUND OF THE INVENTION

The present invention relates to a process for manufacturing a semiconductor integrated circuit device and, more particularly, to a technique for exposing semiconductor regions over the surface of a semiconductor substrate in self-alignment to wiring lines (including gate electrodes) and element isolating regions when connection holes are to be formed in a flattened layer insulating film.

As a first technique, the SAC (Self-Aligned Contact) technique for forming connection holes in a layer insulating film covering gate electrodes and in self-alignment with the gate electrodes is described on pp. 1864 to 1869 of IEEE Transaction ED-43, No. 11 (1996), for example. Here is disclosed a technique in which the gate electrodes are constructed to have the so-called "poly-metal structure", which means that a refractory metal film is laminated over a low-resistance poly-silicon film through a barrier metal film, and a cap insulating film over the gate electrodes and a side wall insulating film on the sides of the gate electrodes are formed of a silicon nitride film.

According to this technique, when the connection holes are to be formed in the layer insulating film of a silicon oxide film, they can be formed in self-alignment with the gate electrodes by etching them selectively with respect to the silicon nitride film. This makes it unnecessary to take a margin between the gate electrodes and the connection holes so that the size of a MISFET can be reduced to increase the number of MISFETs to be packaged in a chip of a predetermined size thereby to raise the degree of integration.

Here, as seen from the aforementioned first technique, the main flow is the element isolation structure (as called the "trench isolation") in which the element isolating insulating film made of a thermally oxidized film is replaced by the trenches formed in the surface of the semiconductor substrate and buried with a CVD oxide film or the like.

In the case of the aforementioned first technique, a margin has to be so retained between the opening of a photoresist mask and the element isolating regions that the opening of the mask does not extend over the element isolating regions when the connection holes are to be formed. If the opening of the photoresist mask extend over the element isolating regions, the oxide film in the trenches will also be etched at the time of etching the layer insulating film thereby to cause a danger of conduction between the semiconductor regions and the substrate.

Thus, it is needless to say that the retention of the margin between the mask opening and the element isolating regions raises a cause for preventing the size reduction of the MISFETs.

Although not well known in the art, on the other hand, here will be described a second technique (Japanese Patent Application No. 92608/1997) for forming the connection holes in self-alignment with the gate electrodes but without any margin from the element isolating regions.

In this second technique, a cap insulating film formed of only a silicon nitride film is formed over the gate electrodes, and the principal face of a semiconductor substrate, the side faces of the gate electrodes and the surface (including the side faces and the upper face) of the cap insulating film are coated with a thin silicon nitride film. In this second technique, the aforementioned connection holes for exposing the semiconductor substrate are formed at first by performing an etching treatment under such a condition that a layer insulating film made of a silicon oxide film is more easily etched off than the silicon nitride film, and when the thin silicon nitride film is exposed, by performing an etching treatment under such a condition that the silicon nitride film is more easily etched off than the layer insulating film. According to this second technique, it is possible to solve the problem that even if a silicon oxide film of the same kind as that of the layer insulating film is buried in the element isolating regions formed in the semiconductor substrate, the silicon oxide film buried in the element isolating regions is etched to establish the conduction between the semiconductor regions and the substrate at the time of forming connection holes.

SUMMARY OF THE INVENTION

The invention relates to a further improvement of the aforementioned second technique, and we have found out that the aforementioned second technique has the following problems.

The first problem is an increase in the aspect ratio of the aforementioned connection holes. According to the second technique, at the time of forming the aforementioned connection holes, the thin silicon nitride film over the semiconductor substrate is finally etched to expose the surface of the semiconductor substrate. According to the aforementioned technique, however, the cap insulating film is also formed of the silicon nitride film so that the cap insulating film portion, as exposed from the connection holes, is also etched off. When the cap insulating film is removed, however, the insulating film between the conductive film to be buried in the connection holes and the gate electrodes is thinned to lower the breakdown voltage. When the cap insulating film is completely etched to expose the gate electrodes, on the other hand, the conduction is established between the conductive film buried in the connection holes and the gate electrodes. It is, therefore, necessary to thicken the cap insulating film to such an extent that the cap insulating film may be formed over the gate electrodes after the formation of the connection holes was ended. With the cap insulating film being thickened, the height from the principal face of the semiconductor substrate to the upper face of the cap insulating film becomes larger than the ordinary one so that the aspect ratio of the connection holes increases. This makes it difficult to form the connection holes and to bury the conductive film in the connection holes, thereby to cause an increase in the electric resistance and a defective conduction in the connection holes.

The second problem is that the cap insulating film is scraped or bulged by a heat treatment after the cap insulating film was worked. In the aforementioned second technique, it is necessary to retain the thickness of the cap insulating film. According to our investigation results, however, it has been found out that as the cap insulating film becomes the thicker, the problem of the separation or expansion of the cap insulating film is made the more serious by the heat treatment after the formation of the cap insulating film. According to our investigation results, on the other hand, it has also been found out that the problem is serious when the gate electrode material (especially, the material at the portion where the cap insulating film contacts) is a refractory metal film.

On the basis of the invention, on the other hand, we have searched examples of the prior art on the SAC technique and have found out Japanese Patent Laid-Open No. 316313/1996 and Japanese Patent Laid-Open No. 125141/1996.

In FIG. 1 of the publication of the first searched technique, there is shown a process in which: an offset insulating film of silicon oxide is formed over gate electrodes; a silicon nitride film is then deposited and etched back; a side wall of a silicon nitride film is formed on the side walls of the gate electrodes; a thin silicon nitride film and a layer insulating film are deposited all over; the layer insulating film is etched under such a condition that a high etching selection ratio is set for the thin silicon nitride film and the side wall; and the thin silicon nitride film in the bottoms of contact holes is then etched to expose the substrate.

Since the etching selection ratio between the silicon oxide film and the silicon nitride film cannot be made infinite, according to this first searched technique, the thin silicon nitride film over the gate electrodes is etched, too, while the layer insulating film between the gate electrodes is being etched. This makes it necessary for this thin silicon nitride film to have such a thickness that it can reside till the end of the etching treatment of the layer insulating film.

In FIGS. 3 to 6 of the publication of the second searched technique, on the other hand, there is disclosed a process for forming connection holes in self-alignment with gate electrodes. In this technique: a silicon oxide film is formed over the gate electrodes; the silicon oxide film and a silicon nitride film are then deposited all over; a BPSG film or a layer insulating film is etched under the condition in which its selection ratio to the silicon nitride film is high; the silicon nitride film is then etched under such a condition that the etching rate of the silicon nitride film is higher than that of the BPSG film; and the silicon oxide film is then etched to form side walls.

Like the foregoing first searched technique, however, according to this second searched technique, the silicon nitride film over the gate electrodes is also etched while the layer insulating film between the gate electrodes is being etched. This makes it necessary for the silicon nitride film to have such a thickness that it can reside till the end of the etching treatment of the layer insulating film.

Therefore, an object of the invention is to provide a technique capable of lowering the aspect ratio of connection holes.

Another object of the invention is to provide a technique capable of preventing separation or bulge of a cap insulating film after formed.

The foregoing and other objects and novel features of the invention will become apparent from the following description to be made with reference to the accompanying drawings.

Of the invention disclosed herein, a representative will be briefly described in the following.

According to the invention, there is provided a process for manufacturing a semiconductor integrated circuit device. The process comprises the steps of:

(a) coating a semiconductor substrate with a first conductive film, a first insulating film and a second insulating film sequentially in the order of recited lower layers and patterning the same to form a plurality of first conductive film patterns;

(b) forming a third insulating film over the semiconductor substrate after the step (a), on the side walls of the first conductive film patterns and over the second insulating film, and forming a fourth insulating film over the third insulating film;

(c) after the step (b), forming a mask with a first opening between the adjoining ones of the plurality of first conductive film patterns over the fourth insulating film, and etching the fourth insulating film, as exposed from the first opening of the mask, under such a condition that the fourth insulating film is more easily etched off than the third and second insulating films, to form a second opening in the fourth insulating film; and (d) after the step (c), anisotropically etching the third insulating film, as exposed from the second opening of the fourth insulating film, under such a condition that the third insulating film is more easily etched off than the first insulating film and the fourth insulating film, to form a third opening for exposing the upper face of the semiconductor substrate, in the third insulating film between the adjoining first conductive film patterns.

BRIEF DESCRIPTION OF THE DRAWINGS

FIG. 4 is a schematic top plan view of the semiconductor substrate showing a portion of the memory array of the DRAM of FIG. 1.

FIG. 8 is a section of an essential portion of the semiconductor substrate showing the DRAM manufacturing process subsequent to FIG. 7.

FIG. 9 is a section of an essential portion of the semiconductor substrate showing the DRAM manufacturing process subsequent to FIG. 8.

DESCRIPTION OF THE PREFERRED EMBODIMENTS

Figure 1:
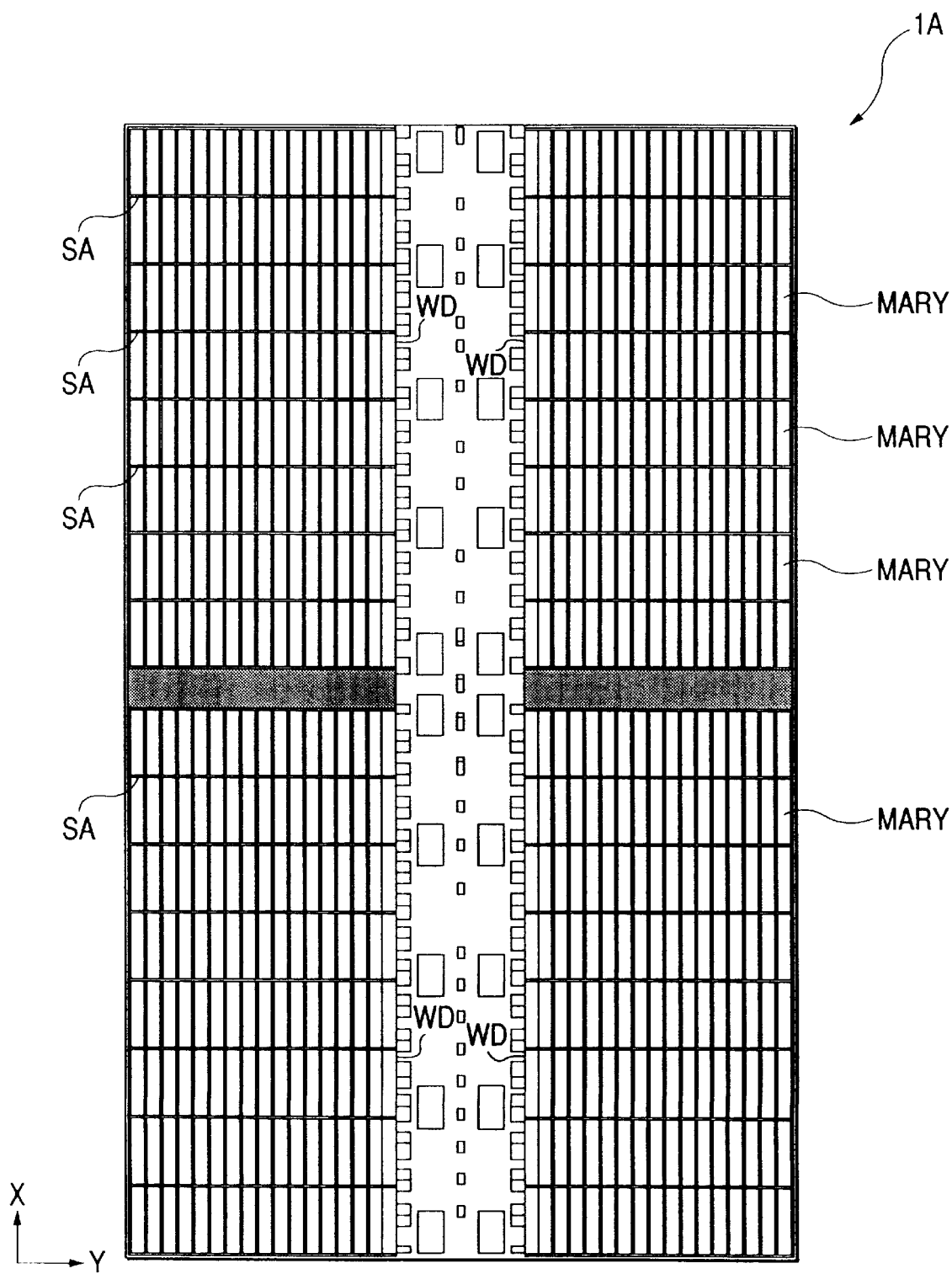
FIG. 1 is a top plan view showing the entirety of a semiconductor chip having a DRAM formed according to one embodiment of the invention.

The invention will be described in detail in connection with its embodiments with reference to the accompanying drawings (Here throughout all the Figures for describing the embodiments, the repeated description of components having identical functions will be omitted by designating them by common reference numerals).

FIG. 1 is a entire top plan view of a semiconductor chip having a DRAM according to this embodiment. Over the principal face of a semiconductor chip 1A made of single crystalline silicon, as shown, a number of memory arrays MARY are arranged in a matrix shape in an X-direction (or in the longer side direction of the semiconductor chip 1A) and in a Y-direction (or in the shorter side direction of the semiconductor chip 1A). A sense amplifier SA is arranged between the memory arrays MARY which are adjacent to each other in the X-direction. At a central portion of the principal face of the semiconductor chip 1A, there are arranged word drivers WD, control circuits such as data line selecting circuits, input/output circuits, bonding pads and so on.

Figure 2:
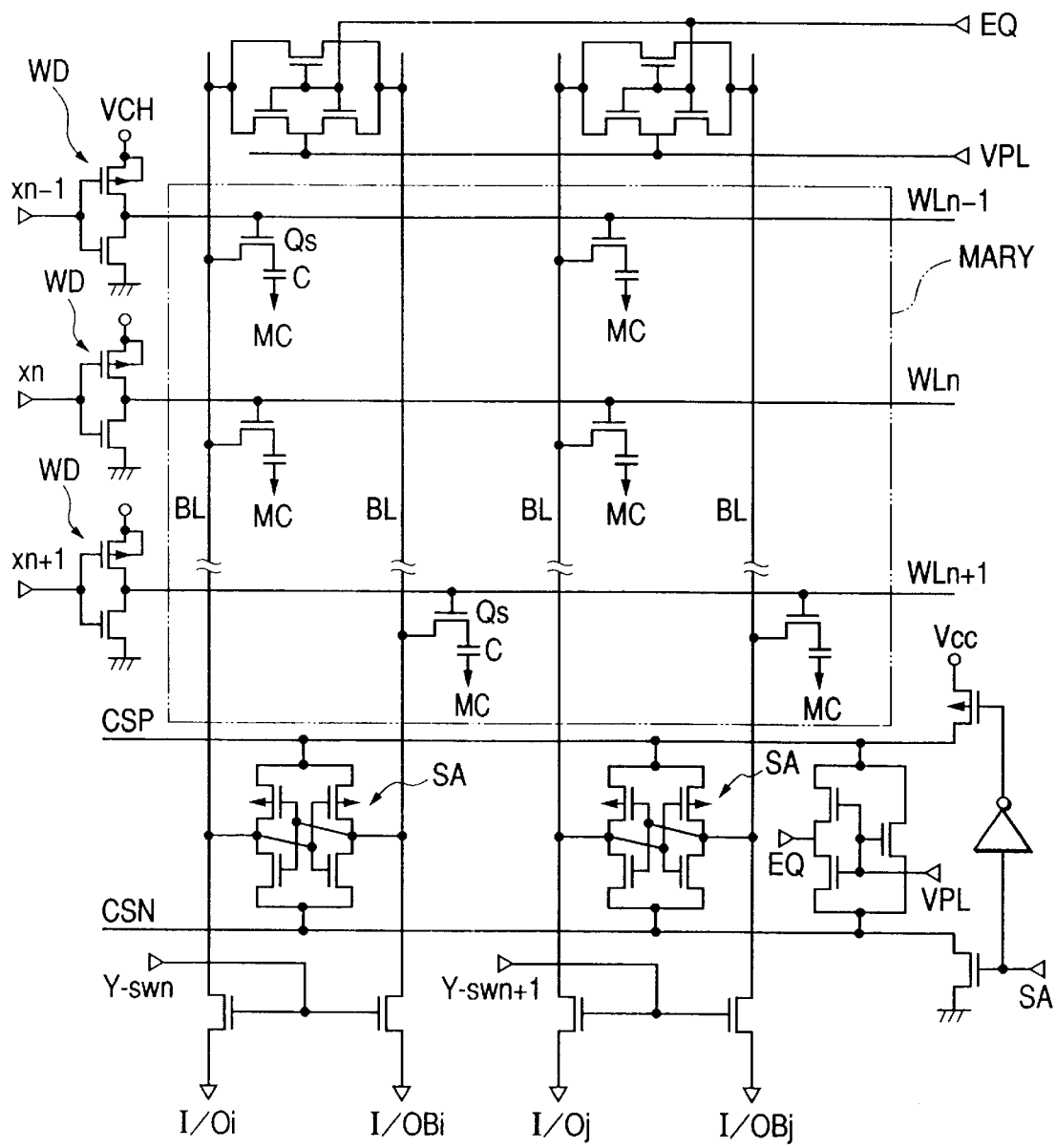
FIG. 2 is an equivalent circuit diagram of the DRAM of FIG. 1.

FIG. 2 is an equivalent circuit diagram of the aforementioned DRAM. As shown, a memory array (MARY) of this DRAM is constructed to include: a plurality of word lines WL (WLn-1, WLn, WLn+1, . . . ) extending in the row direction; a plurality of bit lines BL extending in the column direction; and a plurality of memory cells (MC) arranged at their intersections. One memory cell for storing 1 bit of information is constructed to include one information storing capacity element C, and one memory cell selecting MISFET Qs connected in series with the capacity element C. One of the source and drain of the memory cell selecting MISFET Qs is electrically connected with the information storing capacity element C, and the other is electrically connected with the bit line BL. One end of the word lines WL is connected with the word driver WD, and one end of the bit lines BL is connected with the sense amplifier SA.

Figure 3:
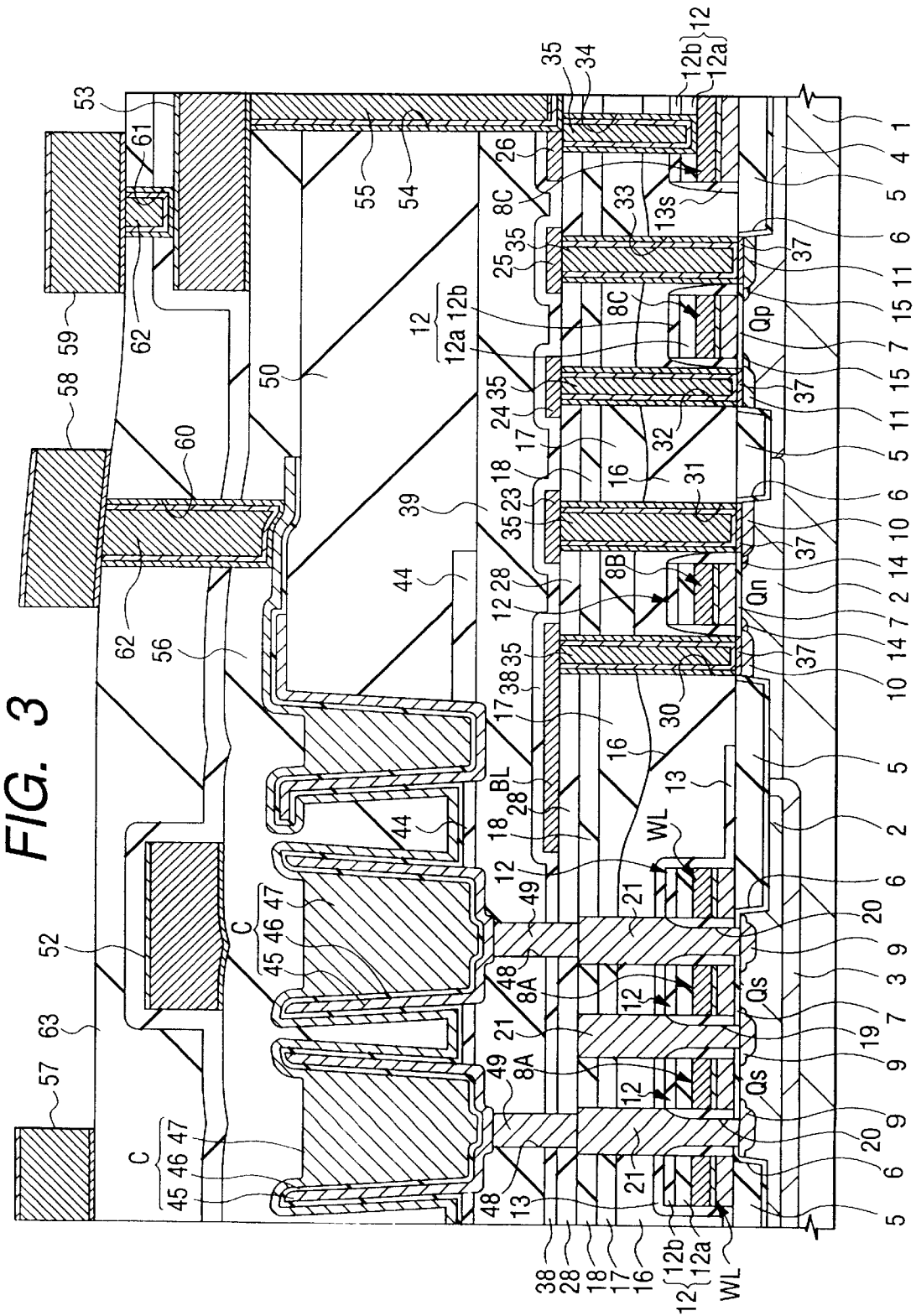
FIG. 3 is a section of an essential portion of a semiconductor substrate and showing individual portions of a memory array and a peripheral circuit of the DRAM of FIG. 1.
Figure 5B:
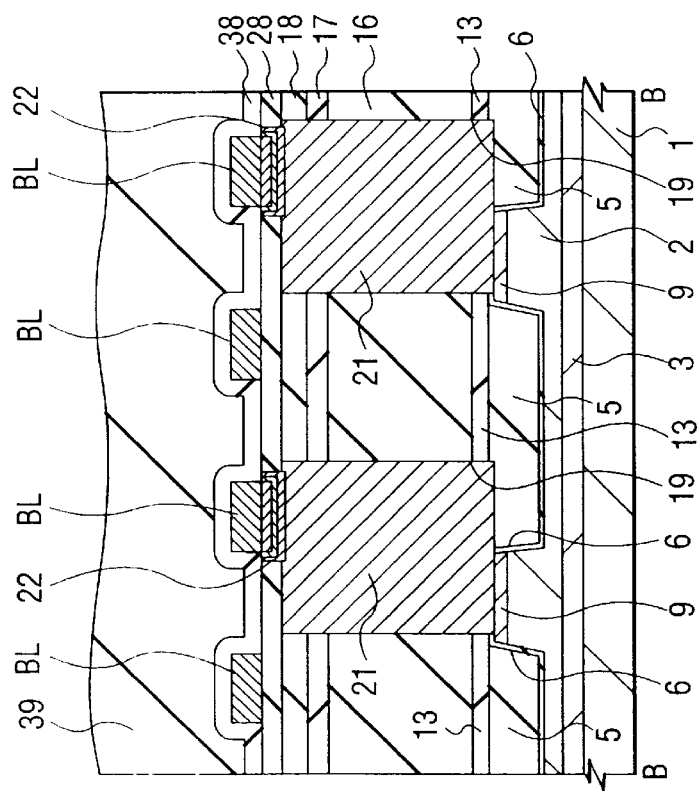
FIG. 5(b) is an enlarged section of an essential portion taken along line B—B.
Figure 5A:
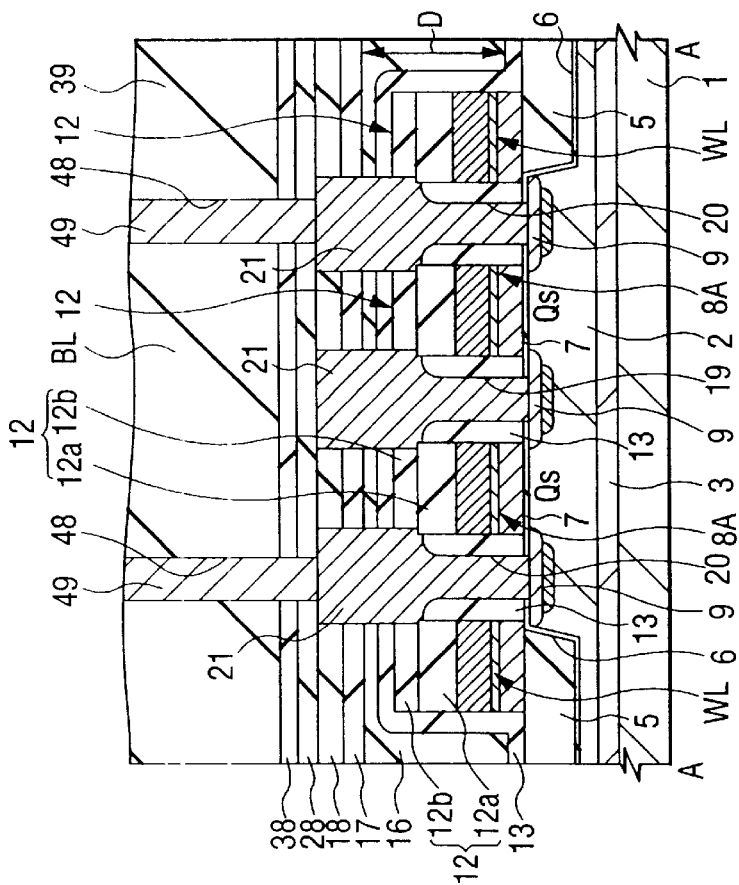
FIG. 5(a) is an enlarged section of an essential portion taken along line A—A of FIG. 4.

FIG. 3 is a section of an essential portion of a semiconductor substrate and shows individual portions of a memory array and a peripheral circuit of the DRAM; FIG. 4 is a schematic top plan view of the semiconductor substrate and shows a portion of the memory array; FIG. 5(a) is an enlarged section taken along line A—A of FIG. 4 and shows a contact hole portion of the memory array; and FIG. 5(b) is an enlarged section taken along line B—B (or line intersecting contact holes for bit lines) and along a direction to intersect FIG. 5(a) (although the information storing capacity elements C are omitted). Here, FIG. 4 shows only conductive layers (excepting plate electrodes) constructing the memory cells but omits the illustrations of insulating films between the conductive layers and the wiring lines to be formed over the memory cells.

The memory cells of the DRAM are formed in p-type wells 2 formed over the principal face of a semiconductor substrate 1 (or semiconductor chip) made of p-type single crystalline silicon. The p-type wells 2 of the region (or memory array), in which the memory cells are formed, are electrically isolated from the semiconductor substrate 1 through an n-type semiconductor region 3 formed thereunder, so as to prevent invasion of noises from an input/output circuit formed in another region of the semiconductor substrate 1 and the like.

A memory cell is constructed to have the stacked structure in which the information storing capacity element C is arranged over the memory cell selecting MISFET Qs. This memory cell selecting MISFET Qs is constructed of the n-channel type and is formed, in FIG. 4, in an active region L which is constructed of an elongated island shaped pattern extending straight in the X-direction (or the column direction). In each active region L, two memory cell selecting MISFETs Qs sharing one (or an n-type semiconductor region 9) of the source and drain are formed adjacent to each other in the X-direction.

The element isolating region enclosing the active region L is formed of element isolating trenches 6 which are formed in the p-type wells 2. In the element isolating trenches 6, there is buried a silicon oxide film 5 which is flattened to have a surface substantially at the same level as that of the surface of the active region L. In short, the trench isolation is established. The element isolating region thus formed by those element isolating trenches 6 has no bird's beak formed at the end portion of the active region L so that it has a larger effective area than that of the element isolating region (or field oxide film) which is formed to have an equal size by the LOCOS (or local oxidation of silicon) method. In other words, the element isolating region by the element isolating trenches 6 can improve the degree of element integration because it can effect the element isolation with a smaller area than that of the case of the field oxide film structure to such an extent as can eliminate the bird's beak which will not effectively function as the element isolation.

The memory cell selecting MISFET Qs is constructed mainly of a gate insulating film 7, a gate electrode 8A and a pair of n-type semiconductor regions 9 and 9 forming the source and drain. This gate insulating film 7 is made of silicon oxide, for example, to have a thickness of about 8 nm.

The gate electrodes (of a first conductive film pattern) 8A of the memory cell selecting MISFETs Qs are made integral with the word lines WL and are individually extended straight with an equal width and an equal space in the Y-direction. Both the width of the gate electrodes 8A (or the word lines WL), i.e., the gate length and the space of the two adjoining gate electrodes 8A (or the word lines WL) are substantially equal to the minimum working size that is determined by the resolution limit of the photography. Here, the width of the gate electrodes 8A and the space between the two adjoining gate electrodes 8A are exemplified by about 220 nm.

The gate electrodes 8A have a poly-metal structure which is constructed, for example, to include: a low-resistance polycrystalline silicon film doped with an impurity such as P (phosphor); a barrier metal film formed of a WN (tungsten nitride) and the like over the polycrystalline silicon film; and a refractory metal film and the like formed of a W (tungsten) film over the barrier metal film. The gate electrodes 8A (or the word lines WL) of the poly-metal structure have a lower electric resistance (1 to 2 Ω/□ in terms of a sheet resistance) than that of the gate electrodes which are formed of a polycrystalline silicon film or a polycide film, so that they can reduce a signal delay in the word lines. As a result, the accessing rate of the DRAM can be improved. On the other hand, the number of memory cells to be connected with one word lines WL can be increased to reduce the area occupied by the entire memory region and accordingly the size of the semiconductor chip. In this embodiment, for example, 512 memory cells can be connected with the word lines WL. This can reduce the size of the semiconductor chip by about 6 to 10%, as compared with the case in which 256 memory cells can be connected with the word lines WL. As a result, the production yield can be increased to promote the cost reduction in the DRAM. With the size of the semiconductor chip being unchanged, on the other hand, the degree of element integration can be improved. Here: the lowermost layer of the gate electrodes 8A, i.e., the polycrystalline silicon film has a thickness of about 100 nm, for example;

the overlying tungsten nitride film has a thickness of about 5 nm, for example; and the overlying tungsten film has a thickness of about 50 to 100 nm, for example.

The peripheral circuit of the DRAM is constructed to include n-channel MISFETs Qn and p-channel MISFETs Qp. The n-channel MISFETs Qn are formed in the p-type wells 2 and constructed mainly of a gate insulating film 7, gate electrodes 8B and a pair of $n^+$-type semiconductor regions 10 and 10 forming the sources and drains. On the other hand, the p-channel MISFETs Qp are formed in n-type wells 4 and constructed mainly of a gate insulating film 7, gate electrodes 8C and a pair of $p^+$-type semiconductor regions 11 and 11 forming the sources and drains. The gate electrodes (of the first conductive film pattern) 8B and 8C are constructed to have the same poly-metal structure as that of the gate electrodes 8A (or the word lines WL). The n-channel MISFET Qn and the p-channel MISFET Qp constructing the peripheral circuit are manufactured according to a looser design rule as that of the memory cells. Of the MISFETs in the peripheral circuit region, the MISFET, as demanded to have a high speed, is made at the gate insulating film 7 to have a thickness of about 4 nm, for example, which is smaller than that of the gate oxide film of the MISFETs in the memory cell array.

Over the gate electrodes 8A (or the word lines WL) of the memory cell selecting MISFETs Qs, there is formed a cap insulating film 12. This cap insulating film 12 is constructed, in this embodiment, of a laminated film (as will also be called the "laminated cap") of a silicon oxide film (or a first insulating film) 12a formed over the gate electrodes 8A, and a silicon nitride film (or a second insulating film) 12b formed over the silicon oxide film 12a. This silicon oxide film 12a has a thickness of about 100 nm, for example, and the silicon nitride film 12b has a thickness of about 40 nm. However, the thicknesses of those silicon oxide film 12a and silicon nitride film 12b should not be limited thereto but could be modified in various manners. These film thicknesses will be described in detail hereinafter.

The silicon oxide film 12a has the following first to third functions, for example. The first function is to relax the film shrinkage, as caused by a heat treatment step, of the silicon nitride film 12b so that the isolation of the cap insulating film 12, as might otherwise be caused by the heat treatment after the cap insulating film 12 was formed, can be suppressed.

The second function is to act as an etching stopper when later-described contact holes are to be formed. As a result, at the time of forming the contact holes, the silicon oxide film 12a is not etched off so much that it can retain its thickness thereby to improve the breakdown voltage between the conductive film in the contact holes and the gate electrodes 8A. On the other hand, the silicon nitride film 12b forming the cap insulating film 12 can be thinned. Therefore, the volumetric expansion of the silicon nitride film 12b, as caused by the heat treatment after the silicon nitride film 12b was formed, can be reduced to suppress the isolation of the silicon nitride film 12b. Since the silicon nitride film 12b can be thinned, on the other hand, the level from the principal face of the semiconductor substrate 1 to the upper face of the cap insulating film 12 can be lowered to reduce the aspect ratio of the aforementioned contact holes.

The third function is to act as a passivation film for the tungsten film in the gate electrodes 8A. As a result, the oxidation of the thin tungsten film of the gate electrodes 8A can be prevented in the process for manufacturing the semiconductor integrated circuit device. After the silicon oxide film 12a was formed, on the other hand, the consideration into the oxidation of the tungsten film of the gate electrodes during the manufacture process can be reduced to relax the manufacture conditions or the environmental conditions for the DRAM.

On the other hand, the silicon nitride film 12b forming the cap insulating film 12 has the following first to third functions, for example. The first function is to act as the etching stopper at the time of forming the aforementioned contact holes. The second function to act as the etching stopper when the side wall spacers are to be formed on the side faces of the gate electrodes and the cap insulating film 12. By these first and second function, the fine contact holes can be formed well in position but without any short-circuiting trouble. The third function is to act as the etching mask when the gate electrodes are to be formed. By using the silicon nitride film 12b as the etching mask at the time of treating the gate electrodes, the pattern forming accuracy can be improved to reduce generation of foreign substances when the photoresist film is used.

In the memory array over this semiconductor substrate 1, a thin silicon nitride film (or a third insulating film) 13 is formed to cover the surface of the cap insulating film 12, the side face of the gate electrodes 8A (or the word lines WL) and the upper face of the semiconductor substrate 1. The silicon nitride film 13 is formed to reflect the step of the substrate and given a thickness of about 50 nm, for example. However, the thickness of the silicon nitride film 13 should not be limited to 50 nm but may be larger. This thickness is desired to be as small as possible so that the adjoining gate electrodes 8A may not be completely buried in the silicon nitride film 13. In short, the thickness of the silicon nitride film 13 should be smaller than half of the distance between the gate electrodes 8A adjacent to each other. Here, the silicon nitride film 13 does not make direct contact with the semiconductor substrate 1, but a thin oxide film is present between the upper face of the semiconductor substrate 1 and the silicon nitride film 13.

Over the individual gate electrodes 8B and 8C of the MISFETs of the peripheral circuit, on the other hand, there are formed the cap insulating film 12. This cap insulating film 12 is also given the laminated cap structure similar to the aforementioned one. In the peripheral circuit region, however, side wall spacers 13s, as formed of the silicon nitride film 13, are formed on the side walls of the gate electrodes 8B and the overlying cap insulating film 12 and on the side walls of the gate electrodes 8C and the overlying cap insulating film 12.

The cap insulating film 12 and the silicon nitride film 13 of the memory array are employed as the etching stopper for forming the contact holes in self-alignment over the sources and drains (or the n-type semiconductor regions 9 and 9) of the memory cell selecting MISFETS Qs, as will be described hereinafter. On the other hand, the side wall spacers 13s of the peripheral circuit are employed for forming a lightly doped region and a heavily doped region in the source and drain of the n-channel MISFET Qn and in the source and drain of the p-channel MISFET Qp.

Over the memory cell selecting MISFETs Qs, the n-channel MISFETs Qn and the p-channel MISFETS Qp, individually, there is formed an SOG (Spin On Glass) film (or a fourth insulating film) 16. Over this SOG film 16, on the other hand, there are formed two layers of silicon oxide films (or a fourth insulating film) 17 and 18, of which the upper silicon oxide film 18 is flattened to have a surface substantially at the same level all over the semiconductor substrate 1.

Over the paired n-type semiconductor regions 9 and 9 forming the sources and drains of the memory cell selecting MISFETs Qs, there are formed contact holes 19 and 20 which extend through the silicon oxide films 18 and 17 and the SOG film 16. In these contact holes 19 and 20, there are buried plugs 21 which are formed of a polycrystalline silicon film of a low resistance doped with an n-type impurity (e.g., P (phosphor)). The diameters, as taken in the X-direction, of the individual bottom portions of the contact holes 19 and 20 are defined by the space between the silicon nitride film 13 of the side wall of one of the two opposed gate electrodes 8A (or the word lines WL) and the silicon nitride film 13 of the side wall of the other. In short, the contact holes 19 and 20 are formed in self-alignment with the space of the gate electrodes 8A (or the word lines WL). In this embodiment, moreover, the upper corner (or the portion formed where the side face and the upper face of the silicon oxide film 12a intersect) and its vicinity of the silicon oxide film 12a of the cap insulating film 12 are exposed from the insides of the contact holes 19 and 20 (as shown in FIG. 5(a)). When the cap insulating film 12 is formed of only the silicon nitride film, the portion corresponding to that upper corner portion is removed at the later-described time of forming the contact holes 19 and 20. As a result, the upper portion of the silicon nitride film 13 on the side faces of the gate electrodes 8A is also scraped to a lower level. In this case, when the cap insulating film is scraped too much, the defect in the breakdown voltage is caused. If the upper face of the gate electrodes is exposed, on the other hand, the short-circuiting defect occurs, and therefore, the cap insulating film has to be so thickened as to eliminate such defect. In this embodiment, because the upper corner portion of the silicon oxide film 12a can be left at the time of forming the contact holes 19 and 20, the insulating film can retain its thickness at the upper corner portion and its vicinity thereby to improve its breakdown voltage.

Of the paired contact holes 19 and 20, the Y-direction diameter of the contact holes 20 for connecting the information storing capacity elements C is smaller than that of the active region L. On the other hand, the Y-direction diameter of the contact holes 19 (i.e., the contact holes in the n-type semiconductor region 9, as shared by the two memory cell selecting MISFETs Qs) for connecting the bit lines BL is larger than that of the active region L. In short, the contact holes 19 are formed in a generally rectangular top plan pattern in which the Y-direction diameter is larger than the X-direction diameter (of the upper end portion), and is partially extended over the element isolating trenches 6 out of the active region L (as shown in FIGS. 4 and 5). The upper face of the element isolating region, as exposed from the contact holes 19 and 20, has a generally flat upper face. Since the contact holes 19 are formed in such pattern, it is unnecessary, when the bit lines BL and the n-type semiconductor region 9 are to be electrically connected through the plugs 21 in the contact holes 19, to enlarge the width of the bit lines BL partially and extend them so far over the active region L and to extend the active region L partially in the direction of the bit lines BL, so that the memory cell size can be reduced.

Over the silicon oxide film 18, there is formed a silicon oxide film 28. In this silicon oxide film 28 over the contact holes 19, there are formed through holes 22, in which there are buried plugs 35 formed of a conductive film by laminating a Ti film, a TiN film and a W film sequentially in the order of recited lower layers. In the interface between the plugs 35 and the plugs 21 buried in the contact holes 19 under the through holes 22, there is formed a $TiSi_2$ (titanium silicide) layer 37 which is generated by the reaction between the Ti film forming a portion of the plugs 35 and the polycrystalline silicon film forming the plugs 21. The through holes 22 are arranged over the element isolating trenches 6 apart from the active region L.

Over the silicon oxide film 28, there are formed the bit lines BL. These bit lines BL are arranged over the element isolating trenches 6 and extended straight in the X-direction with an equal width and an equal space. The bit lines BL are made of a W (tungsten) film and are electrically connected with one (or the n-type semiconductor region 9 shared by the two memory cell selecting MISFETs Qs) of the sources and drains of the memory cell selecting MISFETs Qs through the through holes 22 formed in the silicon oxide film 28 and through the contact holes 19 formed in the underlying insulating film (or the silicon oxide films 28, 18 and 17, the SOG film 16 and the gate insulating film 7). On the other hand, the bit lines BL are widened in their space as much as possible so that the parasitic capacity to be established between the adjoining bit lines BL may be reduced as much as possible.

Since the space of the bit lines BL is enlarged to reduce the parasitic capacity, the signal voltage at the time when the electric charge (or information), as stored in the information storing capacity elements C, is to be read out, can be raised even if the memory cell size is reduced. By enlarging the space of the bit lines BL, on the other hand, the open margin of through holes 48 (or through holes for connecting the information storing capacity elements C and the contact holes 20) to be formed in the space region of the later-described bit lines BL can be sufficiently retained so that the bit lines BL and the through holes 48 can be reliably prevented from any short-circuiting even when the memory cell size is reduced.

Moreover, the bit lines BL are enabled to lower their sheet resistance to about 2 $\Omega/\square$ by making themselves of the metal (W) so that the information can be read out and written in at a high speed. On the other hand, the bit lines BL and the later-described wiring lines 23 to 26 of the peripheral circuit can be simultaneously formed at a common step so that the process for manufacturing the DRAM can be simplified. By making the bit lines BL of the metal (W) having high resistances to heat and electromigration, on the other hand, break of the bit lines BL can be reliably prevented even when their width is miniaturized.

Over the silicon oxide film 28 of the peripheral circuit, there are formed of the first layer wiring lines 23 to 26. These wiring lines 23 to 26 are made of the same conductive material (W) as that of the bit lines BL and are formed simultaneously with the step of forming the bit lines BL, as will be described hereinafter. The wiring lines 23 to 26 are electrically connected with the MISFETs (or the n-channel MISFETs Qn and the p-channel MISFETs Qp) of the peripheral circuit through contact holes 30 to 34 formed in the silicon oxide films 28, 18 and 17 and the SOG film 16.

In the contact holes 30 to 34 for connecting the MISFETs of the peripheral circuit and the wiring lines 23 to 26, there are buried the plugs 35 which are formed of a conductive film by laminating a Ti film, a TiN film and a W film sequentially in the order of recited lower layers. Of these contact holes 30 to 34, on the other hand, the contact holes (30 to 33) formed over the sources and drains (or the $n^+$-type semiconductor region 10 and the $p^+$-type semiconductor region 11) of the MISFETs of the peripheral circuit have the $TiSi_2$ layer 37 formed in their bottom portions by the reaction between the Ti film forming a portion of the plugs 35 and the semiconductor substrate 1 (Si), thereby to lower the contact resistance between the plugs 35 and the sources and drains (or the n+-type semiconductor region 10 and the p+-type semiconductor region 11).

Over the bit lines BL and the first layer wiring lines 23 to 26, individually, there is formed a silicon oxide film 38, which is overlain by an SOG film 39. This SOG film 39 is flattened to have a generally equal level all over the semiconductor substrate 1.

Over the SOG film 39 of the memory array, there is formed a silicon nitride film 44, which is overlain by the information storing capacity elements C. This information storing capacity elements C is constructed to include a lower electrode (or storage electrode) 45, an upper electrode (or plate electrode) 47, and a $Ta_2O_5$ (tantalum oxide) film 46 formed inbetween. The lower electrodes 45 are formed of a low-resistance polycrystalline silicon film doped with P (phosphor), for example, and the upper electrodes 47 are formed of a TiN film, for example.

The lower electrodes 45 of the information storing capacity elements C are formed in an elongated pattern extending straight in the X-direction of FIG. 4. The lower electrodes 45 are electrically connected with the plugs 21 in the contact holes 20 through plugs 49 which are buried in the through holes 48 extending through the silicon nitride film 44, the SOG film 39 and the underlying silicon oxide films 38 and 28, and is further electrically connected through those plugs 21 with the other (or the n-type semiconductor region 9) of the sources and drains of the memory cell selecting MISFETs Qs. The through holes 48, as formed between the lower electrodes 45 and the contact holes 20, are made to have a smaller diameter (e.g., 0.14 microns) than the minimum working size so as to ensure to prevent the short-circuiting with the bit lines BL or the underlying plugs 35. The plugs 49, as buried in the through holes 48, are formed of a low-resistance polycrystalline silicon film doped with P (phosphor), for example.

Over the SOG film of the peripheral circuit, there is formed a silicon oxide film 50 which is given a large thickness to have a level substantially equal to that of the lower electrodes 45 of the information storing capacity elements C. Since the silicon oxide film 50 of the peripheral circuit is given such a large thickness, the surface of a layer insulating film 56 to be formed over the information storing capacity elements C takes substantially the same level at the memory array and the peripheral circuit.

Over the information storing capacity elements C, there is formed the layer insulating film 56, which is overlain by second layer wiring lines 52 and 53. The layer insulating film 56 is formed of a silicon oxide film, and the second layer wiring lines 52 and 53 are formed of a conductive film made mainly of Al (aluminum). The second layer wiring lines 53, as formed in the peripheral circuit, are electrically connected with the first layer wiring lines 26 through through holes 54 formed in the underlying insulating films (or the layer insulating film 56, the silicon oxide film 50, the SOG film 39 and the silicon oxide film 38). In the through holes 54, there are buried plugs 55 which are formed of a Ti film, a TiN film and a W film, for example.

Over the second layer wiring lines 52 and 53, there is formed a second layer insulating film 63, which is overlain by third layer wiring lines 57, 58 and 59. The layer insulating film 63 is formed of a silicon oxide-based insulating film (e.g., a three-layered insulating film of a silicon oxide film, an SOG film and a silicon oxide film), and similarly to the second layer wiring lines 52, 53, the third layer wiring lines 57, 58 and 59 are formed of a conductive film made mainly of Al.

The third layer word lines 58 are electrically connected with the upper electrodes 47 of the information storing capacity elements C through through holes 60 formed in the underlying layer insulating films 63 and 56, and the third layer wiring lines 59 of the peripheral circuit are electrically connected with the second layer wiring lines 53 through through holes 61 which are formed in the underlying layer insulating film 63. In these through holes 60 and 61, there are buried plugs 62 which are formed of a Ti film, a TiN film and a W film.

Here will be described the thicknesses of the silicon oxide film 12a and the silicon nitride film 12b of the aforementioned cap insulating film 12 with reference to FIG. 5. Here, reference letter D of FIG. 5 designates a thickness of the SOG film 16 from the upper face of the silicon nitride film 13 over the semiconductor substrate 1 to the upper face of the silicon nitride film 13 over the gate electrodes 8A.

First of all, the thickness of the silicon nitride film 12b will be described in the following. This silicon nitride film 12b is required to function as the etching stopper when the contact holes 19 and 20 are to be formed. Specifically, the silicon nitride films 12b and 13 have to be unremoved while the portion of the thickness D of the SOG,film 16 is being etched off so as to bore the contact holes 19 and 20. Ignoring the over-etching, therefore, it is necessary to satisfy a relation of D/ a first selection ration< the thickness of the silicon nitride film 12b+ the thickness of the silicon nitride film 13. Here, it is assumed that the thickness D= the thickness of the silicon nitride film 12b+ the thickness of the silicon oxide film 12a+ the thickness of the gate electrodes 8A, and that the first selection ratio can take about 8 at the minimum. If these are introduced into the foregoing relation, this relation can be expressed by the thickness of the silicon nitride film 12b+ the thickness of the silicon nitride film 13> (the thickness of the silicon nitride film 13+ the thickness of the silicon oxide film 12a+ the thickness of the gate electrodes 8A)/8. The first selection ratio is the ratio of the etching rate of the SOG film 16 and the insulating films 17 and 18 to the etching rate of the silicon nitride film 12b.

Here will be described the thickness of the silicon oxide film 12a. This silicon oxide film 12a has to function as the etching stopper when the silicon nitride film 13 is to be removed from the semiconductor substrate 1 so as to form the contact holes 19 and 20. Ignoring the over-etching, therefore, the relation of the thickness of the silicon oxide film 12a> (the thickness of the silicon nitride film 13/ the second selection ratio) has to be satisfied. Here, the second selection ratio is the ratio of the etching rate of the silicon nitride film to that of the silicon oxide film, and takes about 3 when the silicon oxide film 12a is made of plasma TEOS (Tetraethoxysilane). If this value is introduced into the aforementioned relation, this relation can be expressed by the thickness of the silicon oxide film 12a> (the thickness of the silicon nitride film 13/3).

One example of a process for manufacturing the DRAM thus constructed will be described sequentially in the order of steps.

Figure 6:
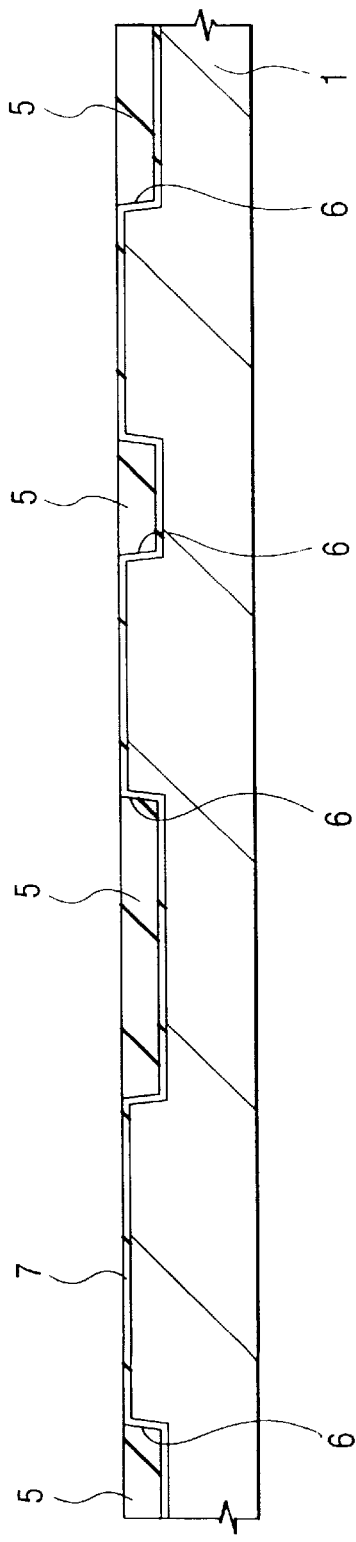
FIG. 6 is a section of an essential portion of the semiconductor substrate showing a process for manufacturing the DRAM of FIG. 1.

First of all, in the element isolating regions of the principal face of the semiconductor substrate (or the semiconductor wafer at this stage) made of single crystalline silicon of the p-type having a specific resistance of about 10 Ω cm, as shown in FIG. 6, there are formed the element isolating trenches 6. These element isolating trenches 6 are formed by etching the surface of the semiconductor substrate 1 to form trenches having a depth of about 300 to 400 nm, by depositing the silicon oxide film 5 by the CVD method over the semiconductor substrate 1 including the insides of the trenches, and by polishing back the silicon oxide film 5 by the chemical mechanical polishing (CMP) method.

Figure 7:
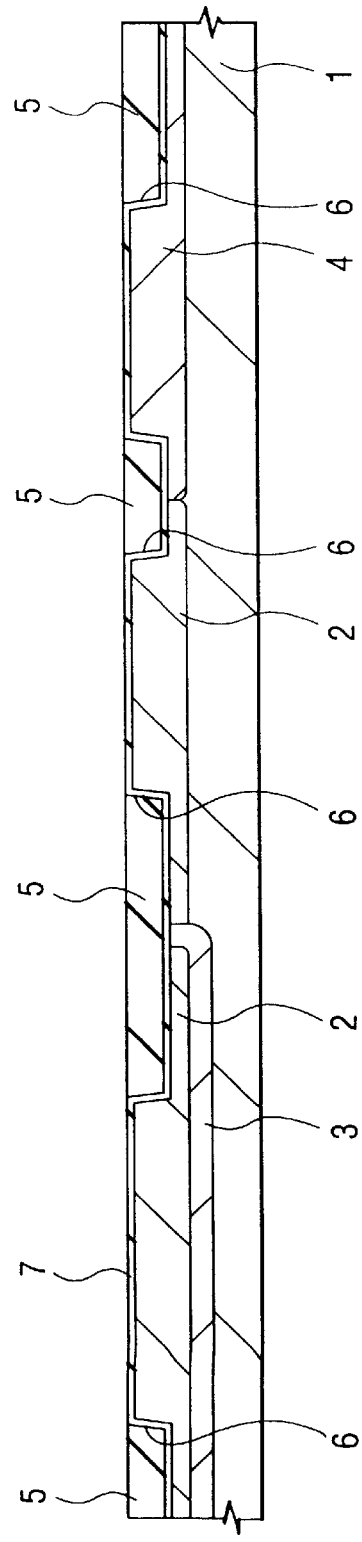
FIG. 7 is a section of an essential portion of the semiconductor substrate showing the DRAM manufacturing process subsequent to FIG. 6.

Next, the n-type semiconductor region 3 is formed, as shown in FIG. 7, by doping the semiconductor substrate 1 in the region (or the memory array) for forming the memory cells, with ions of P (phosphor), for example. After this, the p-type wells 2 are formed by doping the memory array and a portion region (for forming the n-channel MISFETs Qn) of the peripheral circuit with ions of B (boron), for example, and the n-type wells 4 are formed by doping the remaining portions (for forming the p-channel MISFETs Qp) with ions of P (phosphor), for example.

Subsequently, the clean gate insulating film 7 having a thickness of about 8 nm is formed over the individual surfaces of the p-type wells 2 and the n-type wells 4 by doping the p-type wells 2 and the n-type wells 4 with an impurity such as BF2 (boron fluoride) for adjusting the threshold voltage of the MISFETs, by washing the individual surfaces of the p-type wells 2 and the n-type wells 4 with a HF (hydrofluoric acid)-based cleaning liquid, and by wet-oxidizing the semiconductor substrate 1.

Next, a polycrystalline silicon film (or the first conductive film) 8s of a thickness of about 100 nm, as prepared by doping the gate insulating film 7 with an impurity such as P (phosphor), is deposited over the semiconductor substrate 1 by the CVD method, as shown in FIG. 8.

Subsequently, the natural oxide film is removed by a light etching treatment, and then a barrier metal film (or the first conductive film) 8bm formed of a WN (tungsten nitride) film having a thickness of about 5 nm and a refractory metal film (or the first conductive film) 8m made of W (tungsten) having a thickness of about 100 nm, for example, are deposited on the polycrystalline silicon film 8s by the sputtering method. Here, the barrier metal film 8bm functions as a barrier layer for preventing the W film and the polycrystalline silicon film from reacting at the hot heat treatment to form a silicide layer of a high resistance in the interface inbetween. This barrier metal film 8bm could be formed of a TiN (titanium nitride) film, for example.

After this, the silicon oxide film 12a having a thickness of about 100 nm, for example, is deposited over the refractory metal film 8m by the plasma CVD method using the TEOS gas. Thus, the plasma CVD method is employed for the treatment of depositing the silicon oxide film 12a, because the filming treatment can be made with little entrainment of oxygen in the manufacture chamber and at a low temperature (e.g., about 400° C.) so that the surface of the refractory metal film 8m is hardly oxidized. Here, this silicon oxide film 12a may be formed by the hot CVD method of about 400° C. In order to prevent the refractory metal film 8m from being oxidized, this modification is performed either by introducing a gas containing Si such as the TEOS gas or silane gas (SiH$_4$) into the treatment chamber and then by introducing a gas containing oxygen into the treatment chamber, or by introducing the Si containing gas and the oxygen containing gas, as specified above, simultaneously into the treatment chamber. After the step of depositing the silicon oxide film 12a, the manufacture process can be performed with little consideration into the oxidation of the refractory metal film 8m so that the conditions for the manufacture and the environment can be relaxed to facilitate the manufacture process.

In this embodiment, after the coating of the silicon oxide film 12a, the semiconductor substrate 1 is then subjected to a heat treatment at 800° C. for about one minute in the atmosphere of a nitrogen gas, for example. This makes it possible to relax the stress in the refractory metal film 8m or the barrier metal film 8bm and to densify the barrier metal film 8bm to improve the washing resistance.

Unless this heat treatment is made to densify the barrier metal film 8bm, the barrier metal film 8bm is etched off at the washing treatment prior to the light oxidation after the cap insulating film forming step, thereby to cause a problem that the refractory metal film 8m is separated. This makes it necessary to make the heat treatment at least before the washing treatment. In the case of the technique in which the cap insulating film is made of only silicon nitride, however, it is desirable from the standpoint of preventing the oxidation of the refractory metal film 8m to avoid the heat treatment of the refractory metal film 8m just after its coating. In this technique, after the coating of the silicon nitride film for the cap insulating film, the silicon nitride film is subjected to the heat treatment. If this silicon nitride film is thick, however, there arises a problem that the silicon nitride film is separated. This separation is caused from the fact that the coefficient of thermal expansion of the refractory metal film 8m is larger by one order or more than that of the insulating film. As the silicon nitride film becomes the thicker, the problem of separation becomes the more serious. This is because the silicon nitride film makes the larger volumetric change for the thicker film.

Subsequently, the silicon oxide film 12a is coated thereover with the silicon nitride film 12b having a thickness of about 100 to 150 nm, for example. The method of forming the silicon oxide film 12a is exemplified by the plasma CVD method, the low-pressure CVD method or the PECVD method. When the silicon nitride film 12b is formed by the low-pressure CVD method, its quality can be improved. Since the surface of the refractory metal film 8m is already covered with and protected by the silicon oxide film 12a, on the other hand, the silicon nitride film 12b can be formed with little consideration into the oxidation of the refractory metal film 8m so that the manufacturing and environmental conditions at the time of forming the silicon nitride film 12b such as the exhausting condition of the inside of a load lock chamber can be relaxed.

After this, a photoresist pattern R1 for forming the gate electrodes are formed over the silicon nitride film 12b. This photoresist pattern R1 for forming the gate electrodes 8A (or the word lines WL) of the memory cell selecting MISFETs Qs is formed by employing an exposure technique using a KrF exima laser having a wavelength of 248 nm, for example, and a phase shift technique. After this, the photoresist pattern R1 is used as the etching mask for an etching treatment to form the silicon nitride film 12b having a gate electrode shape (or a word line shape in the memory cell array), as shown in FIG. 9. This etching treatment employs a fluorine-based gas, for example.

Figure 10:
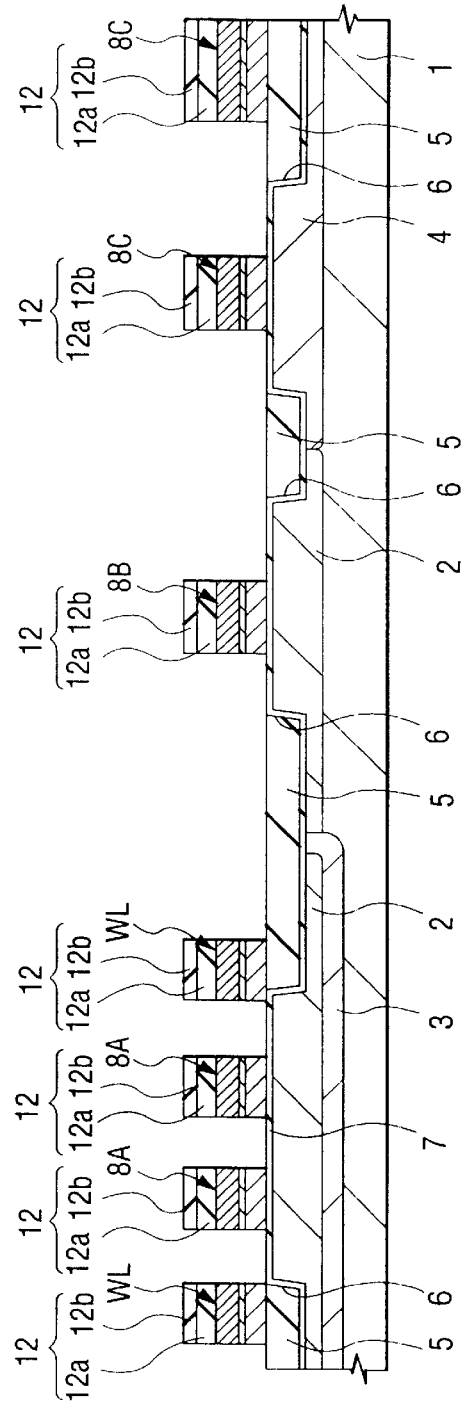
FIG. 10 is a section of an essential portion of the semiconductor substrate showing the DRAM manufacturing process subsequent to FIG. 9.

Next, the photoresist pattern R1 is removed, and the silicon oxide film 12a, the refractory metal film 8m, the barrier metal film 8bm and the polycrystalline silicon film 8s are patterned by using the patterned silicon nitride film 12b as the etching mask to form the gate electrodes 8A (or the word lines WL), the gate electrodes 8B and 8C and the cap insulating film 12 over the gate insulating film 7, as shown in FIG. 10. In this etching treatment, the refractory metal film 8m is worked with a mixed gas of chlorine and oxygen, for example. In the over-etching treatment of the etching treatment using that gas, the polycrystalline silicon has an etching rate about three times as high as that of tungsten so that the polycrystalline silicon film 8s is considerably etched off. The remaining polycrystalline silicon film is etched off while retaining a higher selection ratio relative to that of the thin oxide film, by using the chlorine-based or bromine-based gas used generally.

Thus in this embodiment, the silicon nitride film 12b for forming the cap insulating film 12 is used as the etching mask to form the gate electrodes 8A (or the word lines WL) and the gate electrodes 8B and 8C. Ordinarily, the gate electrodes are patterned by using the photoresist pattern R1 as the etching mask. If the photoresist pattern is used as the etching mask when the gate electrodes are formed of the refractory metal film 8m, the barrier metal film 8bm and the polycrystalline silicon film 8s, the photoresist pattern may be deformed during the etching treatment to lower the pattern forming accuracy. On the other hand, a portion of the photoresist pattern may be removed or separated into a foreign substance to cause a problem that the reliability or yield of the semiconductor integrated circuit device is lowered. When the cap insulating film (including the silicon nitride film 12b and the silicon oxide film 12a) is used as the etching mask, it is neither deformed nor removed into the foreign substance. This makes it possible to improve not only the pattern forming accuracy of the gate electrodes but also the reliability or yield of the semiconductor integrated circuit device.

Figure 11:
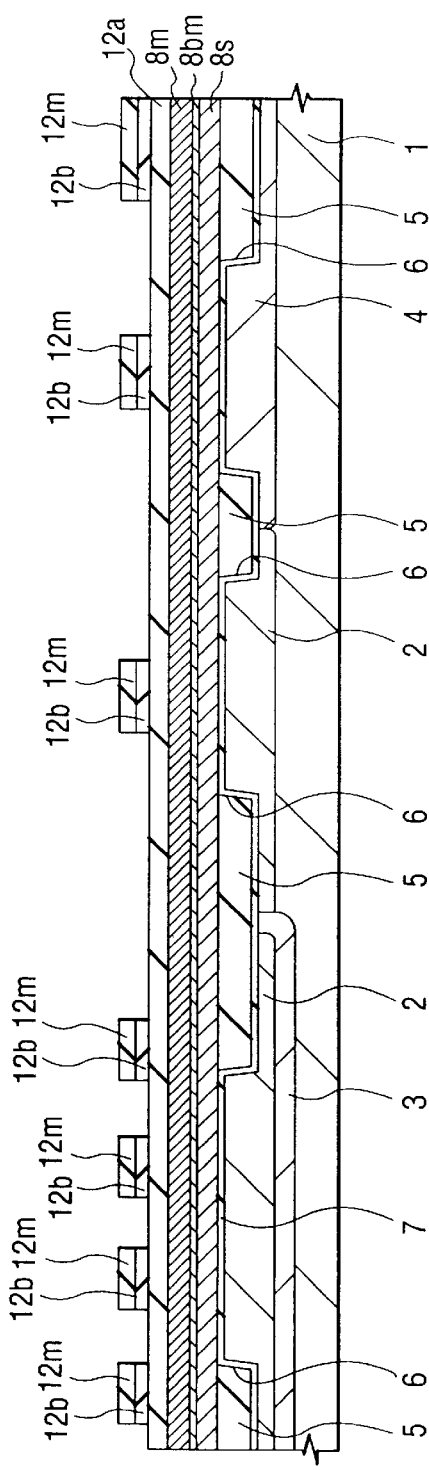
FIG. 11 is a section of an essential portion of a semiconductor substrate showing a process for manufacturing a DRAM according to another embodiment of the invention.

Now, at this etching treatment for working the gate electrodes, the upper portion of the silicon nitride film 12b is etched off so that the silicon nitride film 12b thus treated becomes slightly thinner than that at the formed time such as about 40 nm. In order to reduce this etching-off of the silicon nitride film 12b, the following method may be taken. First of all, a coating of the silicon nitride film 12b is formed and is then coated thereover with the silicon oxide film by the CVD method or the like. Subsequently, the photoresist pattern R1 is formed and is used as the etching mask to pattern the silicon oxide film and the silicon nitride film 12b thereby to pattern the silicon nitride film 12b of the gate electrode shape (or the word line shape in the memory cell array) and an overlying silicon oxide film 12m, as shown in FIG. 11. After this, the photoresist pattern R1 is removed, and the gate electrodes 8A and so on are patterned by using the patterned silicon nitride film 12b and silicon oxide film 12m as the etching mask. At this time, the silicon oxide film 12m can protect the underlying silicon nitride film 12b to reduce its etching-off so that the silicon nitride film 12b can retain its thickness. Here, the silicon oxide film 12m may or may not be left over the silicon nitride film 12b after the gate electrodes 8A and so on were worked.

After this, the semiconductor substrate 1 is washed with a washing liquid containing hydrogen peroxide ($H_2O_2$) to remove especially the particles from the back face of the semiconductor substrate 1. At this time, the barrier metal film 8bm is densified, as described above, so that it is not removed. After this, the semiconductor substrate 1 is subjected to the aforementioned light oxidizing treatment so that an oxide film is formed at the end portions of the gate electrodes 8 and so on to remedy the plasma damage.

Figure 12:
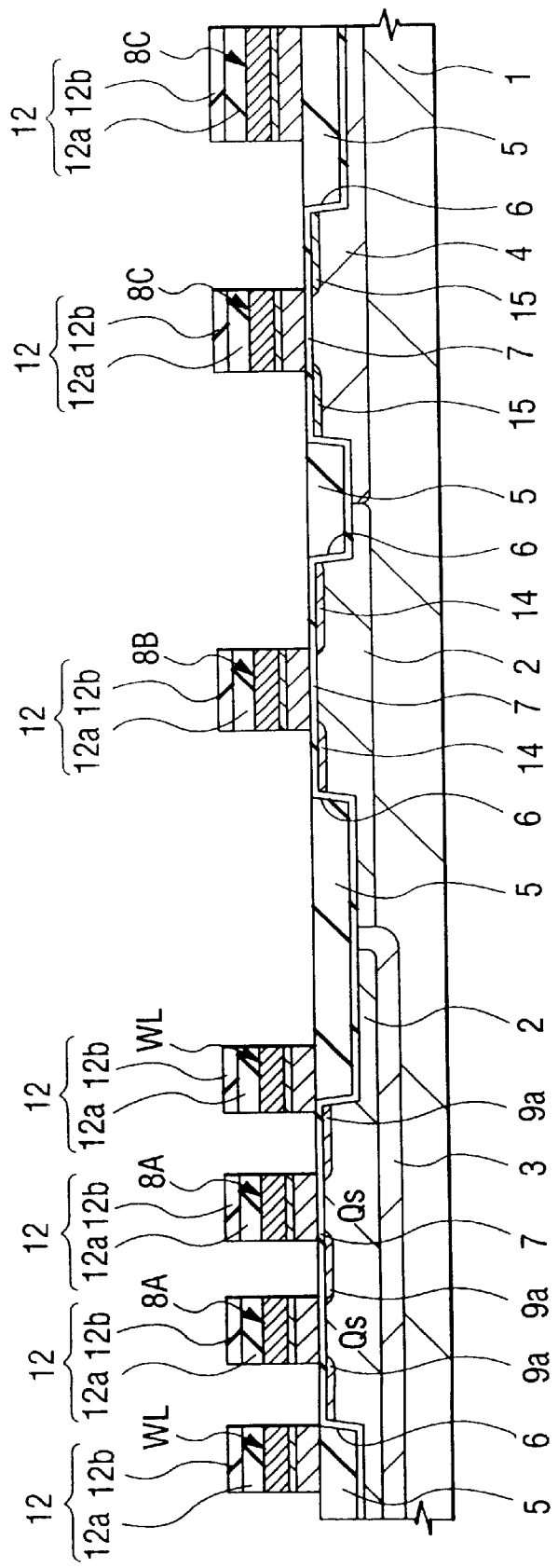
FIG. 12 is a section of an essential portion of the semiconductor substrate showing the DRAM manufacturing process subsequent to FIG. 10.

Next, as shown in FIG. 12, the n-type wells 4 are doped with ions of B (boron), for example, to form $p^-$-type semiconductor regions 15 in the n-type wells 4 on the two sides of the gate electrodes 8C. On the other hand, the p-type wells 2 are doped with ions of P (phosphor), for example, to form the $n^-$-type semiconductor regions 9a in the p-type wells 2 on the two sides of the gate electrodes 8A and $n^-$-type semiconductor regions 14 in the p-type wells 2 on the two sides of the gate electrodes 8B. At this stage of these steps, the memory cell selecting MISFETs Qs are substantially completed.

Figure 13:
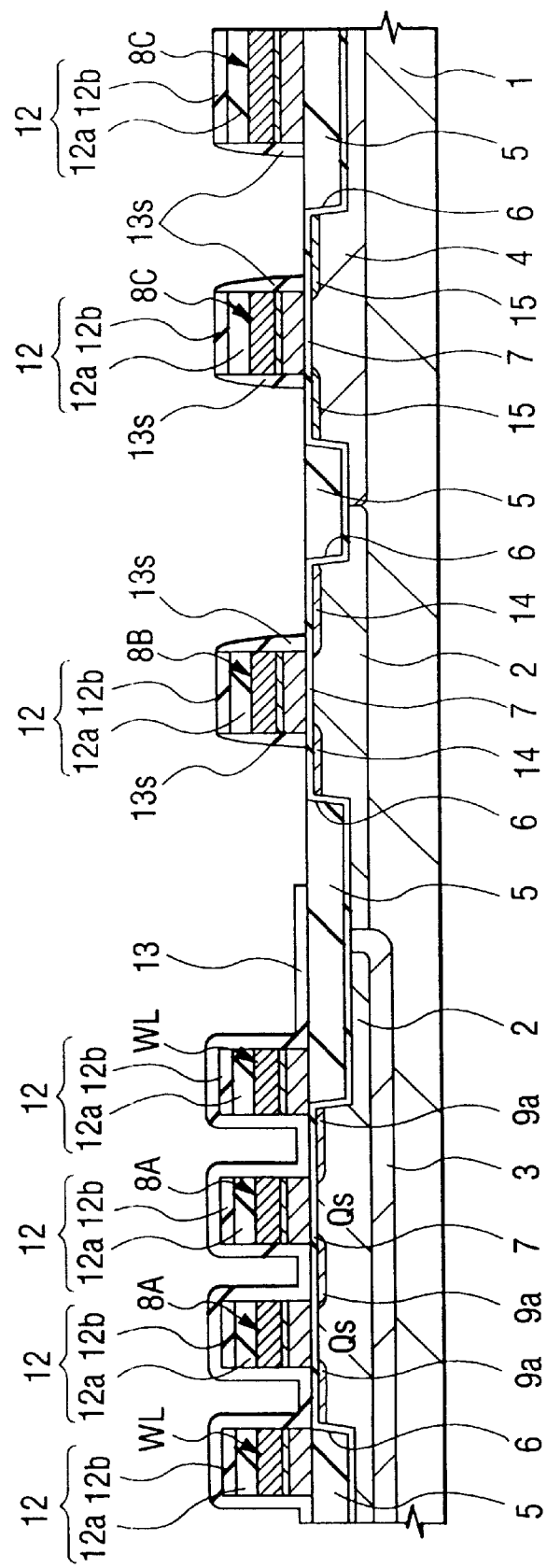
FIG. 13 is a section of an essential portion of the semiconductor substrate showing the DRAM manufacturing process subsequent to FIG. 12.

Next, as shown in FIG. 13, the silicon nitride film 13 having a thickness of about 50 nm is deposited over the semiconductor substrate 1 by the CVD method. After this, the silicon nitride film 13 of the memory array is coated with a photoresist film, and the silicon nitride film 13 of the peripheral circuit is anisotropically etched to form the side wall spacers 13s on the side walls of the gate electrodes 8B and 8C of the peripheral circuit. This etching is performed by using a gas for etching the silicon nitride film 13 at a high selection ration so as to minimize the amounts of scrape of the silicon oxide film 5 and the gate insulating film 7, as buried in the element isolating trenches 6. In order to minimize the amounts of scrape of the silicon nitride film 12 over the gate electrodes 8B and 8C, on the other hand, the over-etching amount is held at the necessary minimum.

Figure 14:
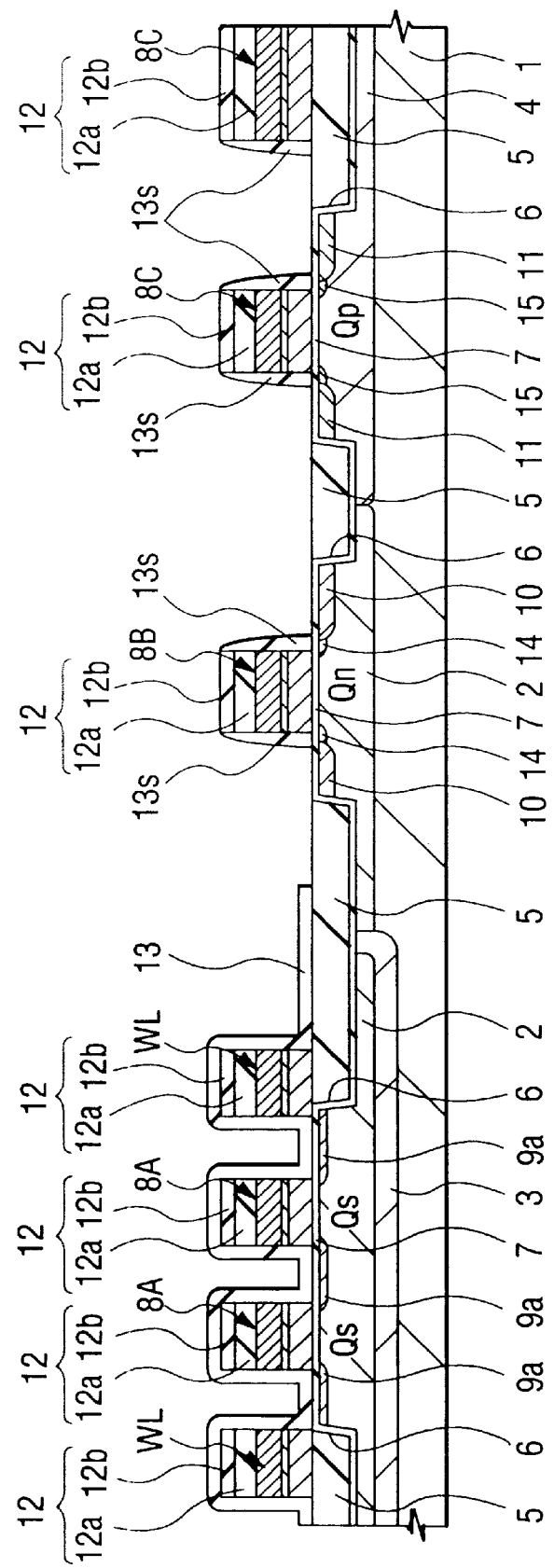
FIG. 14 is a section of an essential portion of the semiconductor substrate showing the DRAM manufacturing process subsequent to FIG. 13.

Next, as shown in FIG. 14, the n-type wells 4 of the peripheral circuit are doped with ions of B (boron), for example, to form the $p^+$-type semiconductor regions 11 (or sources and drains) of the p-channel MISFETs Qp in self-alignment with the side wall spacers 13s, and the p-type wells 2 of the peripheral circuit are doped with ions of As (arsenic), for example, to form the $n^+$-type semiconductor regions 10 (or sources and drains) of the n-channel MISFETs Qn in self-alignment with the side wall spacers 13s. At the stage of these steps, the p-channel MISFETs Qp and the n-channel MISFETs Qn, as provided with lightly doped regions and seriously doped regions.

Figure 15:
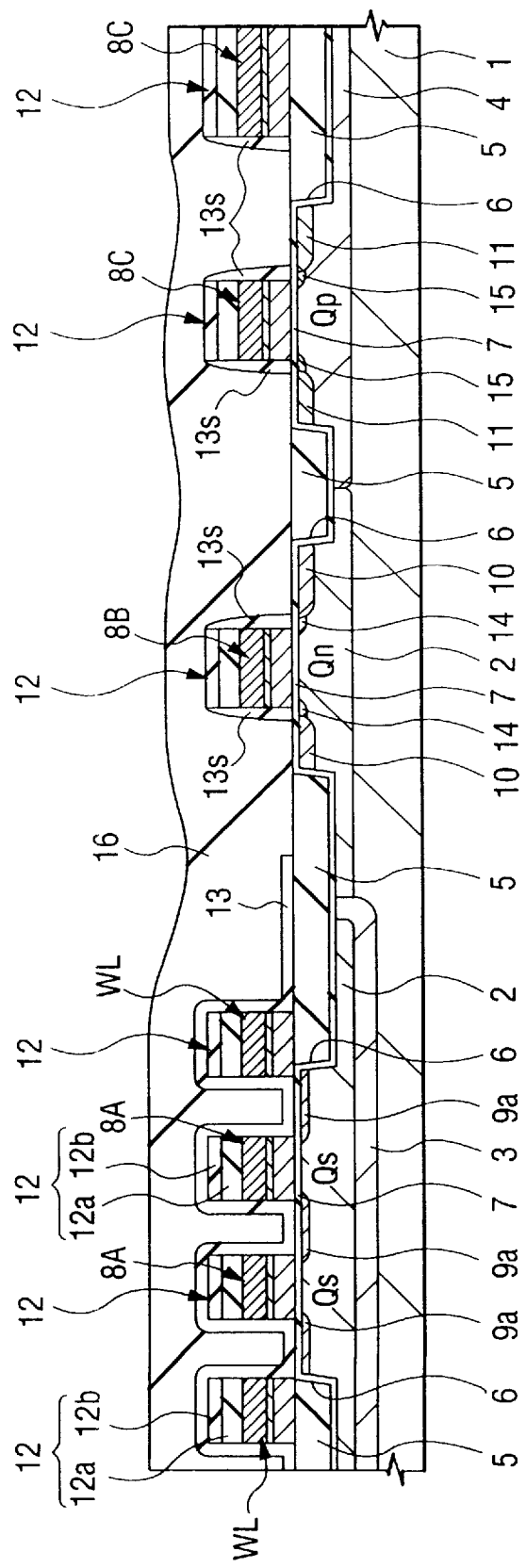
FIG. 15 is a section of an essential portion of the semiconductor substrate showing the DRAM manufacturing process subsequent to FIG. 14.

Next, as shown in FIG. 15, the SOG film 16 having a thickness of about 300 nm is spin-applied to the semiconductor substrate 1 and is baked in an oxygen atmosphere at about 400° C. containing water vapor and then subjected to a heat treatment of 800° C. for about one minute so that it is densified. This SOG film 16 is made of polysilazane-based inorganic SOG, for example.

The SOG film 16 has a higher re-flowing property than that of the glass flow film so that it has an excellent gap filling property for a fine space. Therefore, the SOG film 16 forms no void even if it is buried in the space of the gate electrodes 8A (or the word lines WL) which are miniaturized as far as the resolution limit of photolithography. On the other hand, the SOG film 16 achieves the high re-flowing property even without the heat treatment at the high temperature and for the long time, so that it is enabled to effect a shallow junction by suppressing the thermal diffusions of the impurity which has been incorporated into the sources and drains of the memory cell selecting MISFETs Qs or the sources and drains of the MISFETS (e.g., the n-channel MISFETS Qn and the p-channel MISFETs Qp) of the peripheral circuit. At the heat treatment, moreover, the refractory metal film (or the W film) forming the gate electrodes 8A (word line WL) and the gate electrodes 8B and 8C can suppress the oxidation to realize the high performances of the memory cell selecting MISFETs QS and the MISFETs of the peripheral circuit. Here, the formation of the layer insulating films of the SOG film 16 and the overlying silicon oxide films 17 and 18 may be replaced either by the formation of the layer insulating films, as effected by coating the boron/phosphor silicate glass (BPSG) followed with re-flowing treatment and by flatting the upper face of the coating by the CMP method, or by the formation of the layer insulating films of only the SOG film.

Figure 16:
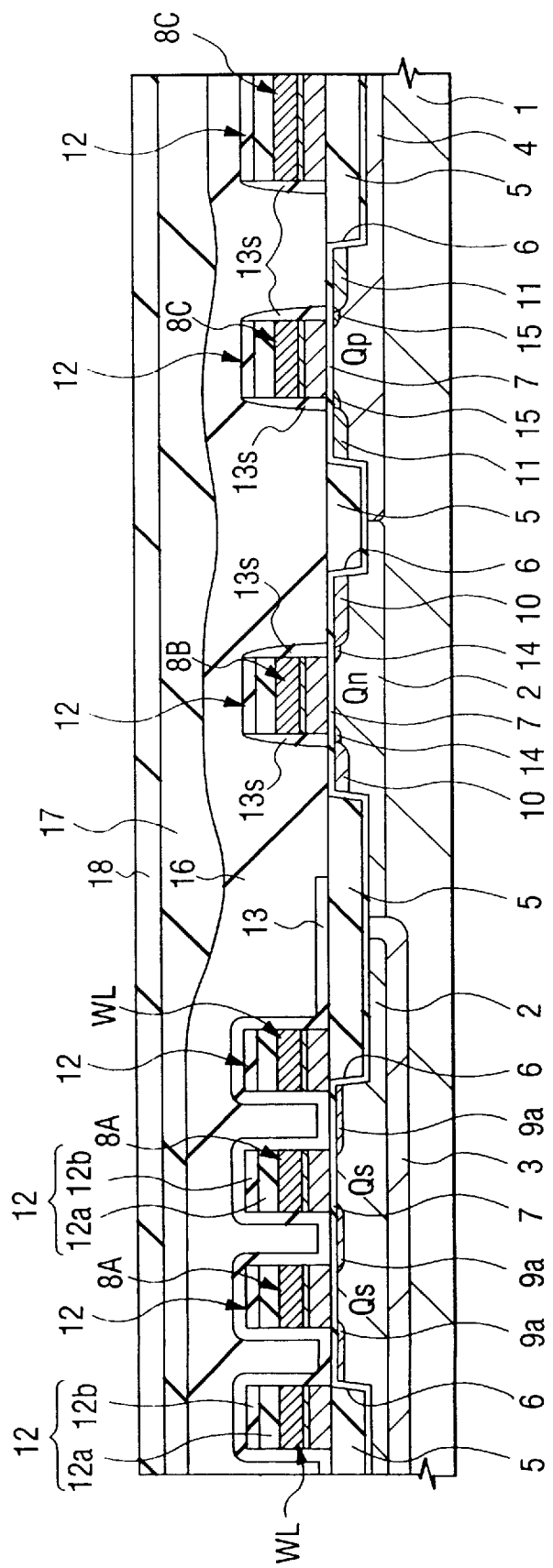
FIG. 16 is a section of an essential portion of the semiconductor substrate showing the DRAM manufacturing process subsequent to FIG. 15.

Next, as shown in FIG. 16, the silicon oxide film 17 having a thickness of about 600 nm is deposited over the SOG film 16 and is then polished by the CMP method to flatten its surface. After this, the silicon oxide film 18 having a thickness of about 100 nm is deposited over the flattened silicon oxide film 17. This overlying silicon oxide film 18 is deposited to remedy the fine flaws, as caused at the polishing time by the CMP method, in the surface of the underlying silicon oxide film 17. Here, the thickness from the upper face of the gate insulating film 7 to the upper face of the silicon oxide film 18 is about 550 nm, for example.

Figure 17:
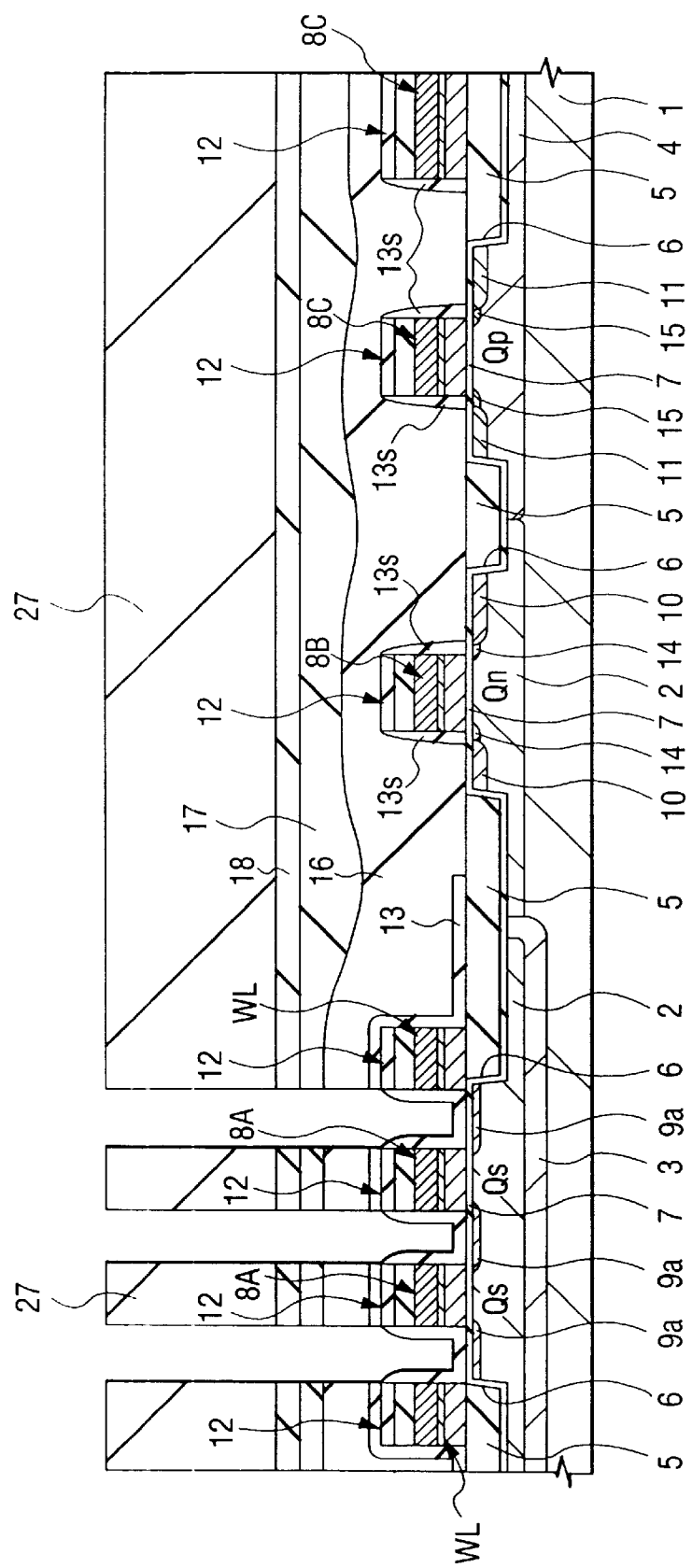
FIG. 17 is a section of an essential portion of the semiconductor substrate showing the DRAM manufacturing process subsequent to FIG. 16.

Next, as shown in FIGS. 17 and 18, the silicon oxide films 18 and 17 and the SOG film 16 over the n⁻-type semiconductor regions (or the sources and drains) 9a of the memory cell selecting MISFETs Q are removed to form second openings by the dry-etching treatment using a photoresist film 27 having first openings as the mask. This etching treatment is performed by using a gas for etching the silicon oxide film 17 at a high selection ratio, so as to prevent the silicon nitride film 13 underlying the silicon oxide film 17 from being etched off. Specifically, the etching treatment is performed to form contact holes 19a and 20a under the condition in which the silicon oxide film is etched off more easily than the silicon nitride film. The etching selection rate at this time between the silicon oxide film and the silicon nitride film is about 1:8 to 10.

Figure 18A:
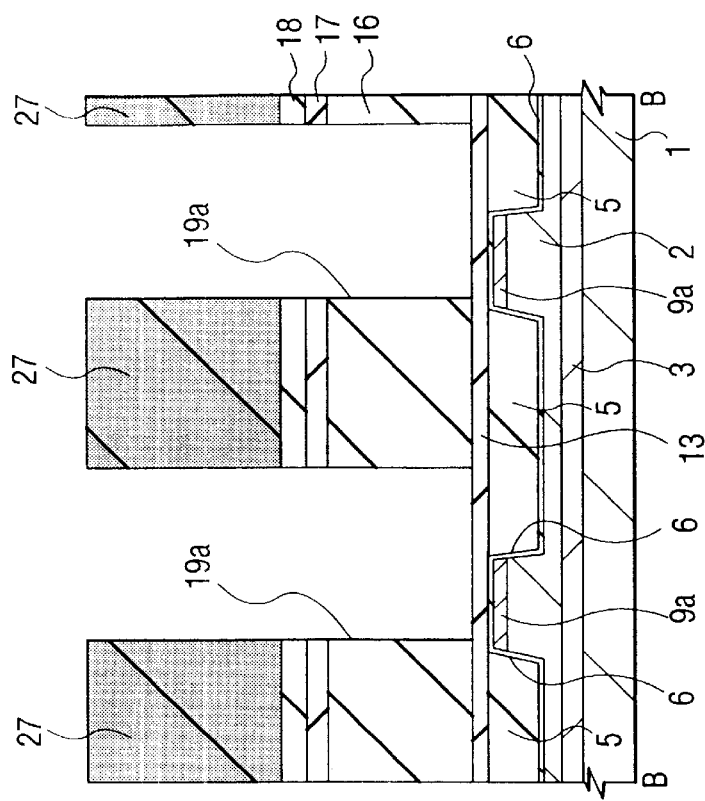
FIG. 18(a) An enlarged section of an essential portion of the semiconductor substrate at the manufacture step of FIG. 17 and corresponding to line A—A of FIG. 4.
Figure 18B:
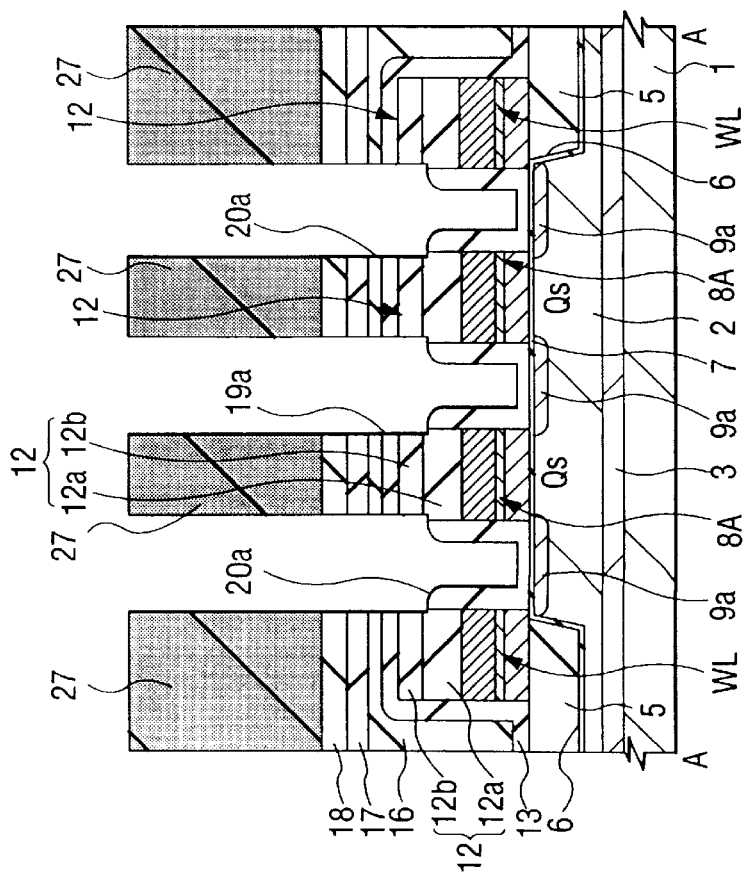
FIG. 18(b) is an enlarged section of an essential portion of the semiconductor substrate at the manufacture step of FIG. 17 and corresponding to line B—B of FIG. 4.
Figure 19:
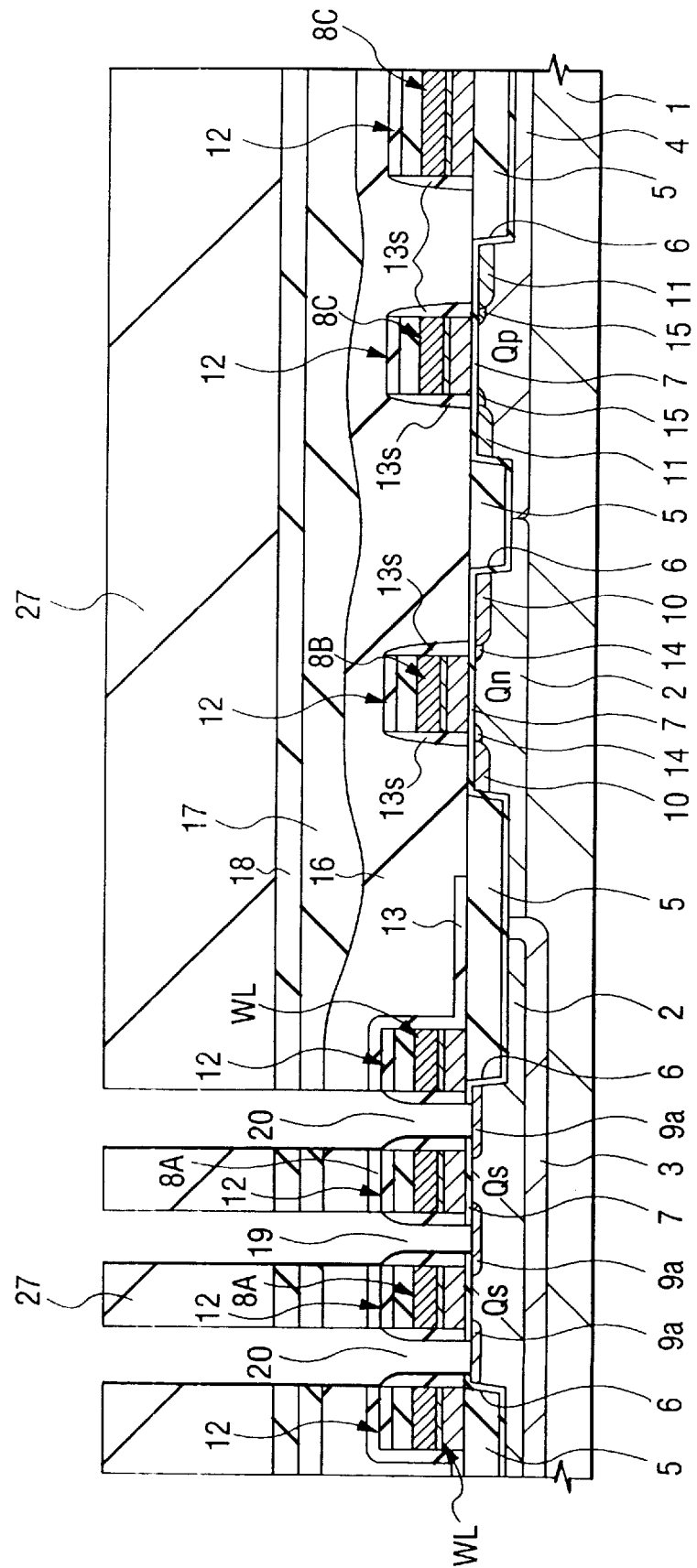
FIG. 19 is a section of an essential portion of the semiconductor substrate showing the DRAM manufacturing process subsequent to FIG. 17.

FIG. 18(a) is an enlarged section showing an essential portion of a memory cell and corresponding to line A—A of FIG. 4 after that etching treatment, and FIG. 18(b) is an enlarged section showing an essential portion and corresponding to line B—B of FIG. 4 after the etching treatment. Here, as shown in FIG. 18(a), the silicon oxide film 12a of the cap insulating film 12 is not exposed during the etching treatment. On the other hand, the etching treatment is ended to leave the silicon nitride film 13 between the gate electrodes 8A. The etching operation advances from the portion where the silicon oxide film 12a is exposed, to expose the upper face of the gate electrodes 8A because the silicon oxide film 12a and the SOG film 16 are made of the same material.

Figure 52B:
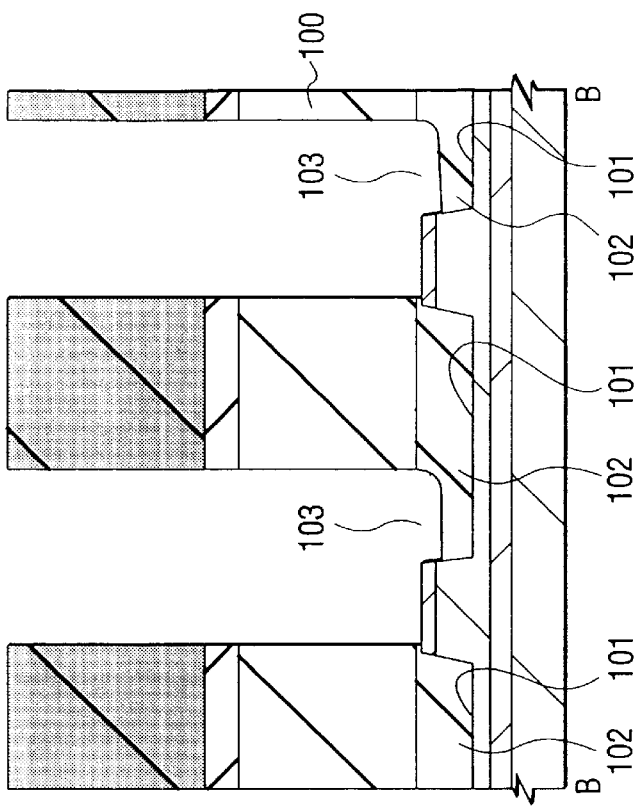
FIG. 52(b) is a section of a portion of the semiconductor substrate in an intersecting direction.
Figure 52A:
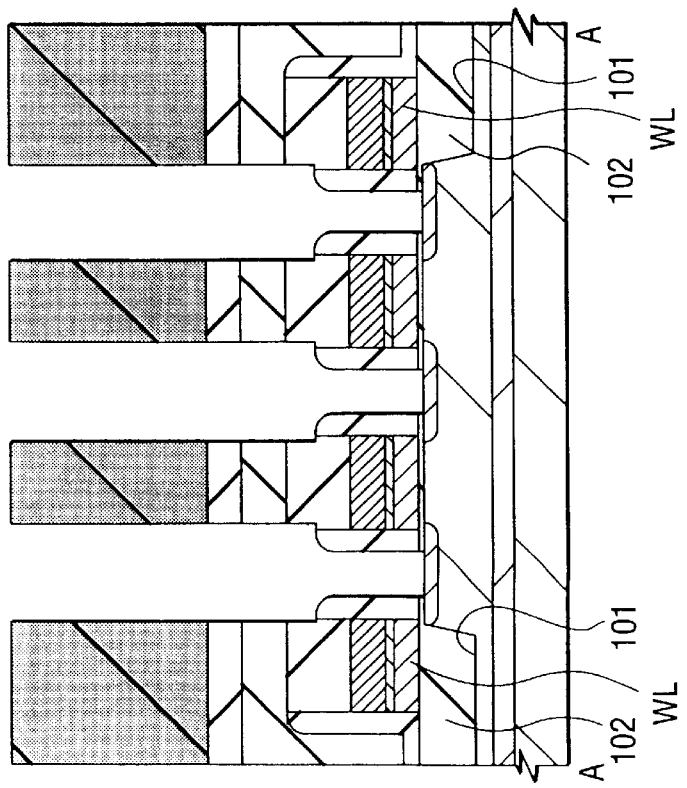
FIG. 52(a) is a section of a portion of a semiconductor substrate after the step of forming connection holes when the cap insulating film is formed of only a silicon nitride film.

As shown in FIG. 18(b), on the other hand, the silicon nitride film 13 of the semiconductor substrate 1 acts as the etching stopper at this stage and is left over the semiconductor substrate 1. Here, the case in which the silicon nitride film 13 is not formed is shown in FIG. 52, in which the upper portion of a buried insulating film 102 is etched off to form recesses 103 when an SOG film 100 is to be etched off, because the buried insulating film 102 in element isolating trenches 101 is made of the same material as that of the SOG film 100. In this embodiment, the contact holes 19 overlaps the element isolating trenches spatially, as described above, and therefore the aforementioned technique capable avoiding the recesses of the buried insulating film is effective. Even in the case of the structure in which the contact holes 19 are not designed to overlap the element isolating trenches spatially, on the other hand, the contact holes 19 may be caused to overlap the element isolating trenches by the spatial positional displacement of the contact holes 19. Thus, this embodiment capable of solving the problem of the defective elements due to the recesses is an effective technique.

Figure 20:
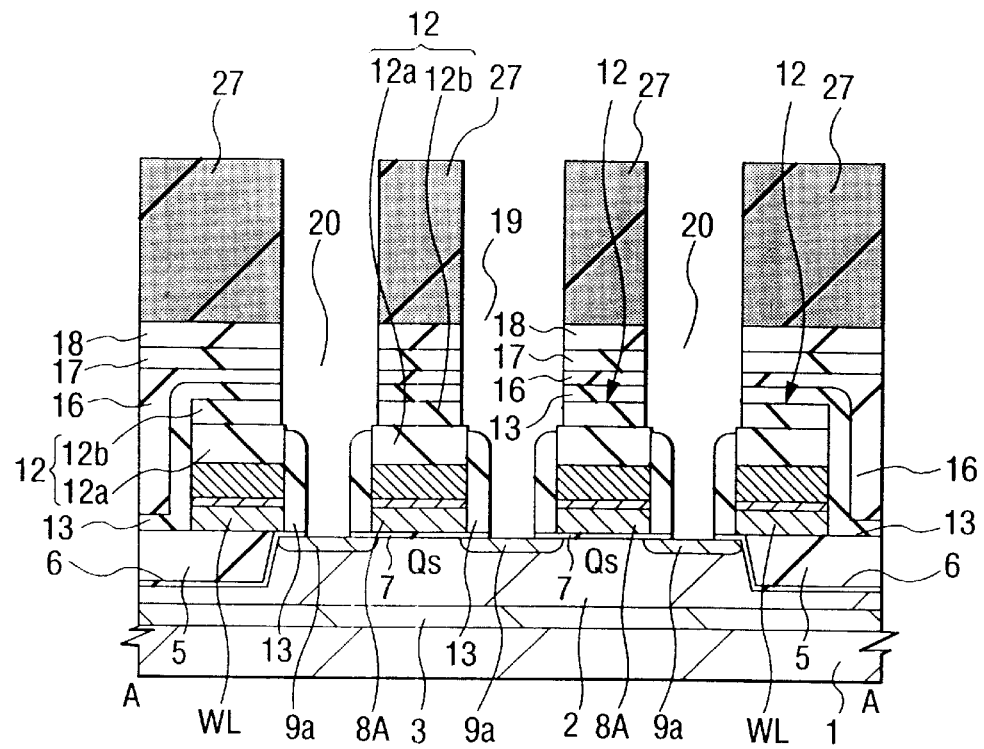
FIG. 20 is an enlarged section of an essential portion of the semiconductor substrate at the manufacture process of FIG. 19.
Figure 21:
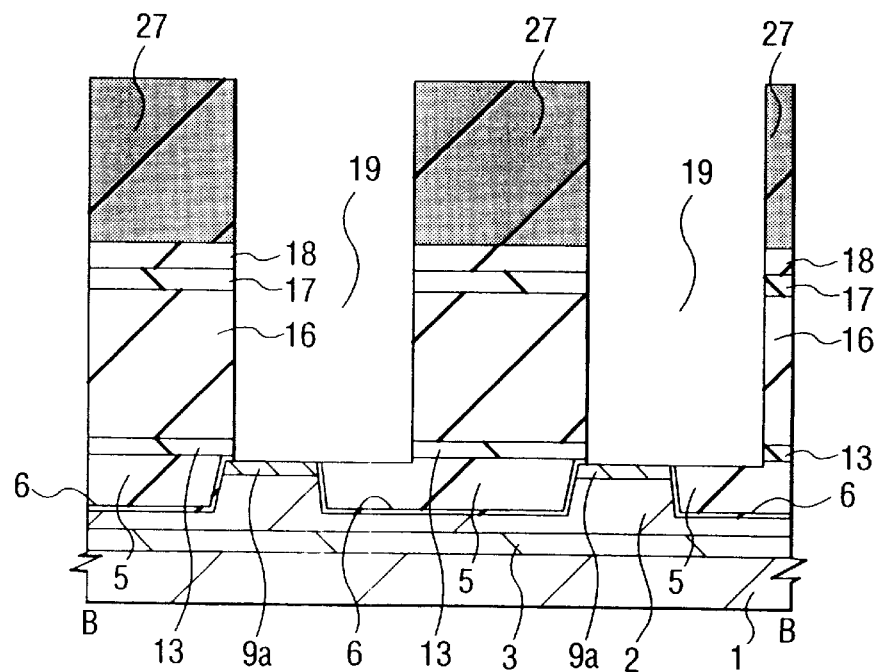
FIG. 21 is a section of an essential portion of the semiconductor substrate at the manufacture process of FIG. 19 and taken in the direction to intersect that of FIG. 20.
Figure 22:
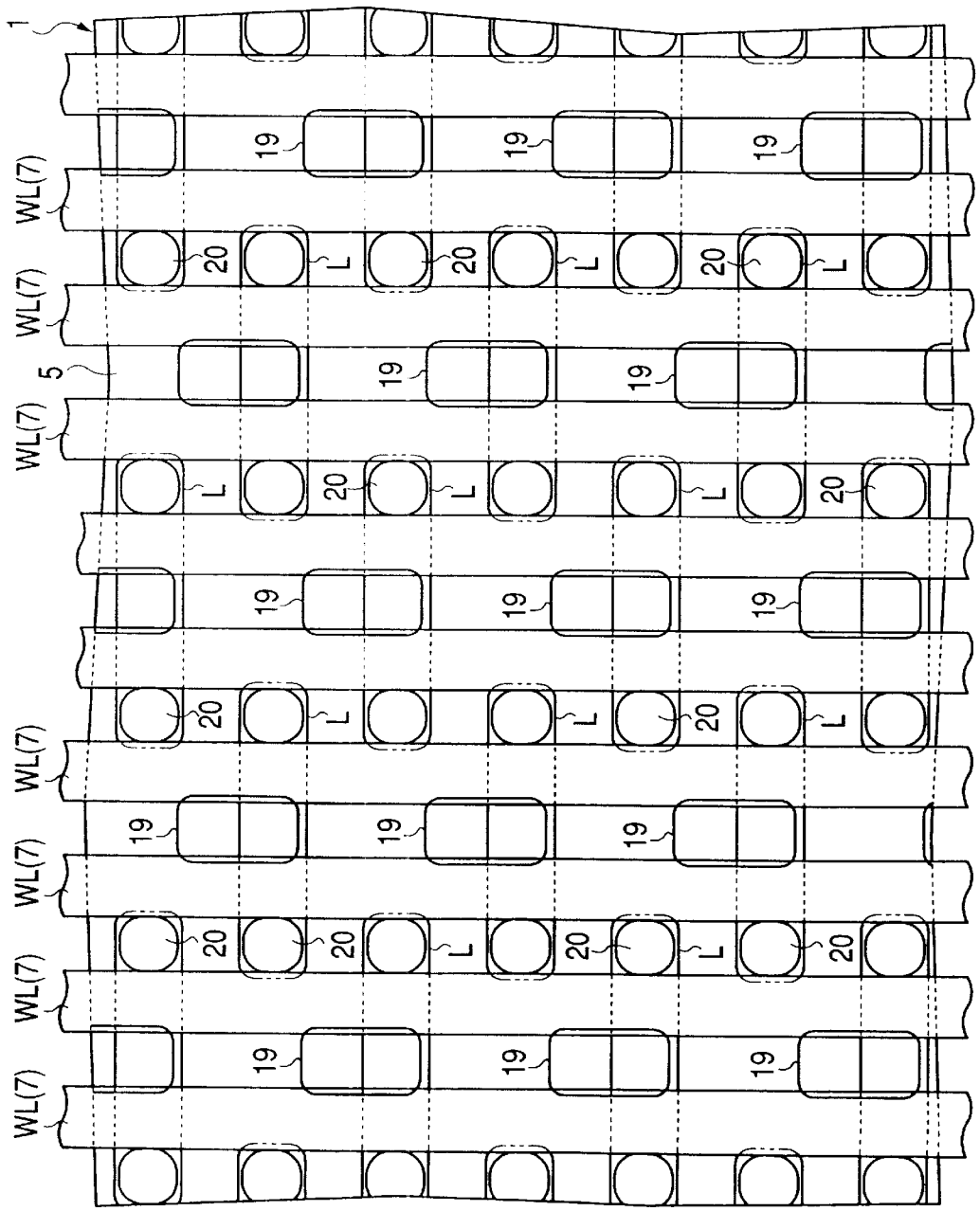
FIG. 22 is an enlarged top plan view of an essential portion of the semiconductor substrate at the manufacture process of FIG. 19.

Subsequently, by the dry-etching treatment using the aforementioned photoresist film 27 as the mask to form third openings over an n⁻-type semiconductor region (or the source and drain) 9a, the silicon nitride film 13 and then the underlying gate insulating film 7 are removed to form the contact holes 19 and 20 exposing the surface of the n⁻-type semiconductor region (or the source and drain) 9a, as shown in FIGS. 19, 20, 21 and 22. This etching treatment is ended to leave the silicon oxide film 12a over the gate electrodes 8A. Here: FIG. 20 is an enlarged section showing an essential portion and taken along line A—A of FIG. 4 after that treatment; FIG. 21 is an enlarged section showing an essential portion and taken along line B—B of FIG. 4 after the treatment; and FIG. 22 is a top plan view showing an essential portion of the memory cell array after the treatment.

This etching treatment of the silicon nitride film 13 uses a gas for etching it at a high selection ratio so as to minimize the amounts of scrape of the semiconductor substrate 1 and the element isolating trenches 6. In short, the etching treatment is performed under the condition in which the silicon nitride film is more easily etched off than the silicon oxide film. The etching selection ratio at this time between the silicon oxide film and the silicon nitride film is about 1:3.

On the other hand, this etching treatment is performed to etch the silicon nitride film 13 anisotropically thereby to leave the silicon nitride film 13 on the side walls of the gate electrodes 8A (or the word lines WL). As a result, the contact holes 19 and 20, in which the bottom diameter (or the X-direction diameter) is so small as the resolution limit of the photolithography or less, can be formed in self-alignment to the space of the gate electrodes 8A (or the word lines WL).

Figure 53:
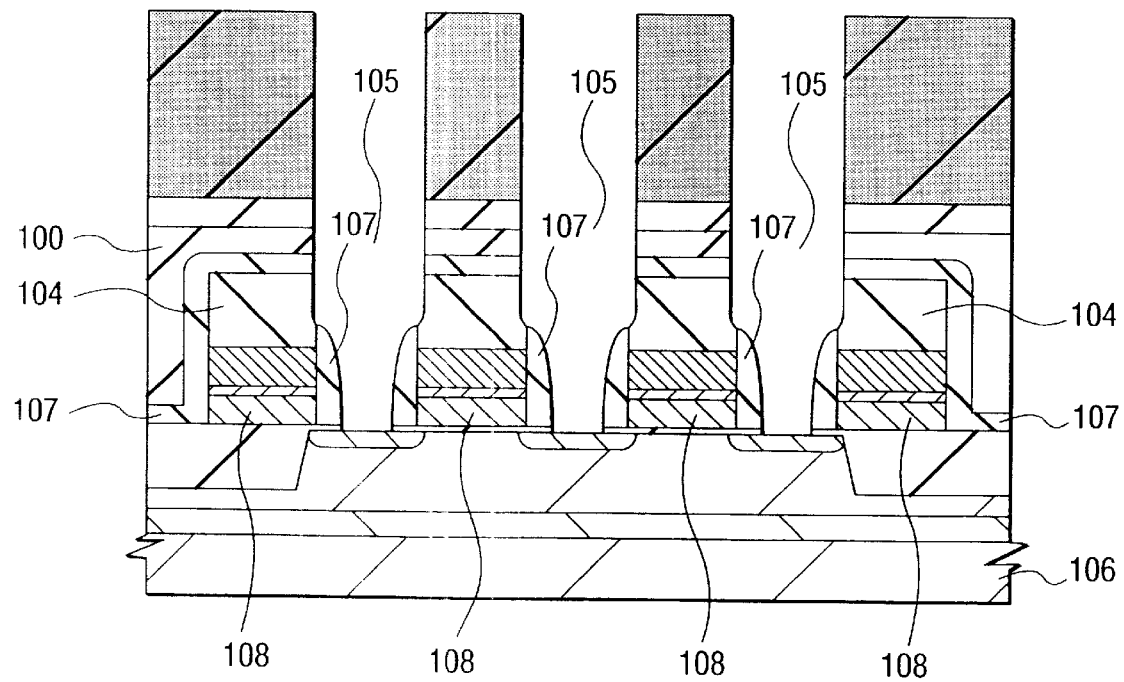
FIG. 53 is a section of a portion of a semiconductor substrate after the step of forming connection holes when the cap insulating film is formed of only the silicon nitride film but when the silicon nitride film is not formed over the semiconductor substrate.

Here, FIG. 53 shows the case for comparison, in which a cap insulating film 104 is formed of only a silicon nitride film. In this case, when a silicon nitride film 107 is to be removed from a semiconductor substrate 106 so as to form contact holes 105, the cap insulating film 104 and the silicon nitride film 107 on the upper and side faces of gate electrodes 108 may also be removed to expose the upper faces of the gate electrodes 108 to the outside. This makes it necessary to thicken the cap insulating film while considering the requirement for a high accuracy in the detection of the etching terminal point and the prevention of the defect in the breakdown voltage or the exposure of the gate electrodes. According to our investigation results, however, it has been found out that the increase in the thickness of the cap insulating film invites an increase in the aspect ratio of the contact holes so that the conductive film becomes difficult to bury in the contact holes thereby to increase the defect percentage, and that the problem of the separation or bulge of the cap insulating film is made serious by the heat treatment after the formation of the cap insulating film.

In this embodiment, too, when the silicon nitride film 13 over the semiconductor substrate 1 is to be removed to expose the upper face of the semiconductor substrate 1, the silicon nitride films 12b and 13 on the upper and side faces of the gate electrodes 8A are also etched off because they are made of the same material. As a result, the silicon oxide film 12a over the gate electrodes 8A is partially exposed as the etching treatment advances. Since this etching treatment is so conditioned that the silicon nitride film is more easily etched off, however, the silicon oxide film 12a functions as the etching stopper so that it is not removed so much. FIG. 20 shows the behaviors schematically after that etching treatment, and the upper corners (where the upper face and the side faces of the silicon oxide film 12a intersect) of the silicon oxide film 12a, as exposed from the contact holes 19 and 20, and the silicon oxide film 12a in the vicinity are not removed but left. Thus, the height of the silicon oxide film 13 on the side faces of the gate electrodes 8A is retained. This retains the thickness of the insulating film to cover the upper corners (where the upper face and the side faces of the refractory metal film 8m intersect) of the gate electrodes 8A, that is, the distance between the conductive film to be buried in the contact holes 19 and the gate electrodes 8A is elongated so that the breakdown voltage can be improved. Therefore, the cap insulating film 12 can be thinned to reduce the height from the upper face of the semiconductor substrate 1 to the upper face of the cap insulating film 12. When the cap insulating film 12 is formed of only the silicon nitride film (as shown in FIG. 53), for example, it is necessary to retain a relation of A× (1+ a dry over-etching ratio)×(1+ a dry dispersion ratio), if the thickness of the later-described silicon nitride film 13 is designated by A. By introducing the dry over-etching ratio of 40%, the dry dispersion ratio of 20% and A=50 nm into that relation, the thickness of the cap insulating film, as formed of only silicon nitride, has to be about 84 nm. In the case of the laminated cap of this embodiment, on the other hand, an amount of 84/3=28 nm may be retained for the scrape because the selection ratio at the time of forming the contact holes is given about 3 by the silicon oxide film 12a under the silicon nitride film 12b. Therefore, the laminated cap can reduce the height from the upper face of the semiconductor substrate 1 to the upper face of the cap insulating film 12 by 56 nm (=84−28). As a result, the aspect ratio of the contact holes 19 and 20 can be reduced to bury the conductive film easily in the contact holes 19 and 20 thereby to avoid the insufficient burial of the conductive film. Therefore, the increase in the electric resistance or the conductive defect in the contact holes 19 and 20 can be avoided to improve the reliability and yield of the semiconductor integrated circuit device.

In this embodiment, on the other hand, the top plan view of the contact holes 19 has a rectangular shape and overlaps the element isolating trenches 6. When the silicon nitride film 13 exposed from the contact holes 19 is removed, therefore, the upper face of the element isolating trenches 6 is also exposed. However, the buried insulating film in the element isolating trenches 6 is not removed so much at its etching treatment because it is formed of the silicon oxide film 5. This behavior is schematically shown in FIG. 21, in which the upper faces of the element isolating trenches 6, as exposed from the bottom faces of the contact holes 16, are not scraped so much but left.

Next, the photoresist film 27 is removed, and the surface of the semiconductor substrate 1, as exposed to the bottoms of the contact holes 19 and 20, is then washed with a hydrofluoric acid-based etching liquid (e.g., a mixed liquid of hydrofluoric acid+ ammonium fluoride) to remove the dry-etching residuals or the photoresist residuals. At this time, the SOG film 16, as exposed to the side walls of the contact holes 19 and 20, is also exposed to the etching liquid. However, the SOG film 16, as densified at a temperature as high as about 800° C., has a higher resistance to the hydrofluoric acid etching liquid than the SOG film which is not densified, so that the side walls of the contact holes 19 and 20 are not seriously under-cut by that wet-etching treatment. As a result, it is possible to prevent the short-circuiting reliably between the plugs 21 which are buried at a next step in the contact holes 19 and 20.

After these contact holes 19 and 20 were formed, on the other hand, the p-type wells 2 may be doped through the contact holes 19 and 20 with an impurity (e.g., phosphor) to form an n-type semiconductor layer in the p-type wells 2 of the deeper region than the sources and drains of the memory cell selecting MISFETs Qs. This n-type semiconductor layer is effective for relaxing the electric field which will be concentrated at the end portions of the source and drain, so that it can reduce the leakage current at the end portions of the source and drain to improve the refreshing characteristics of the memory cells.

Figure 23:
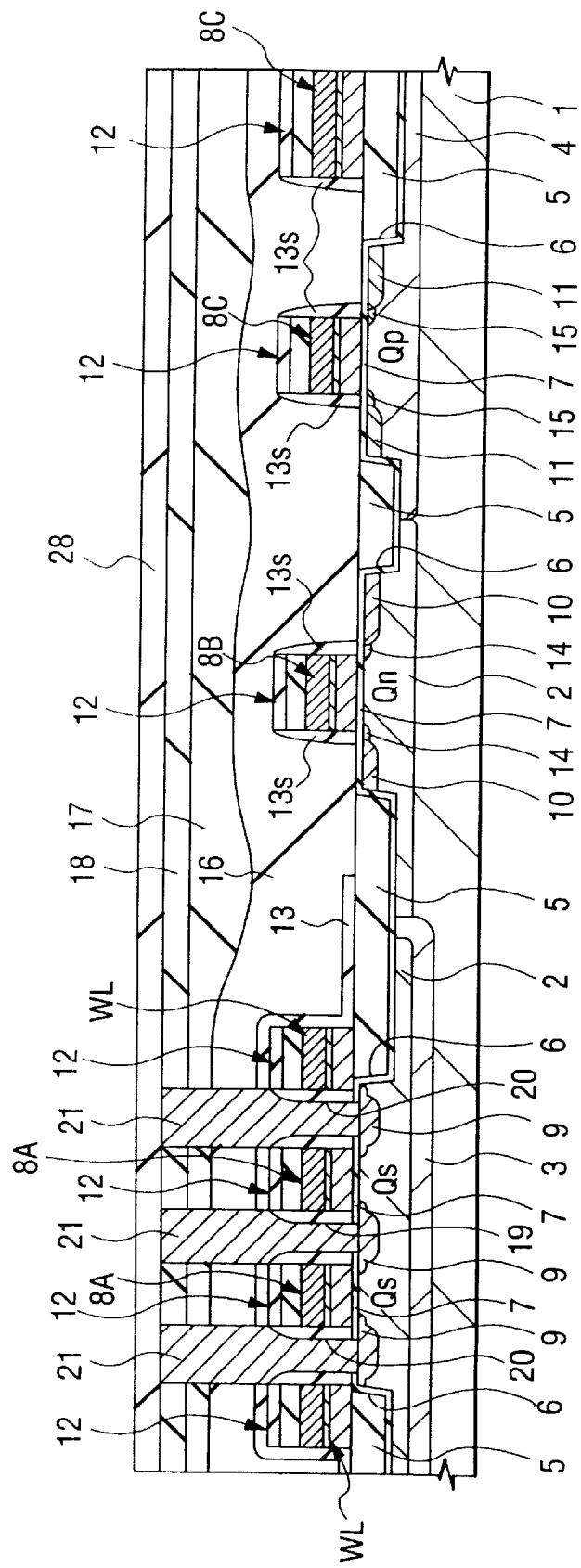
FIG. 23 is a section of an essential portion of the semiconductor substrate showing the DRAM manufacturing process subsequent to FIG. 19.
Figure 24A:
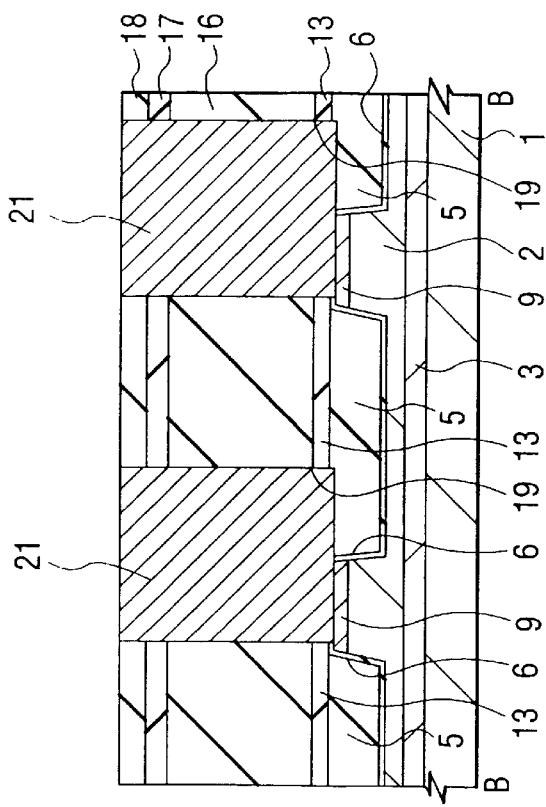
FIG. 24(a) is an enlarged section of an essential portion of the semiconductor substrate at the manufacture step of FIG. 23 and corresponding to line A—A of FIG. 4.
Figure 24B:
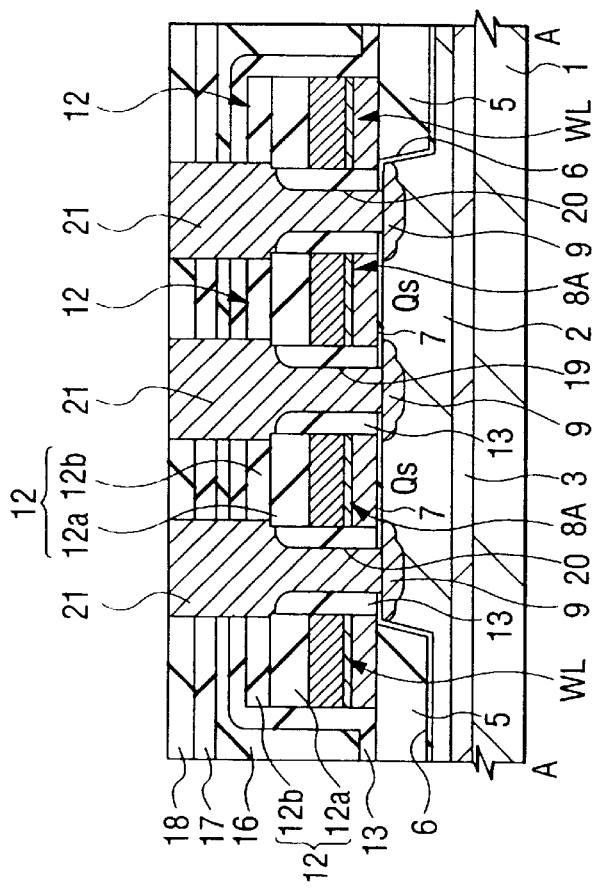
FIG. 24(b) is an enlarged section of an essential portion of the semiconductor substrate at the manufacture step of FIG. 23 and corresponding to line B—B of FIG. 4.

Next, the plugs 21 are formed in the contact holes 19 and 20, as shown in FIGS. 23 and 24. Here, FIG. 24(a) is an enlarged section showing an essential portion after this treatment and taken along line A—A of FIG. 4, and FIG. 24(b) is an enlarged section showing an essential portion and taken along line B—B of FIG. 4. The plugs 21 are formed by depositing a polycrystalline silicon film of a thickness of about 300 nm, as doped with an impurity (e.g., As (arsenic)) by the CVD method, over the silicon oxide film 18, and then by polishing the polycrystalline silicon film by the CMP method to leave it in the contact holes 19 and 20. In this embodiment, the breakdown voltage can be improved by the silicon oxide film 12a which is interposed between the plugs 21 and the gate electrodes 8A. Since the silicon oxide film 12a has a lower dielectric constant than that of the silicon nitride film, on the other hand, the dielectric constant of the insulating film between the plugs 21 and the gate electrodes 8A can be lowered to reduce the parasitic capacity.

Subsequently, the silicon oxide film 28 having a thickness of about 200 nm is deposited over the silicon oxide film 18 by the CVD method and is then subjected to a heat treatment at 800° C. for about one minute in a nitrogen gas atmosphere. By this heat treatment, the impurities in the polycrystalline silicon film making the plugs 21 diffuse from the bottoms of the contact holes 19 and 20 into the n⁻-type semiconductor region 9a of the memory cell selecting MISFETs Qs to form the n-type semiconductor region (or the source and drain) 9 of a low resistance.

Figure 26A:
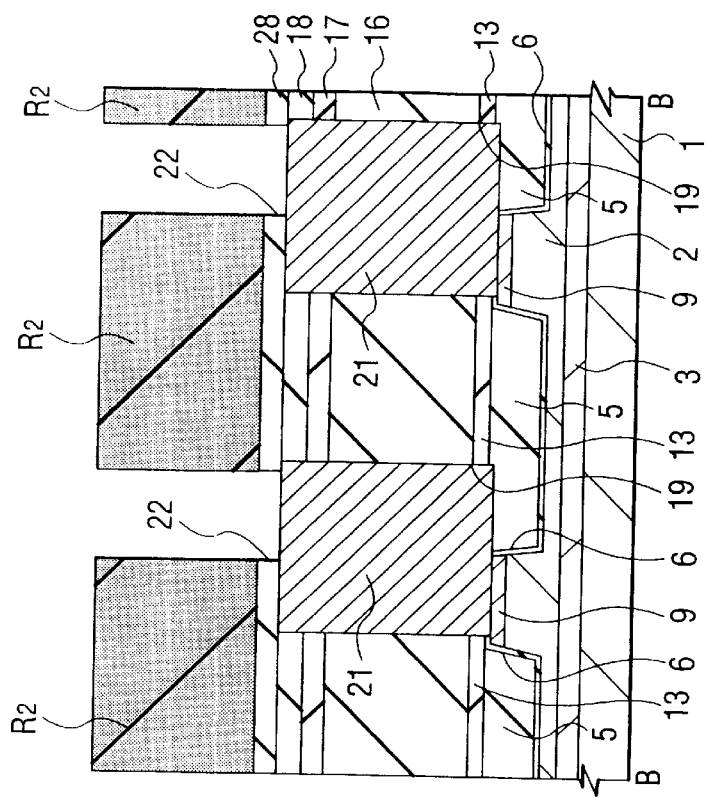
FIG. 26(a) is an enlarged section of an essential portion of the semiconductor substrate at the manufacture step of FIG. 25 and corresponding to line A—A of FIG. 4.
Figure 26B:
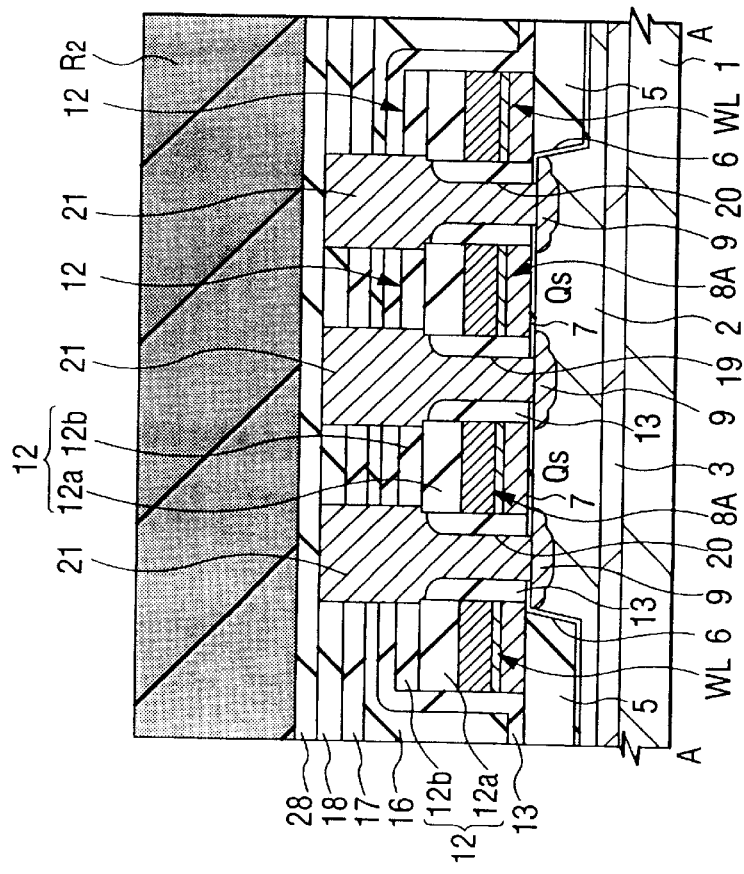
FIG. 26(b) is an enlarged section of an essential portion of the semiconductor substrate at the manufacture step of FIG. 25 and corresponding to line B—B of FIG. 4.
Figure 27:
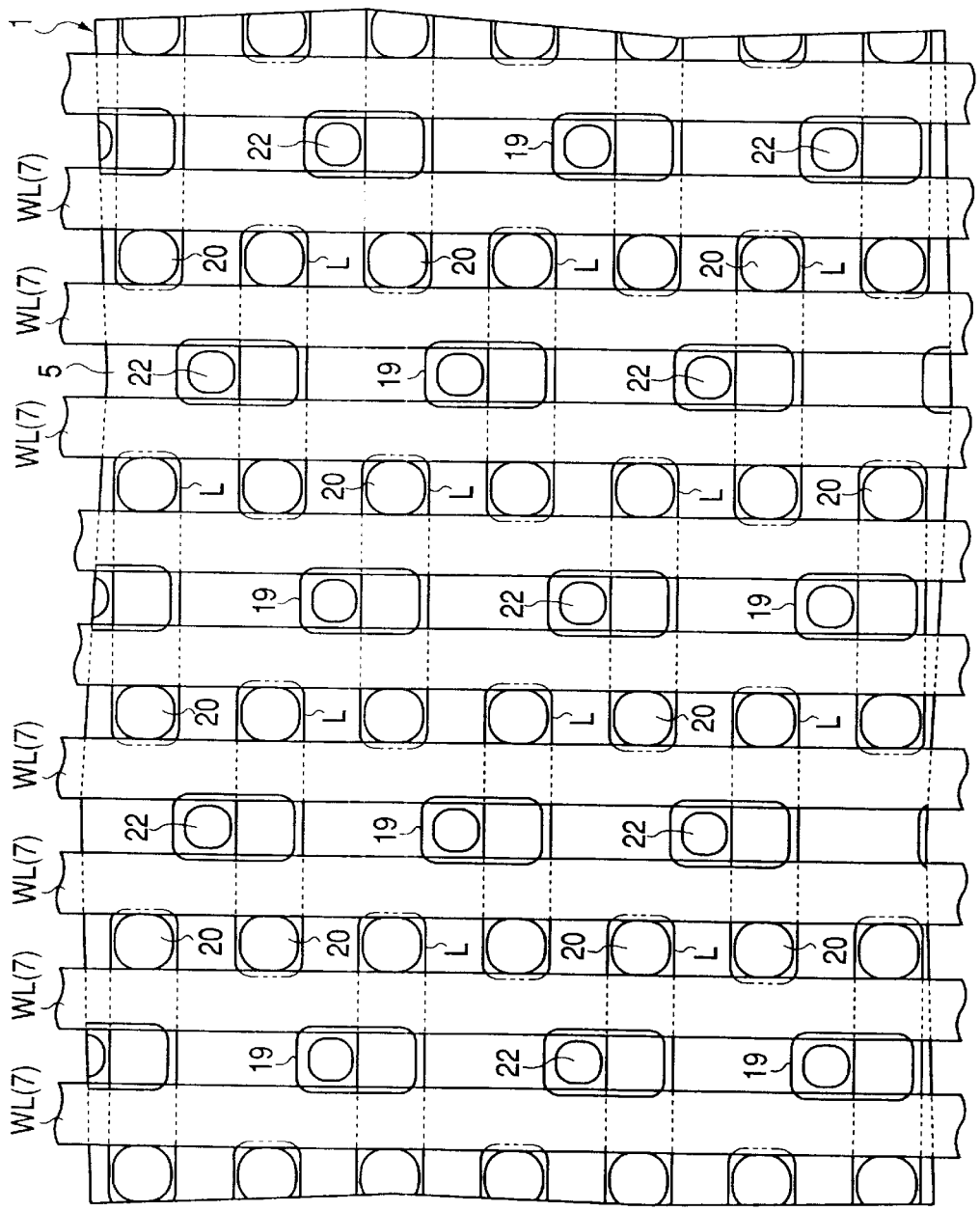
FIG. 27 is an enlarged top plan view of an essential portion of the semiconductor substrate at the manufacture process of FIG. 25.

Next, as shown in FIG. 26, the silicon oxide film 28 over the contact holes 19 are removed by the dry-etching treatment using a photoresist film R2 as the mask to form the through holes 22. These through holes 22 are arranged over the element isolating trenches 6 away from the active region L. Here: FIG. 26(a) is an enlarged section showing an essential portion after this treatment and taken along line A—A of FIG. 4; FIG. 26(b) is an enlarged section showing an essential portion after this treatment and taken along line B—B of FIG. 4; and FIG. 27 is a top plan view showing an essential portion of the memory cell array after this treatment.

Figure 25:
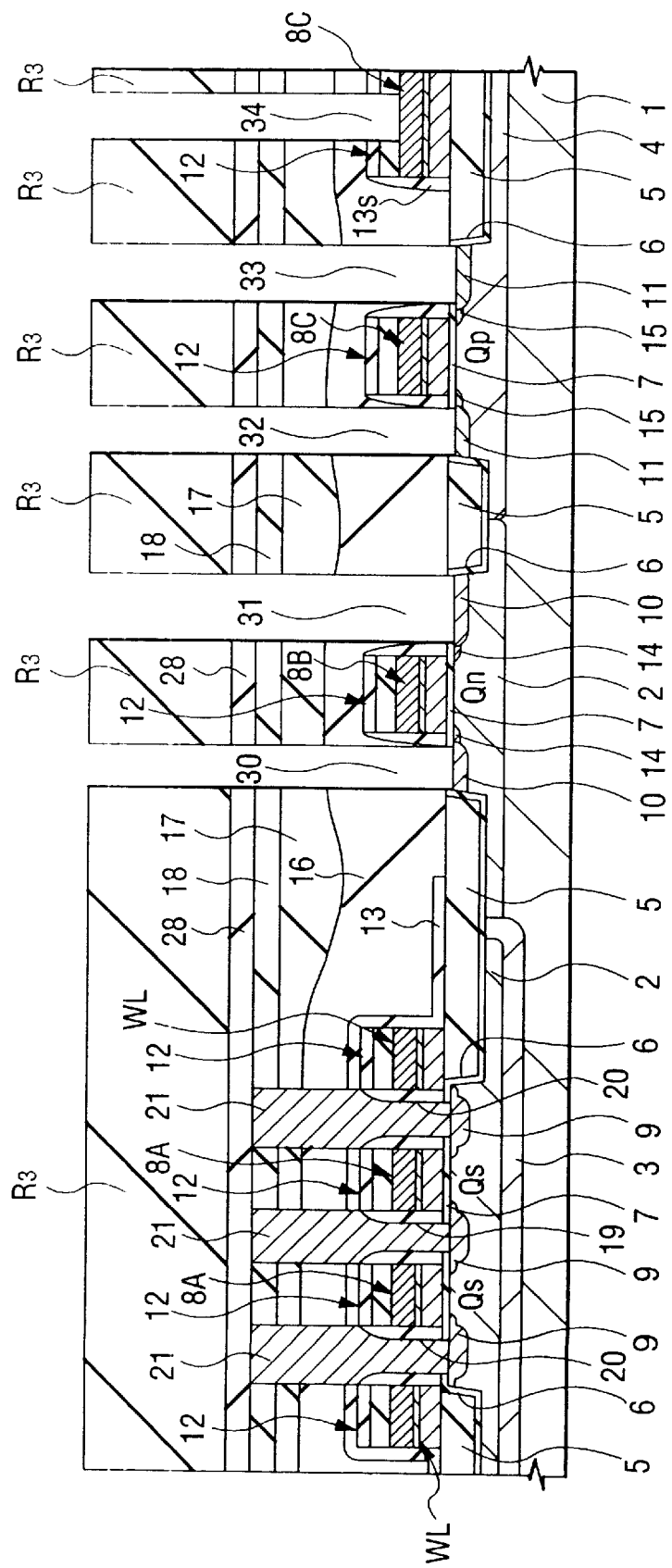
FIG. 25 is a section of an essential portion of the semiconductor substrate showing the DRAM manufacturing process subsequent to FIG. 23.

Subsequently, the silicon oxide films 28, 18 and 17, the SOG film 16 and the gate insulating film 7 of the peripheral circuit are removed by the dry-etching treatment using a photoresist film R3 as the mask, as shown in FIG. 25, to form the contact holes 30 and 31 over the n⁺-type semiconductor region 10 (or the sources and drains) of the n-channel MISFETs Qn and to form the contact holes 32 and 33 over the p⁺-type semiconductor region 11 (or the sources and drains) of the p-channel MISFETs Qp. Simultaneously with this, on the other hand, the contact holes 34 are formed over the gate electrodes 8C of the p-channel MISFETs Qp, and the not-shown contact holes are formed over the gate electrodes 8B of the n-channel MISFETs Qn. These contact holes 30 to 34 have to be so formed retaining margins with respect to the element isolating regions as may not overlap the element isolating regions.

By thus performing the etching treatment for forming the through holes 22 and the etching treatment for forming the contact holes 30 to 34 at the different steps, it is possible to prevent the defect that the plugs 21, as exposed to the bottoms of the shallow through holes 22 of the memory array, from being deeply scraped when the deep contact holes 30 to 34 of the peripheral circuit are to be formed. Here, it is arbitrary to reverse the sequences for forming the through holes 22 and the contact holes 30 to 34, from the aforementioned ones.

Figure 28:
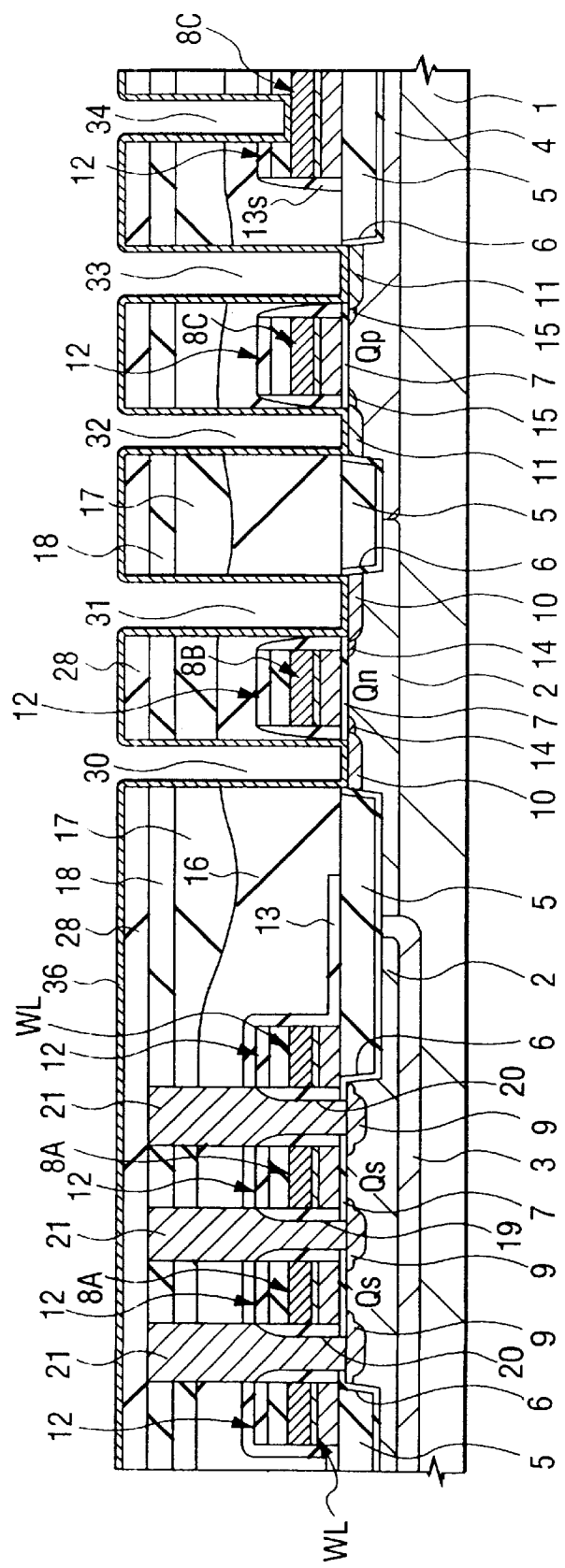
FIG. 28 is a section of an essential portion of the semiconductor substrate showing the DRAM manufacturing process subsequent to FIG. 25.

Next, as shown in FIG. 28, a Ti film 36 having a thickness of about 40 nm is deposited over the silicon oxide film 28 containing the contact holes 30 to 34 and the through holes 22. This Ti film 36 is so deposited by using a highly directive sputtering method such as a collimation sputtering method that a film thickness of about 10 nm or more may be retained even at the bottoms of the contact holes 30 to 34 having a high aspect ratio.

Figure 29:
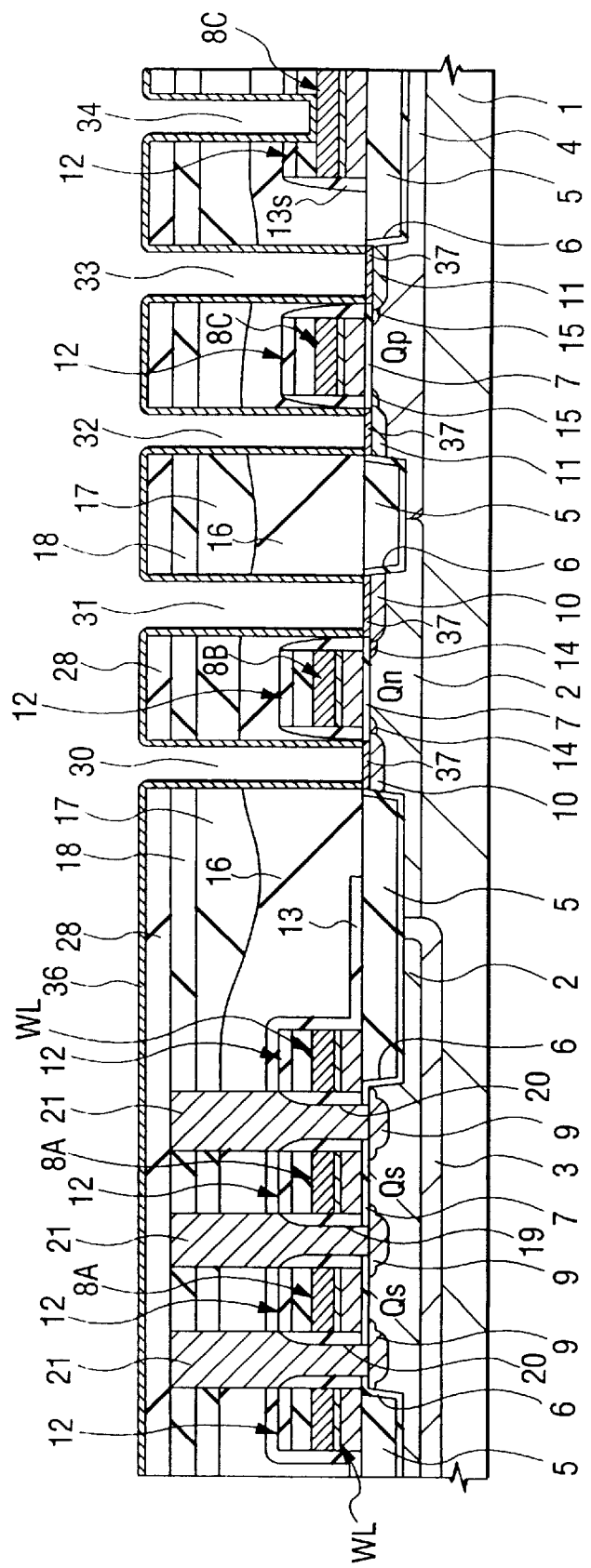
FIG. 29 is a section of an essential portion of the semiconductor substrate showing the DRAM manufacturing process subsequent to FIG. 28.

Subsequently, the Ti film 36 is subjected, without being exposed to the atmosphere, to a heat treatment at 650° C. for about 30 seconds in an Ar (argon) gas atmosphere and further to a heat treatment at 750° C. for about 1 minute in a nitrogen gas atmosphere. This heat treatment causes a reaction between the Si substrate in the bottoms of the contact holes 30 to 34 and the Ti film 36, as shown in FIG. 29, to form the $TiSi_2$ layer 37 having a thickness of about 10 nm on the surface of the $n^+$-type semiconductor region 10 (or the sources and drains) of the n-channel MISFETs Qn and the surface of the $p^+$-type semiconductor region 11 (or the sources and drains) of the p-channel MISFETs Qp. By the heat treatment in the aforementioned nitrogen gas atmosphere, on the other hand, the surface of the thin Ti film 36, as deposited over the side walls of the contact holes 30 to 34, is nitrided to form a stable film which is hard to react with Si.

Here, at this time, the surface of the Ti film 36 over the silicon oxide film 28 is also nitrided, but the remaining portions is not nitrided but left unreacted. On the surface of the plugs 21 in the bottoms of the through holes 22 (as shown in FIG. 26), on the other hand, there is formed the $TiSi_2$ film 37 by the reaction between the polycrystalline silicon film forming the plugs 21 and the Ti film 36.

By forming the $TiSi_2$ layer 37 in the bottoms of the contact holes 30 to 33, the contact resistance of the portion, in which the plugs 35 to be formed at the next step in the contact holes 30 to 33 and the sources and drains (or the $n^+$-type semiconductor region 10 and the $p^+$-type semiconductor region 11) of the MISFETs of the peripheral circuit contact, can be lowered to 1 KΩ or less, so that the peripheral circuit such as the sense amplifier SA or the word driver WD can operate at a high speed. The silicide layer in the bottoms of the contact holes 30 to 33 can also be made of a refractory metal silicide other than $TiSi_2$, such as $CoSi_2$ (cobalt silicide), $TaSi_2$ (tantalum silicide) or $MoSi_2$ (molybdenum silicide).

Figure 30:
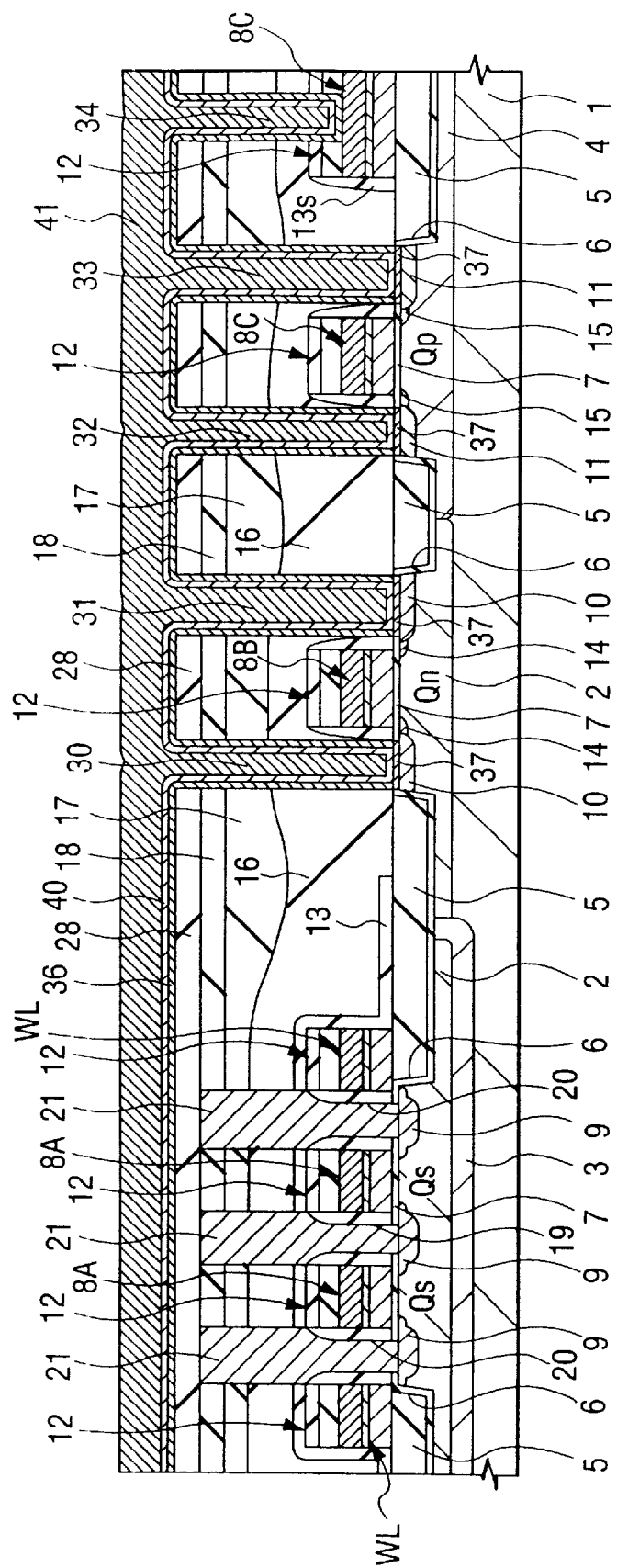
FIG. 30 is a section of an essential portion of the semiconductor substrate showing the DRAM manufacturing process subsequent to FIG. 29.

Next, as shown in FIG. 30, a TiN film 40 having a thickness of about 30 nm is deposited over the Ti film 36 by the CVD method. This CVD method has a better step coverage than the sputtering method so that it can deposit the TiN film 40 having a thickness substantially equal to that of the flat portion in the bottoms of the contact holes 30 to 34 having a high aspect ratio. Subsequently, a thick W film 41 having a thickness of about 300 nm is deposited over the TiN film 40 by the CVD method using tungsten hexafluoride ($WF_6$), hydrogen and monosilane ($SiH_4$) as the source gas, to bury the individual insides of the contact holes 30 to 34 and the through holes 22 (as shown in FIG. 26) completely with the S film 41.

Here, if the unreacted Ti film 36 is removed with the etching liquid just after the $TiSi_2$ layer 37 was formed, the etching liquid invades into not only the insides of the contact holes 34 formed over the gate electrodes 8C of the p-channel MISFETs Qp but also the insides of the not-shown contact holes formed over the gate electrodes 8B of the n-channel MISFETs Qn so that the surfaces (or the W film) of the gate electrodes 8B and 8C constructed of the polymetal structure are etched. In order to prevent this, according to this embodiment, the $TiSi_2$ layer 37 is formed in the bottoms of the contact holes 30 to 33, and the TiN film 40 and the W film 41 are deposited, leaving the unreacted Ti film 36 over the silicon oxide film 28 and in the contact holes 30 to 34.

Figure 31:
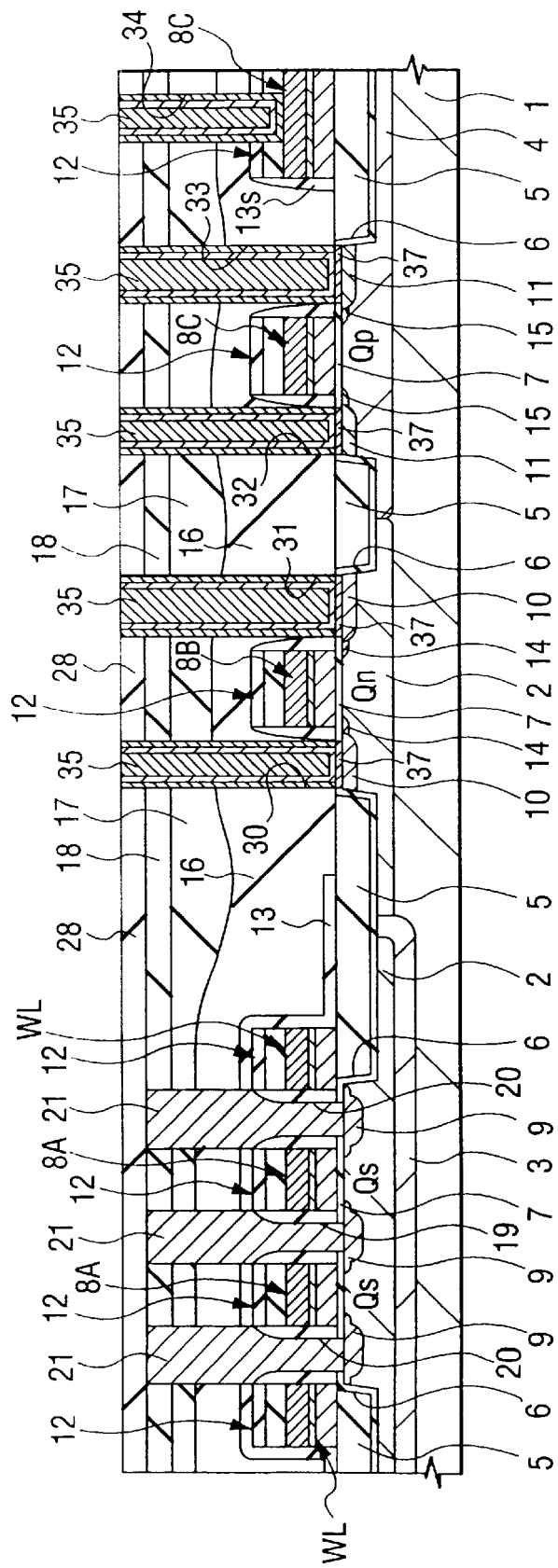
FIG. 31 is a section of an essential portion of the semiconductor substrate showing the DRAM manufacturing process subsequent to FIG. 30.

Next, as shown in FIG. 31, the w film 41, the TiN film 40 and the Ti film 36 over the silicon oxide film 28 are removed (or polished back) by using the CMP method, to form the plugs 35 of the aforementioned W film 41, TiN film 40 and Ti film 36 individually in the contact holes 30 to 34 and the through holes 22 (as shown in FIG. 26). These plugs 35 may also be formed by removing (or etching back) the W film 41, the TiN film 40 and the Ti film 36 over the silicon oxide film 28 by the dry-etching method.

The aforementioned plugs 35 have a low resistance but a high heat resistance because they are formed mainly of the W film 41 or the refractory metal. On the other hand, the TiN film 40, as formed under the W film 41, functions not only as a barrier layer for preventing the tungsten hexafluoride and Si from reacting to generate defects (such as encroachments or worm holes) when the W film 41 is to be deposited by the CVD method but also as a barrier layer for preventing the W film 41 and the Si substrate from reacting (or siliciding) at a later heat treatment at a high temperature. This barrier layer can also be made of a refractory metal nitride (e.g., a WN film) or the like other than the TiN.

The plugs 35 may also be formed mainly of the TiN film 40 without using the W film 41. Specifically, the plugs 35 may also be formed by burying the,thick TiN film 40 individually in the contact holes 30 to 34 and the through holes 22 (as shown in FIG. 26). In this case, the plugs 35 have a rather high resistance, as compared with the case in which they are formed mainly of the W film 41. However, the TiN film 40 acts as the etching stopper when the W film 42 to be deposited at the next step over the silicon oxide film 28 is to be dry-etched to form the bit lines BL and the first layer wiring lines 23 to 26 of the peripheral circuit. As a result, the margin for the misalignment of the wiring lines 23 to 26 and the contact holes 30 to 34 is drastically improved to improve the degree of freedom for the layout of the wiring lines 23 to 26 remarkably.

Next, the bit lines BL and the first layer wiring lines 23 to 26 of the peripheral circuit are formed over the silicon oxide film 28 by the following method.

Figure 32:
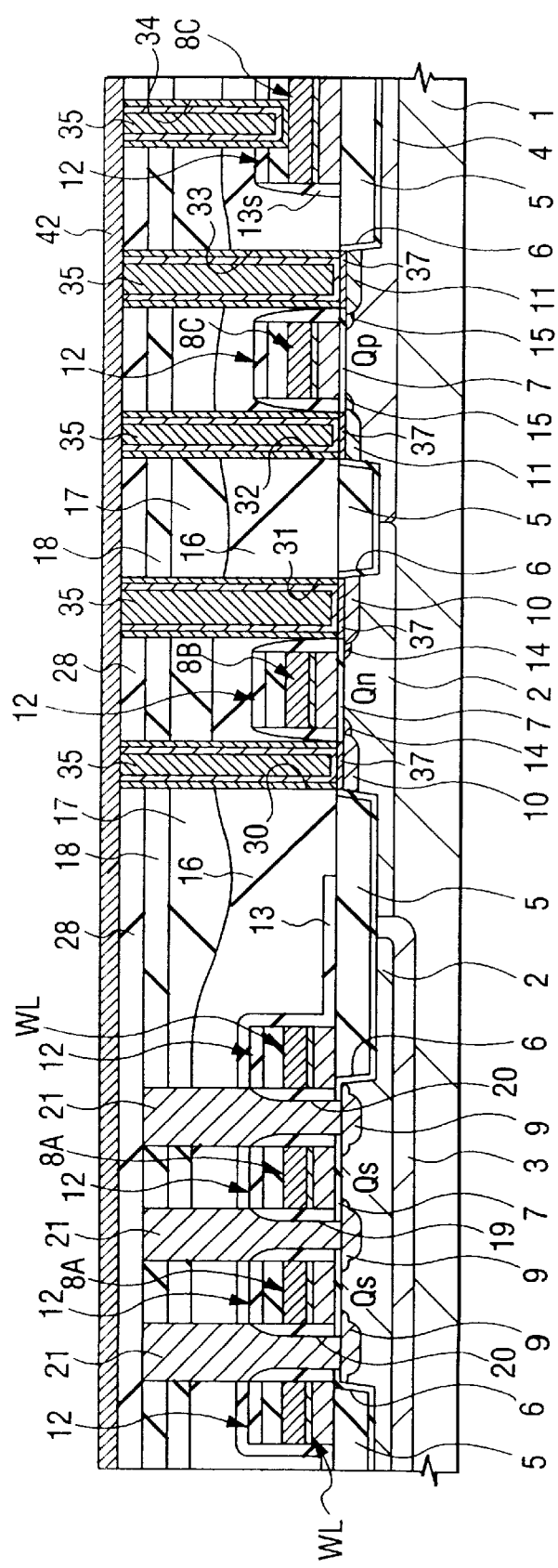
FIG. 32 is a section of an essential portion of the semiconductor substrate showing the DRAM manufacturing process subsequent to FIG. 31.
Figure 33:
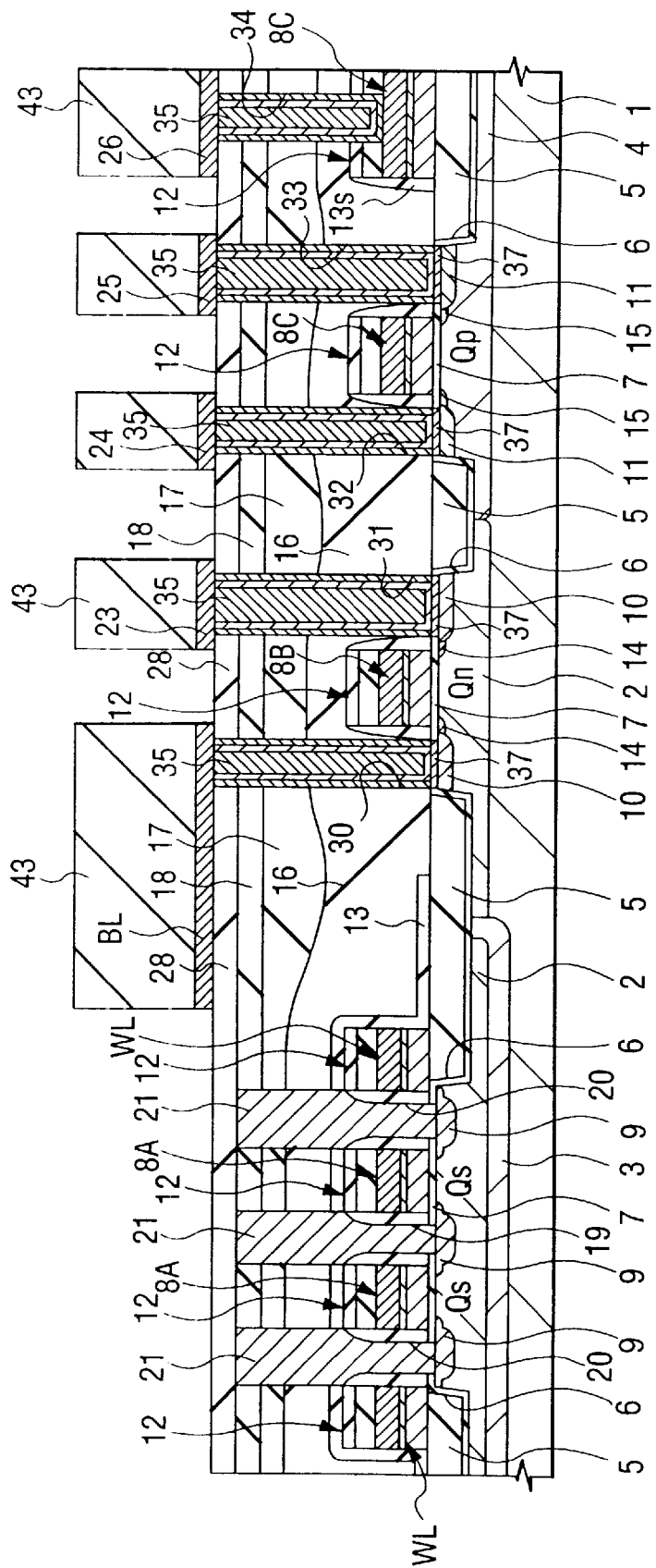
FIG. 33 is a section of an essential portion of the semiconductor substrate showing the DRAM manufacturing process subsequent to FIG. 32.

First of all, as shown in FIG. 32, the surface of the silicon oxide film 28 is wet-washed to remove the polishing residual sufficiently, and a W film 42 having a thickness of about 100 nm is deposited thereover by the sputtering method. Next, as shown in FIG. 33, the W film 42 is dry-etched by using a photoresist film 43 formed over the W film 42 as the mask, to form the bit lines BL and the first layer wiring lines 23 to 26 of the peripheral circuit.

Figure 34:
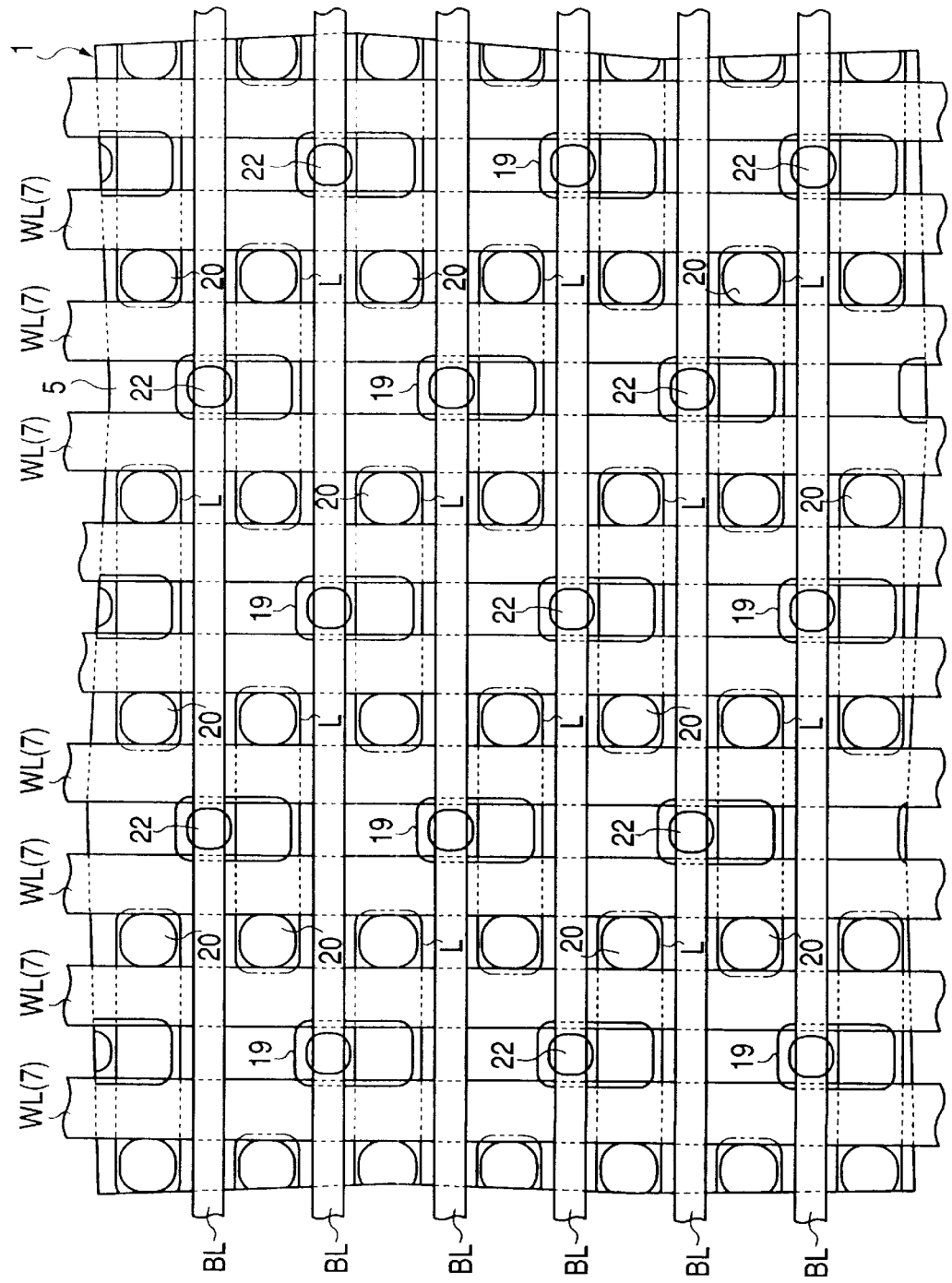
FIG. 34 is a top plan view of an essential portion of the semiconductor substrate at the manufacture process of FIG. 33.

The bit lines BL and the wiring lines 23 to 26 may also be formed by using either the W film deposited by the CVD method or the laminated film of the W film and the TiN film. Alternatively, there may also be used either a single layer film of a refractory metal (e.g., a Mo film or a Ta film) having an excellent contactability with the silicon oxide-based insulating film or its nitrides, or their laminated film. Here, FIG. 34 is a top plan view showing an essential portion of the memory cell array after the bit lines BL were formed. These bit lines BL are formed in the shape of bands and are electrically connected through the through holes 22 with the plugs 21 having a rectangular top plan shape.

Figure 35:
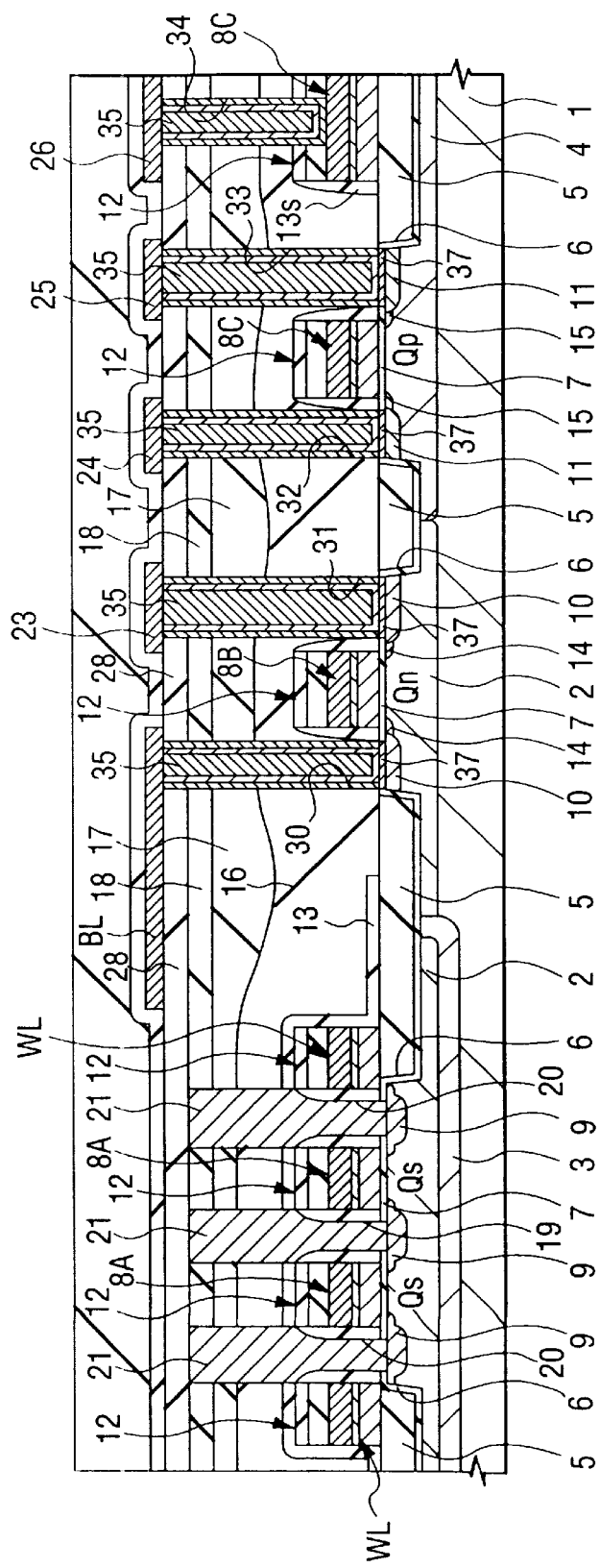
FIG. 35 is a section of an essential portion of the semiconductor substrate showing the DRAM manufacturing process subsequent to FIG. 33.
Figure 36A:
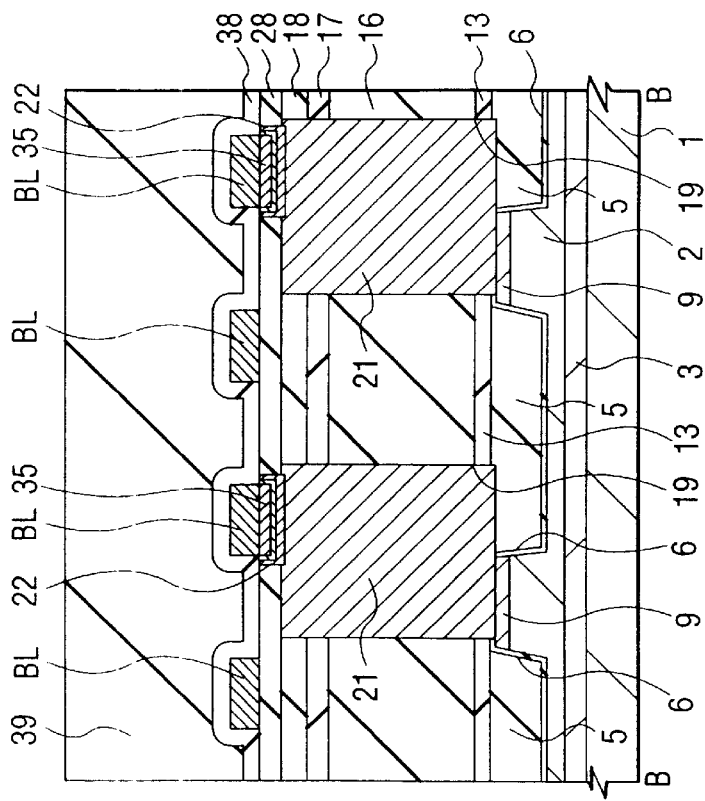
FIG. 36(a) is an enlarged section of an essential portion of the semiconductor substrate at the manufacture step of FIG. 35 and corresponding to line A—A of FIG. 4.
Figure 36B:
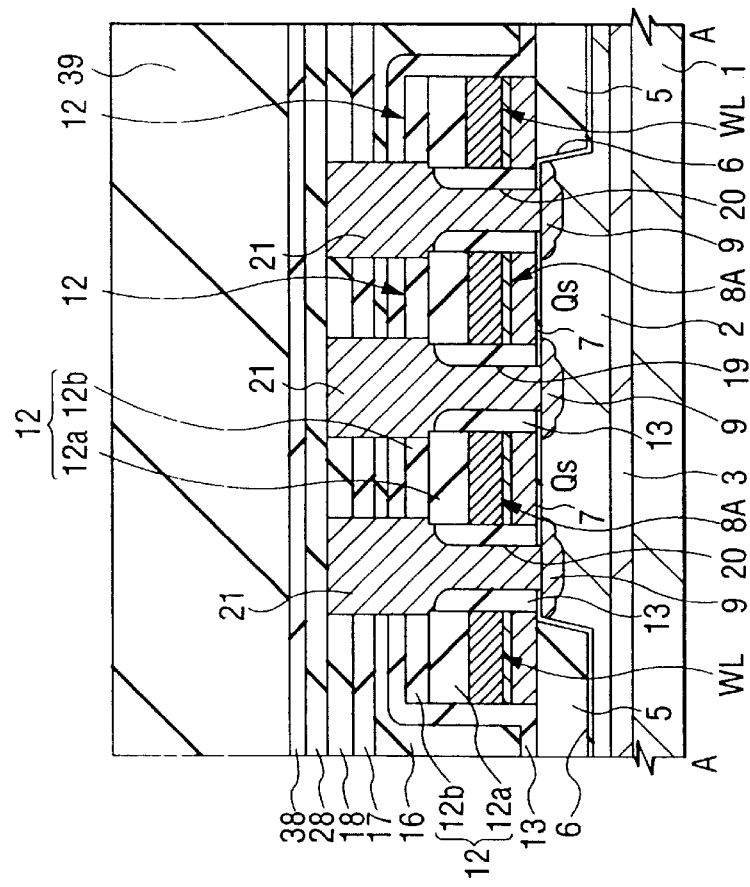
FIG. 36(b) is an enlarged section of an essential portion of the semiconductor substrate at the manufacture step of FIG. 35 and corresponding to line B—B of FIG. 4.

Next, as shown in FIGS. 35 to 36, the silicon oxide film 38 having a thickness of about 100 nm is deposited individually over the bit lines BL and the first layer wiring lines 23 to 26. Subsequently, the SOG film 39 having a thickness of about 250 nm is spin-applied to the upper portion of the silicon oxide film 38 and is then baked in an oxygen atmosphere at about 400° C. containing steam. Moreover, the surface of the SOG film 39 is further flattened by subjecting it to a heat treatment at 800° C. for about one minute to densify it. Here, FIG. 36(a) is an enlarged section showing an essential portion after this treatment and taken along line A—A of FIG. 4, and FIG. 36(b) is an enlarged section showing an essential portion after this treatment and taken along line B—B of FIG. 4.

Here, when the step by the bit lines BL and the first layer wiring lines 23 to 26 is small, the flattening can also be effected not by using the SOG film 39 but only by depositing the silicon oxide film 38 thick. When the bit lines BL and the wiring lines 23 to 26 have a large density difference so that the sufficient flatness cannot be achieved merely by the SOG film 39, the surface of this SOG film 39 may be polished by the CMP method, and the silicon oxide film for remedying the fine polishing flaws on the surface of the SOG film 39 may also be deposited over the SOG film 39. When the temperature for densifying the SOG film 39 cannot be so high, on the other hand, a silicon oxide film may be further deposited thereover so as to compensate the drop in the moisture resistance.

Figure 37:
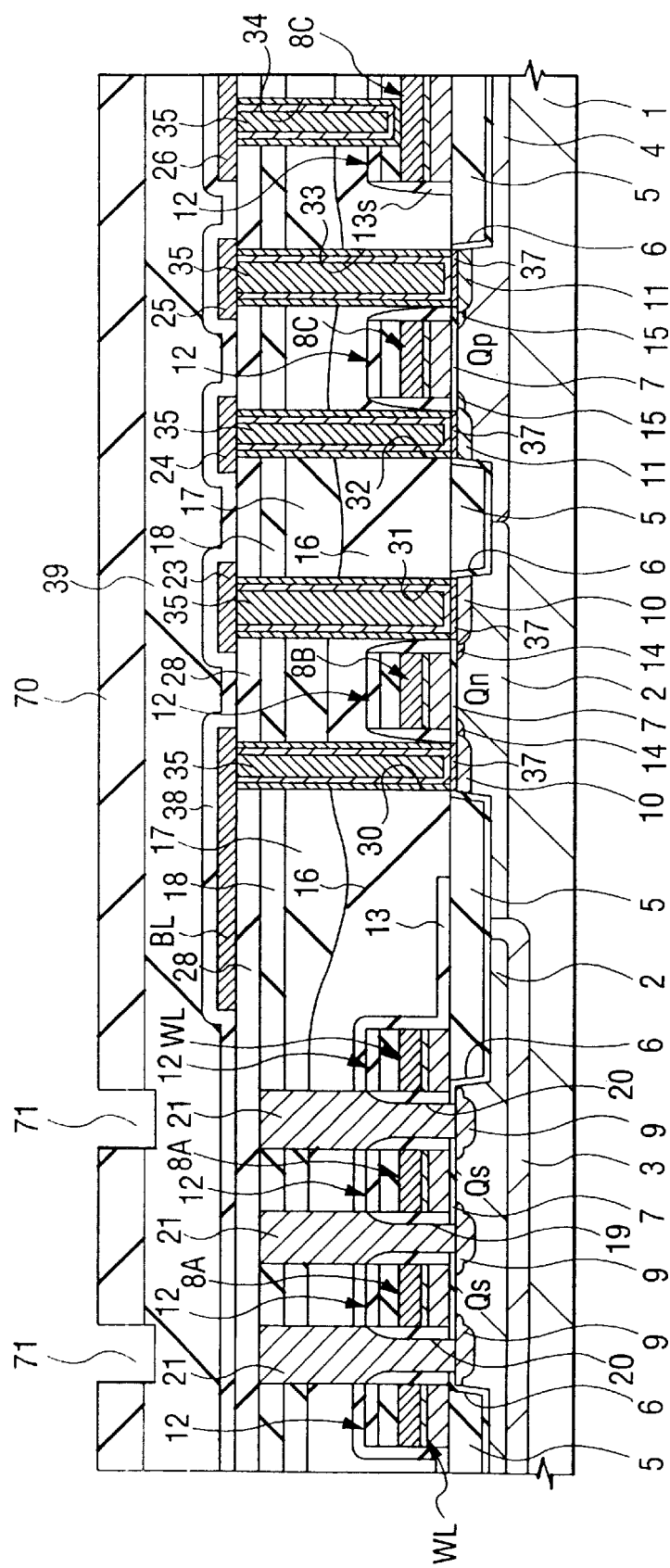
FIG. 37 is a section of an essential portion of the semiconductor substrate showing the DRAM manufacturing process subsequent to FIG. 35.

Next, as shown in FIG. 37, a polycrystalline silicon film 70 having a thickness of about 200 nm is deposited over the SOG film 39 and is dry-etched by using a photoresist film as the mask, to form through holes 71 over the contact holes 20. These through holes 71 are formed to have their diameter substantially equal to the minimum working size.

Figure 38:
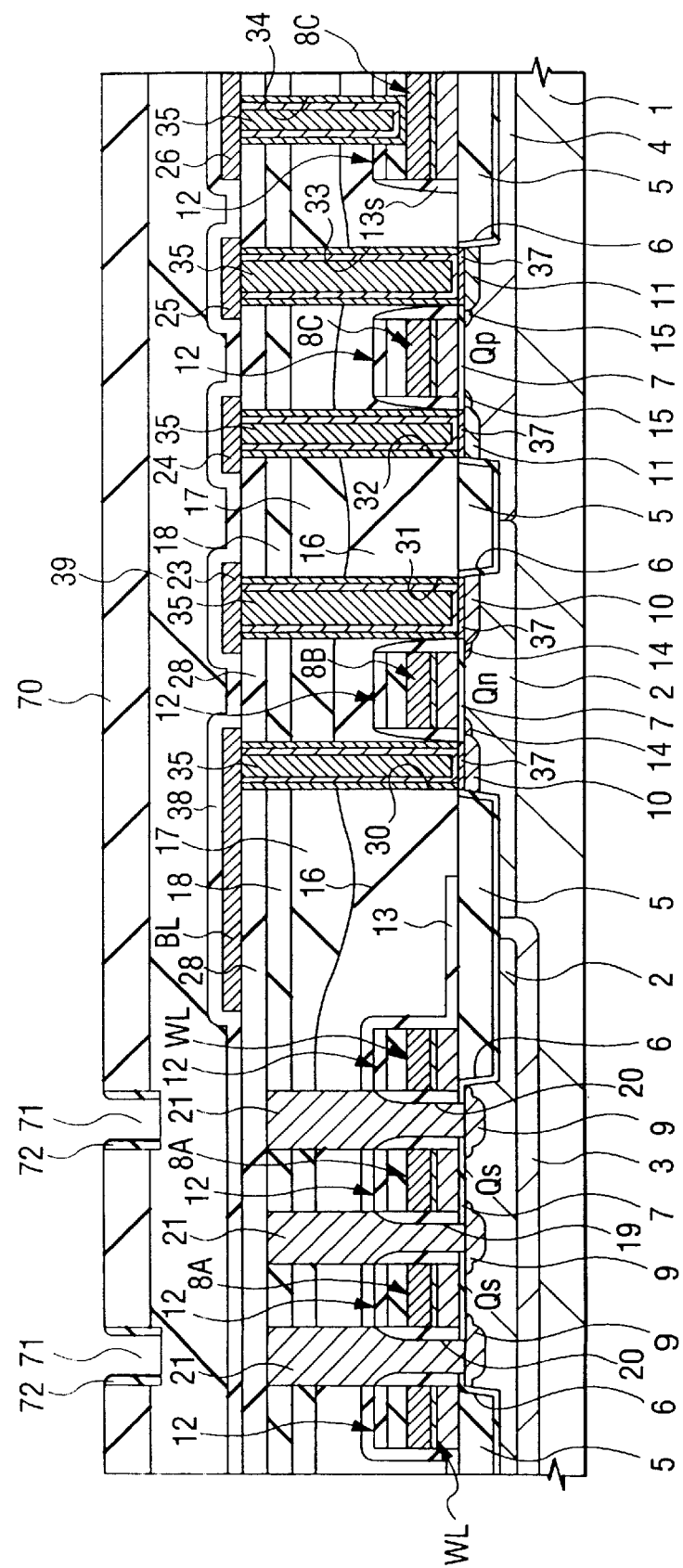
FIG. 38 is a section of an essential portion of the semiconductor substrate showing the DRAM manufacturing process subsequent to FIG. 37.

Next, as shown in FIG. 38, side wall spacers 72 are formed of a polycrystalline silicon film on the side walls of the through holes 71. The side wall spacers 72 are formed by depositing a second (not-shown) polycrystalline silicon film as thin as about 60 nm over the polycrystalline silicon film 70 containing the insides of the through holes 71 by the CVD method and then by etching back this polycrystalline silicon film to leave it on the side walls of the through holes 71. By forming these side wall spacers 72, the internal diameter of the through holes 71 is made smaller than the minimum working size.

Figure 39:
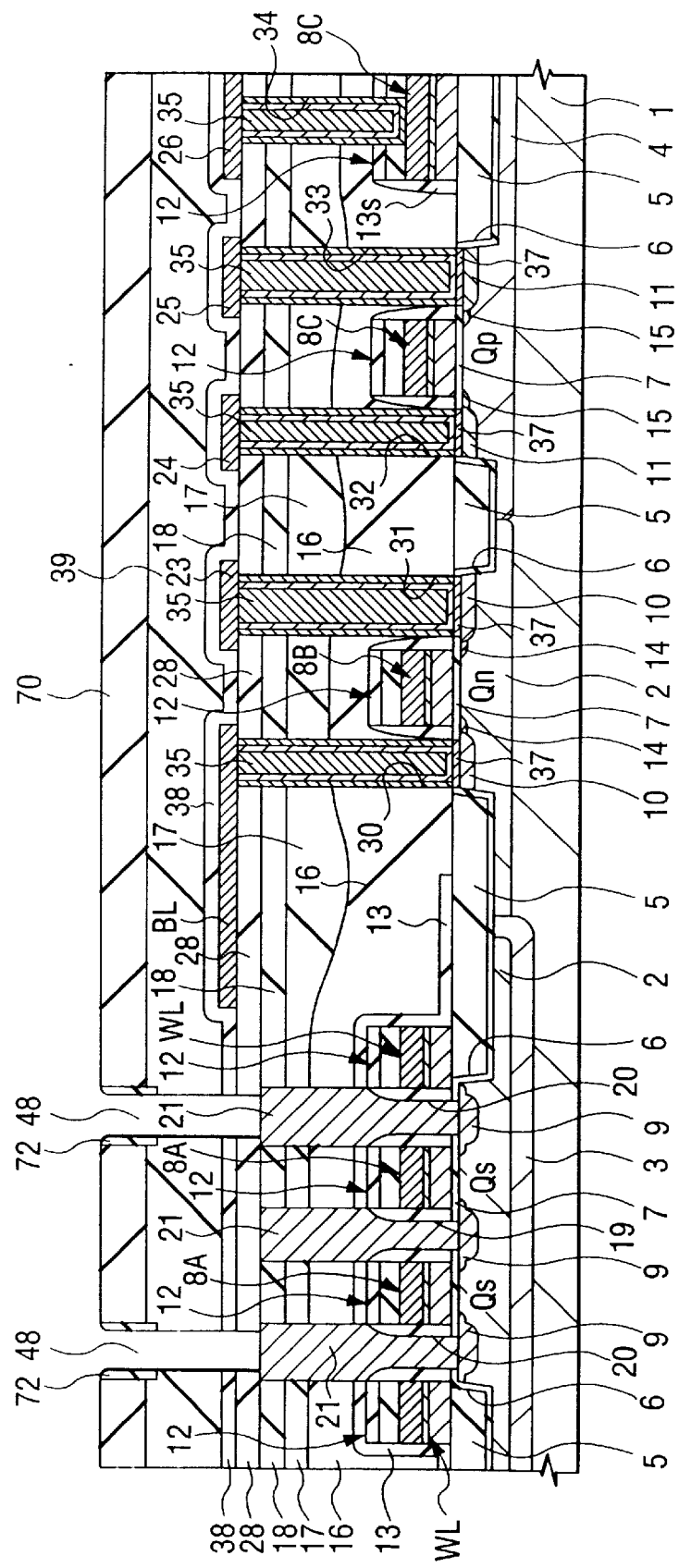
FIG. 39 is a section of an essential portion of the semiconductor substrate showing the DRAM manufacturing process subsequent to FIG. 38.

Next, as shown in FIG. 39, the insulating films (or the SOG film 39 and the silicon oxide films 38 and 28) in the bottoms of the through holes 71 are dry-etched by using the polycrystalline silicon film 70 and the side wall spacers 72 as the mask to form the through holes 48 which extend to the contact holes 20 through the space region between the bit lines BL and the adjoining bit lines BL.

The through holes 48 are formed by using the side wall spacers 72 on the side walls of the through holes 71 having a smaller internal diameter than the minimum working size as the mask, so that their internal diameter is smaller than the minimum working size. As a result, the margin for aligning the space regions of the bit lines BL and the through holes 48 can be sufficiently retained to prevent reliably the plugs 49 to be buried in the through holes 48 at the next step from short-circuiting with the bit lines BL or the underlying plugs 35.

Figure 40:
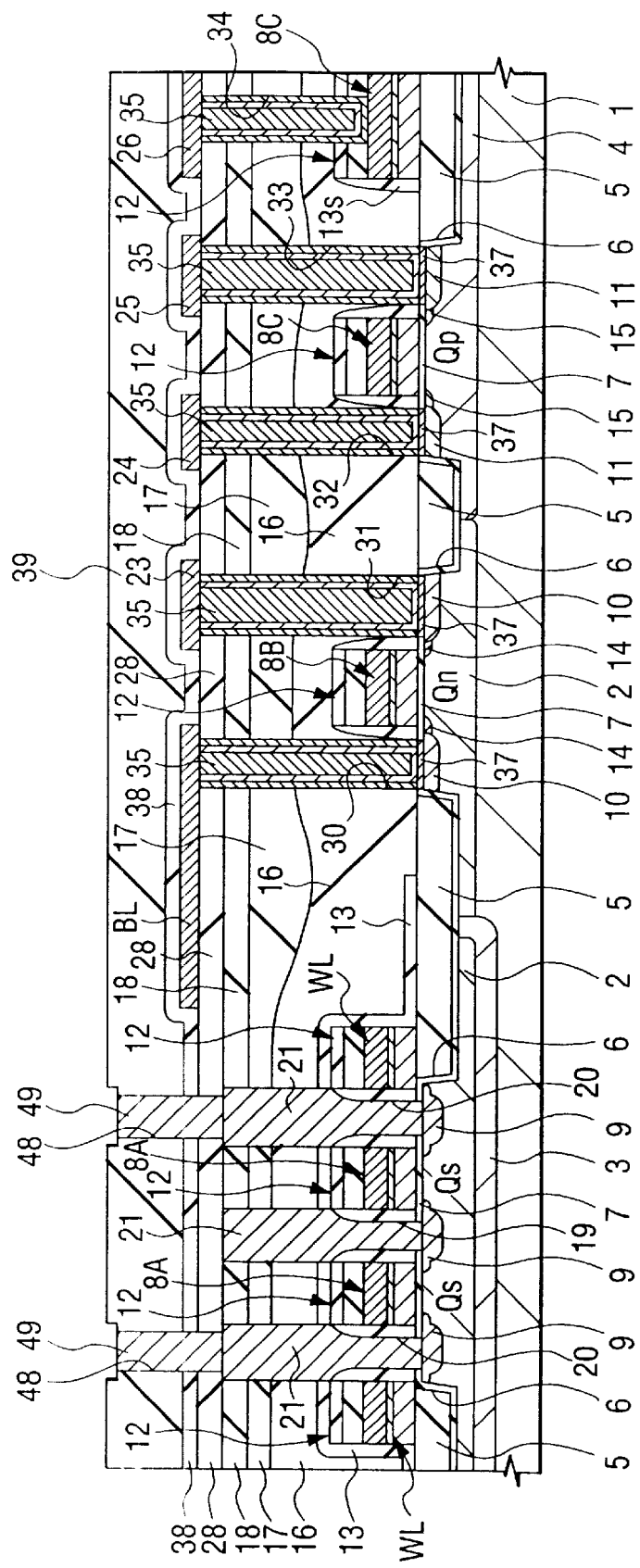
FIG. 40 is a section of an essential portion of the semiconductor substrate showing the DRAM manufacturing process subsequent to FIG. 39.

Next, as shown in FIG. 40, a (not-shown) polycrystalline silicon film having a thickness of about 200 nm, as doped with an n-type impurity (e.g., P (phosphor)), is deposited over the polycrystalline silicon film 70 containing the inside of the through holes 48 therein by the CVD method, and is then etched back together with the polycrystalline silicon film 70 and the side wall spacers 72 to form the plugs 49 of a polycrystalline silicon film in the through holes 48.

Figure 41:
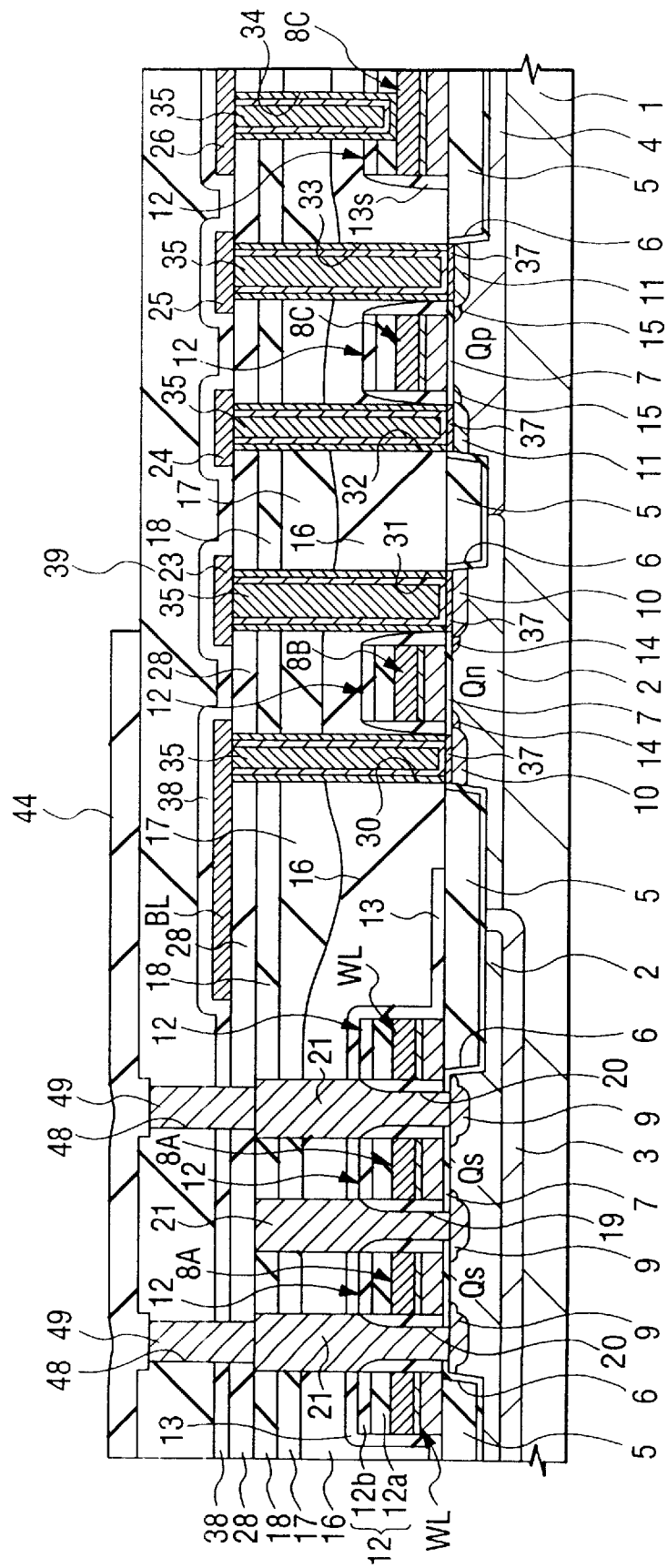
FIG. 41 is a section of an essential portion of the semiconductor substrate showing the DRAM manufacturing process subsequent to FIG. 40.

Next, as shown in FIG. 41, the silicon nitride film 44 having a thickness of about 200 nm is deposited over the SOG film 39 by the CVD method, and the silicon nitride film 44 of the peripheral circuit is then removed by the dry-etching treatment using a photoresist film as the mask. The silicon nitride film 44, as left in the memory array, is used as the etching stopper for etching the silicon oxide film at the step of forming the lower electrodes 45 of the later-described information storing capacity elements C.

Figure 42:
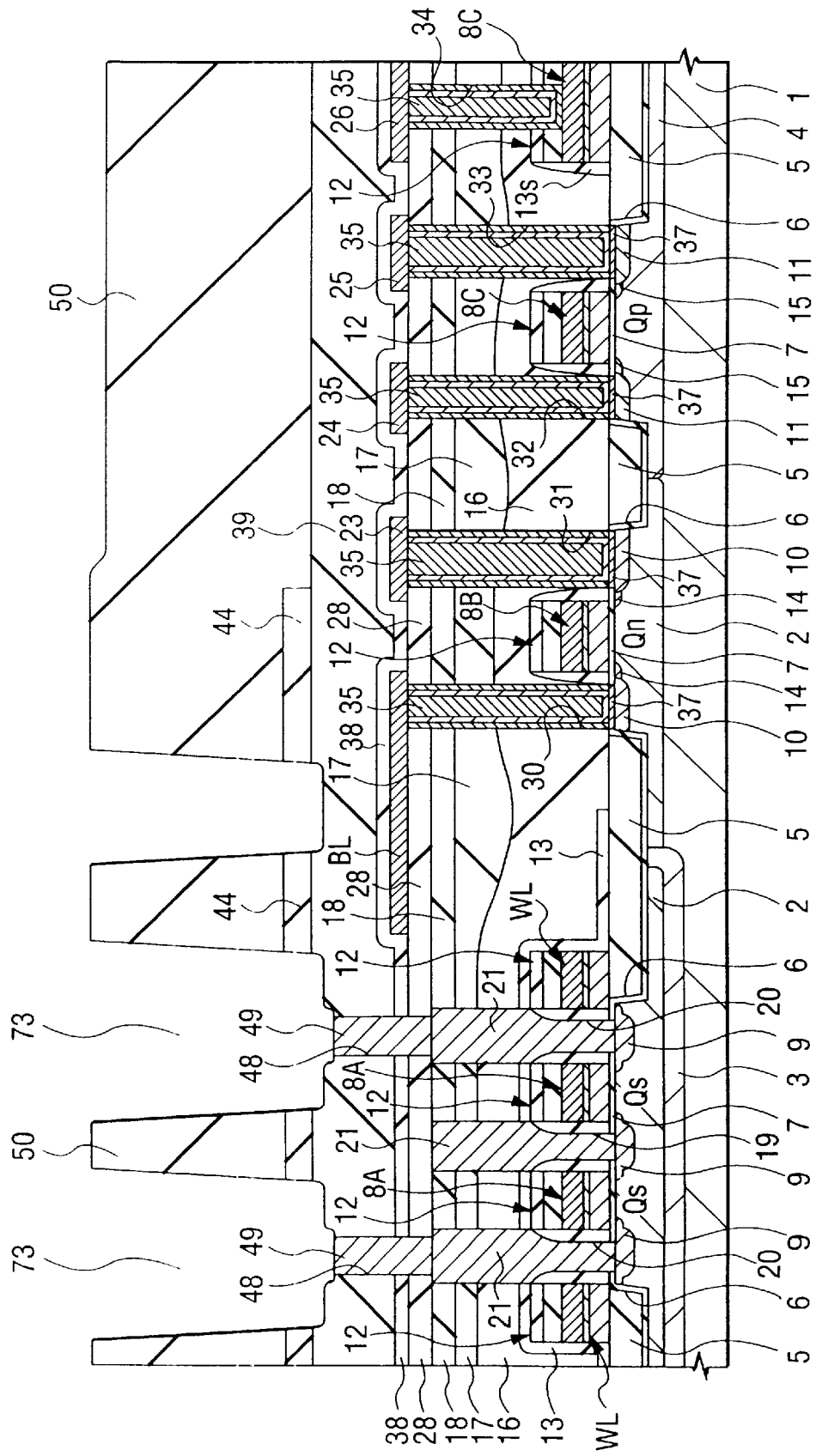
FIG. 42 is a section of an essential portion of the semiconductor substrate showing the DRAM manufacturing process subsequent to FIG. 41.

Next, as shown in FIG. 42, the silicon oxide film 50 is deposited over the silicon nitride film 44 by the CVD method, and the silicon oxide film 50 and the underlying silicon nitride film 44 are dry-etched by using a photoresist film as the mask, to form grooves 73 over the through holes 48. Since the lower electrodes 45 of the information storing capacity elements C are formed along the inner walls of the grooves 73, the silicon oxide film 50 has to be deposited to have a large thickness (e.g., about 1.3 microns) so as to increase the stored charge by enlarging the surface area of the lower electrodes 45.

Figure 43:
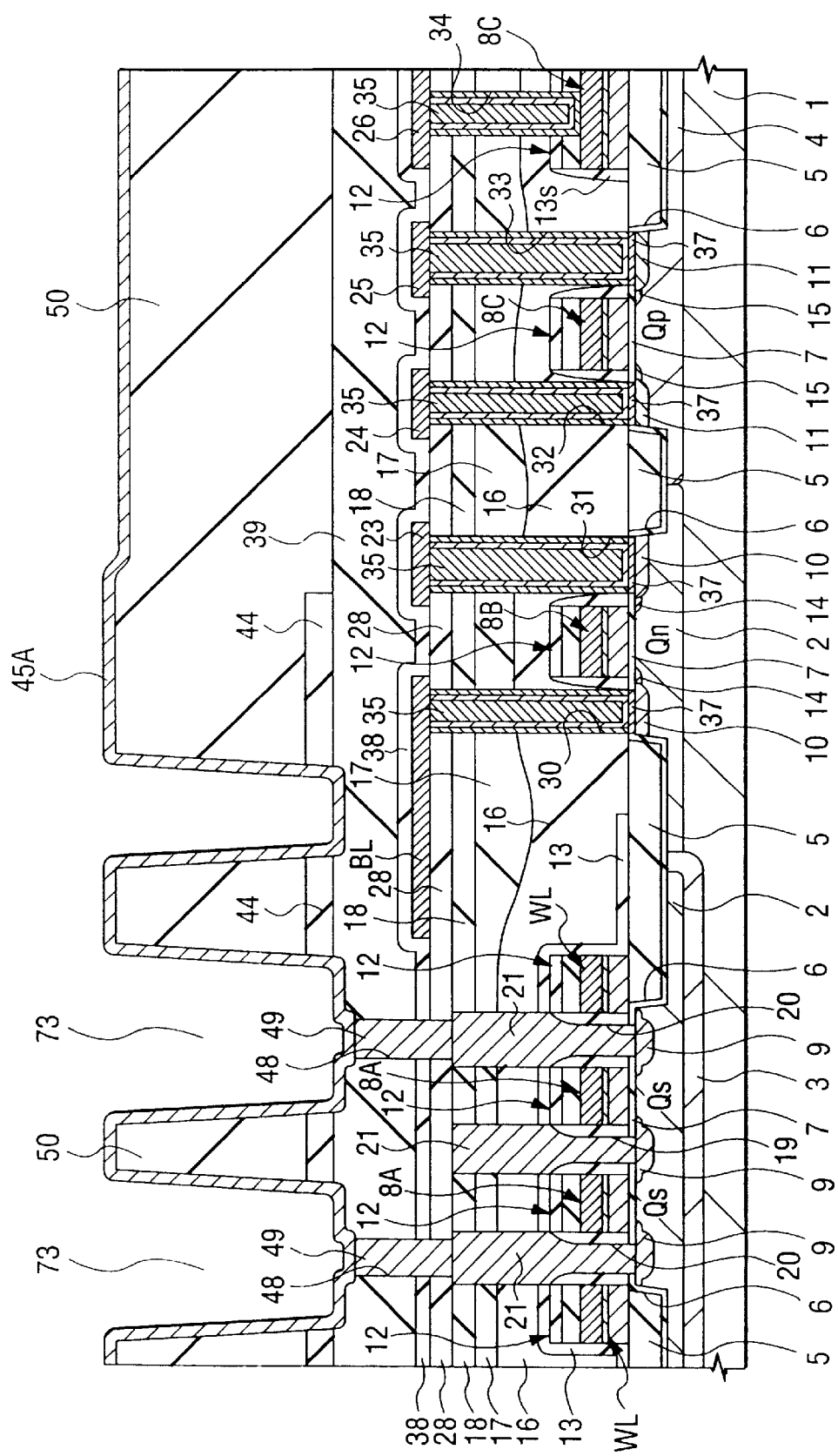
FIG. 43 is a section of an essential portion of the semiconductor substrate showing the DRAM manufacturing process subsequent to FIG. 42.

Next, as shown in FIG. 43, a polycrystalline silicon film 45A having a thickness of about 69 nm, as doped with an n-type impurity (e.g., P (phosphor)), is deposited over the silicon oxide film 50 containing the insides of the grooves 73 by the CVD method. This polycrystalline silicon film 45A is used as the electrode material underlying the information storing capacity elements C.

Figure 44:
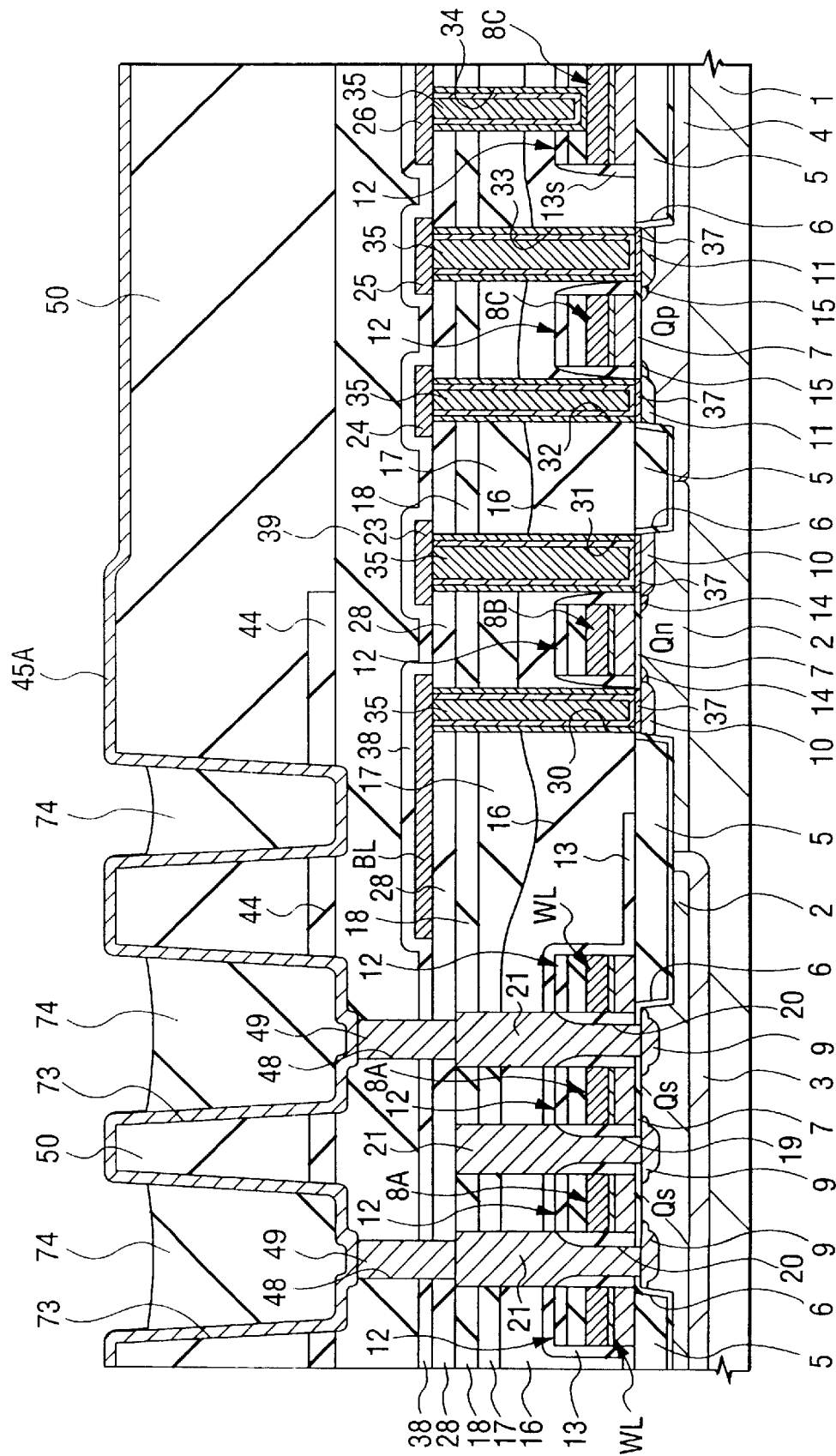
FIG. 44 is a section of an essential portion of the semiconductor substrate showing the DRAM manufacturing process subsequent to FIG. 43.

Next, as shown in FIG. 44, an SOG film having a thickness of about 300 nm is spin-applied to the polycrystalline silicon film 45A containing the insides of the grooves 73 and is then baked by a heat treatment at about 400° C., and the SOG film 74 outside of the grooves 73 is etched back and removed.

Figure 45:
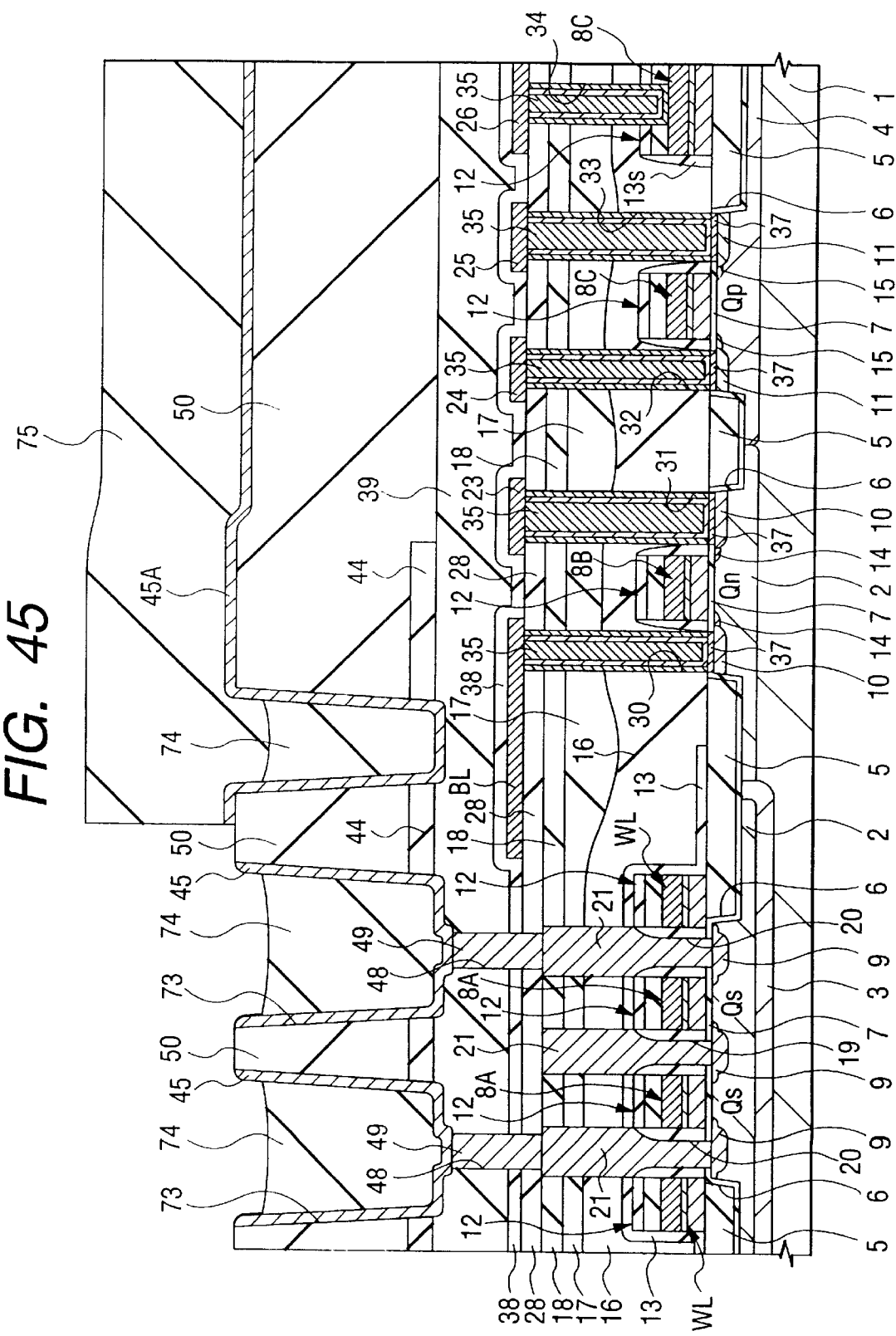
FIG. 45 is a section of an essential portion of the semiconductor substrate showing the DRAM manufacturing process subsequent to FIG. 44.

Next, as shown in FIG. 45, the polycrystalline silicon film 45A of the peripheral circuit is covered with the photoresist film 75, and the polycrystalline silicon film 45A over the silicon oxide film 50 of the memory array is etched back (by the anisotropically etched) and removed to form the lower electrodes 45 along the inner walls of the grooves 73. These lower electrodes 45 can also be formed of a conductive film other than the polycrystalline silicon film 45A. The conductive film for the lower electrodes may desirably be made of a conductive material which has such a heat resistance and an anti-oxidation that it is not deteriorated by a hot heat treatment of the capacitive insulating film to be performed at the next step, such as a refractory metal of W or Ru (ruthenium), or a conductive metal oxide of RuO (ruthenium oxide) or IrO (iridium oxide).

Figure 46:
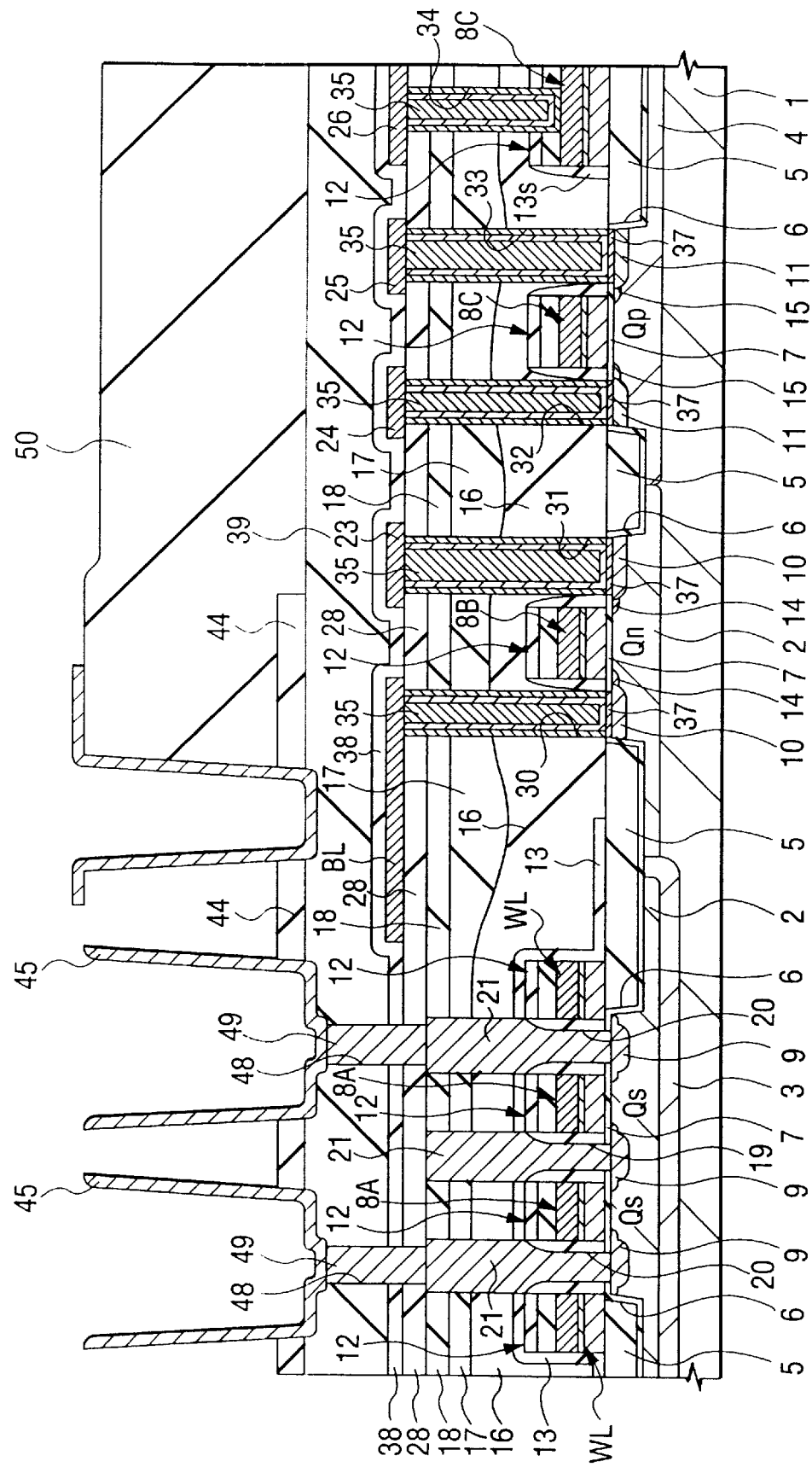
FIG. 46 is a section of an essential portion of the semiconductor substrate showing the DRAM manufacturing process subsequent to FIG. 45.

Next, as shown in FIG. 46, the silicon oxide film 50, as left in the gap between the groove 73 and the groove 73, and the SOG film 74 in the grooves 73 are simultaneously removed with the hydrofluoric acid-based etching liquid, and a photoresist film 75 is then removed. Subsequently, the polycrystalline silicon film 45A of the peripheral circuit is removed by the dry-etching treatment using the photoresist film covering the memory array as the mask, to complete the cylindrical lower electrodes 45. The silicon nitride film 44 is formed in the bottom of the silicon oxide film 50 in the gaps of the grooves so that the underlying SOG film 39 is not etched when the silicon oxide film 50 is wet-etched. At this time, on the other hand, the surface of the peripheral circuit is covered with the polycrystalline silicon film 45A so that the underlying thick silicon oxide film 50 is not etched.

By leaving the silicon oxide film 50 having the large thickness in the peripheral circuit, the surfaces of the layer insulating films 56 and 63 to be formed over the information storing capacity elements C at the later step are substantially at the same level as that of the memory array and the peripheral circuit. This makes it easy to form the second layer wiring lines 52 and 53 to be arranged over the layer insulating film 56, the third layer wiring lines 57 and 58 to be arranged over the layer insulating film 63, and the through holes 60 and 61 for connecting the second and third layer wiring lines.

Figure 47:
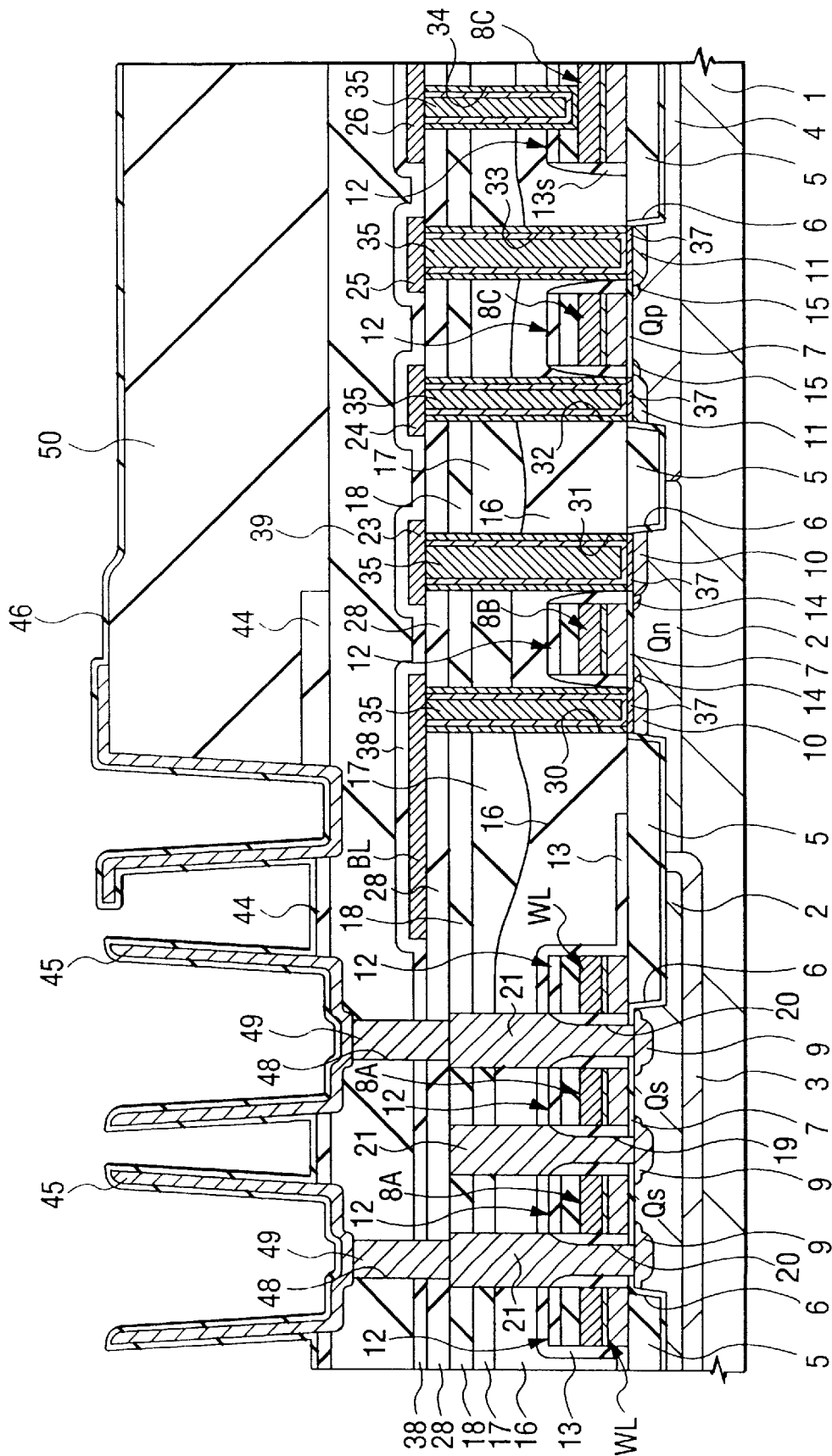
FIG. 47 is a section of an essential portion of the semiconductor substrate showing the DRAM manufacturing process subsequent to FIG. 46.

Next, a heat treatment at 800° C. for about 3 minutes is performed in an ammonia atmosphere to form a (not-shown) thin nitride film on the surface of the lower electrodes 45. After this, as shown in FIG. 47, the thin $Ta_2O_5$ (tantalum oxide) film 46 having a thickness of about 14 mm is deposited over the lower electrodes 45. The nitride film over the lower electrodes 45 is formed to prevent the polycrystalline silicon film (45A) forming the lower electrodes 45 from being oxidized by a next heat treatment. On the other hand, the $Ta_2O_5$ film 46 is deposited by the CVD method using pentaethoxy tantalum ($Ta(OC_2H_5)_5$), for example, as the source gas. The $Ta_2O_5$ film 46 thus deposited by the CVD method has an excellent step coverage so that it is deposited with a substantially equal thickness over the surface of the lower electrodes 45 having a stereoscopic cylindrical shape.

Subsequently, the $Ta_2O_5$ film 46 is thermally treated for about 3 minutes in an oxidizing atmosphere at 800° C. By this hot heat treatment, the crystal defects in the film are remedied to form the $Ta_2O_5$ film 46 of an excellent quality. As a result, the leakage current of the information storing capacity elements C can be reduced to manufacture a DRAM having improved refreshing characteristics.

On the other hand, the lower electrodes 45 of the information storing capacity elements C are formed into the stereoscopic cylindrical shape to enlarge their surface area, and the capacity insulating film is formed of the $Ta_2O_5$ film 46 having a dielectric constant of about 20 to 25, so that a storing charge sufficient for latching the information can be retained even if the memory cells are miniaturized.

On the other hand, the underlying bit lines BL and the first layer wiring lines 23 to 26, as formed prior to the deposition of the $Ta_2O_5$ film 46, are formed of the W film having an excellent contactability with the silicon oxide-based insulating film. This makes it possible to reliably prevent a defect that the film of the bit lines BL and the wiring lines 23 to 26 is scraped due to the hot heat treatment of the $Ta_2O_5$ film 46.

Since the bit lines are formed of the W film having a high heat resistance, on the other hand, it is possible to reliably prevent a defect that the bit lines BL formed to have a fine width of the minimum working size or less are deteriorated or broken due to the hot heat treatment of the $Ta_2 O_5$ film 46. Since the plugs 35 in the contact holes 30 to 35 for connecting the MISFETs of the peripheral circuit and the first layer wiring lines 23 to 26 are made of the conductive material (i.e., the W film/ the TiN film/ the Ti film) having a high heat resistance. This makes it possible to prevent a defect that the leakage current of the sources and drains and the contact resistance are increased due to the hot heat treatment of the $Ta_2O_5$ film 46.

The capacity insulating film of the information storing capacity elements C can also be formed of a high (ferro) electric film made of a metal oxide such as BST, STO, $BaTiO_3$ (barium titanate), $PbTiO_3$ (lead titanate), PZT (PbZrXTi1-$XO_3$), PLT (PbLaXTi1-$XO_3$) or PLZT. Since these high (ferro) electric films are commonly required to have a hot heat treatment of at least about 750° C. after formed so as to provide a high quality of less crystal defects, effects similar to the aforementioned ones can be achieved even when such high (ferro) electric films are used.

Figure 48:
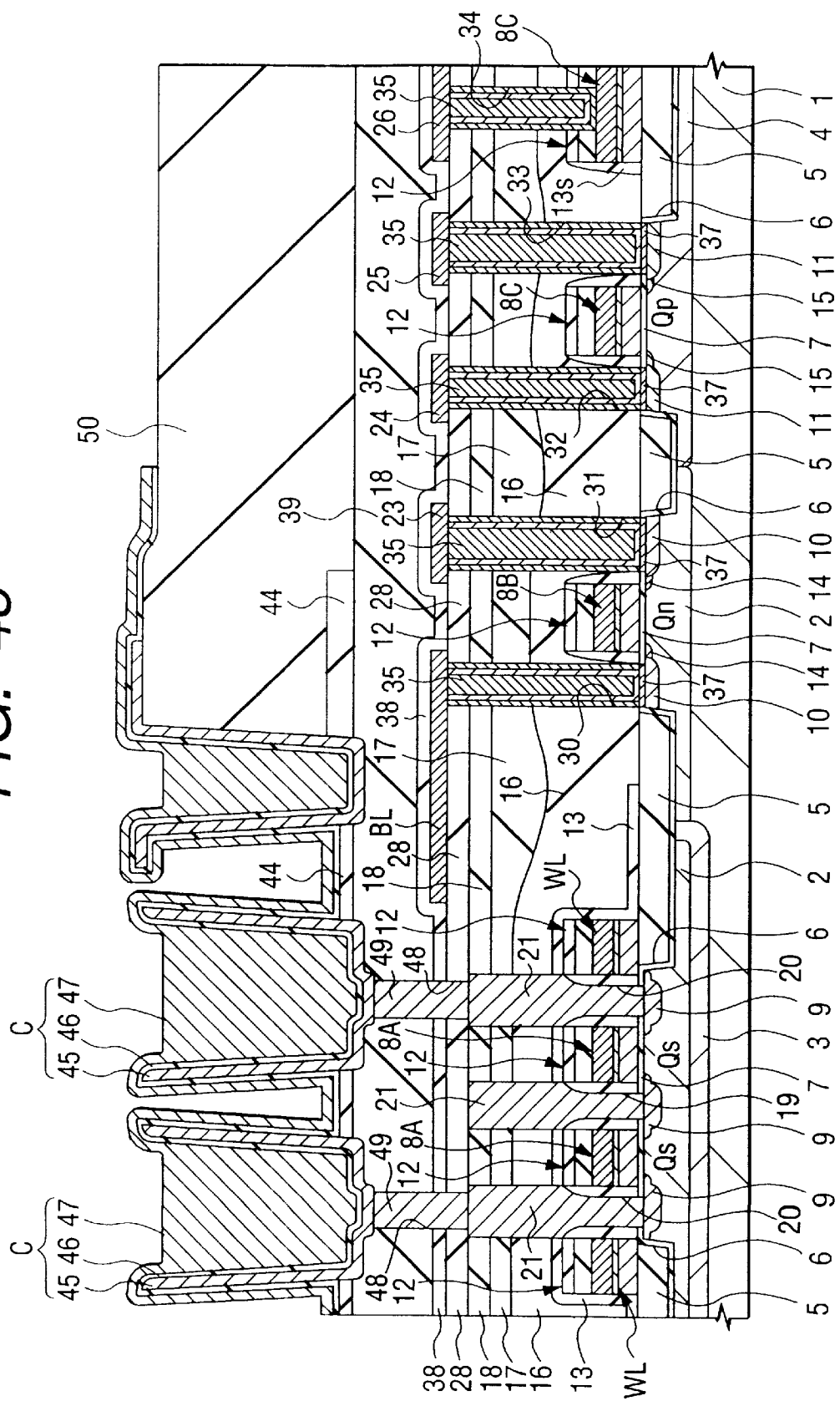
FIG. 48 is a section of an essential portion of the semiconductor substrate showing the DRAM manufacturing process subsequent to FIG. 47.

Next, as shown in FIG. 48, the TiN film is deposited over the $Ta_2O_5$ film 46 by using the CVD method and the sputtering method together, and then the TiN film and the $Ta_2O_5$ film 46 are patterned by the dry-etching treatment using the photoresist film as the mask, to complete the information storing capacity elements C which are constructed to include the upper electrodes 47 formed of the TiN film, the capacity insulating film formed of the $Ta_2O_5$ film 46, and the lower electrodes 45 formed of the polycrystalline silicon film (45A). By these steps, on the other hand, there are completed the memory cells which are constructed to include the memory cell selecting MISFETs Qs and the information storing capacity elements C connected in series with the former. The upper electrodes 47 of the information storing capacity elements C can also be formed of a conductive film other than the TiN film, such as a W film.

Figure 49:
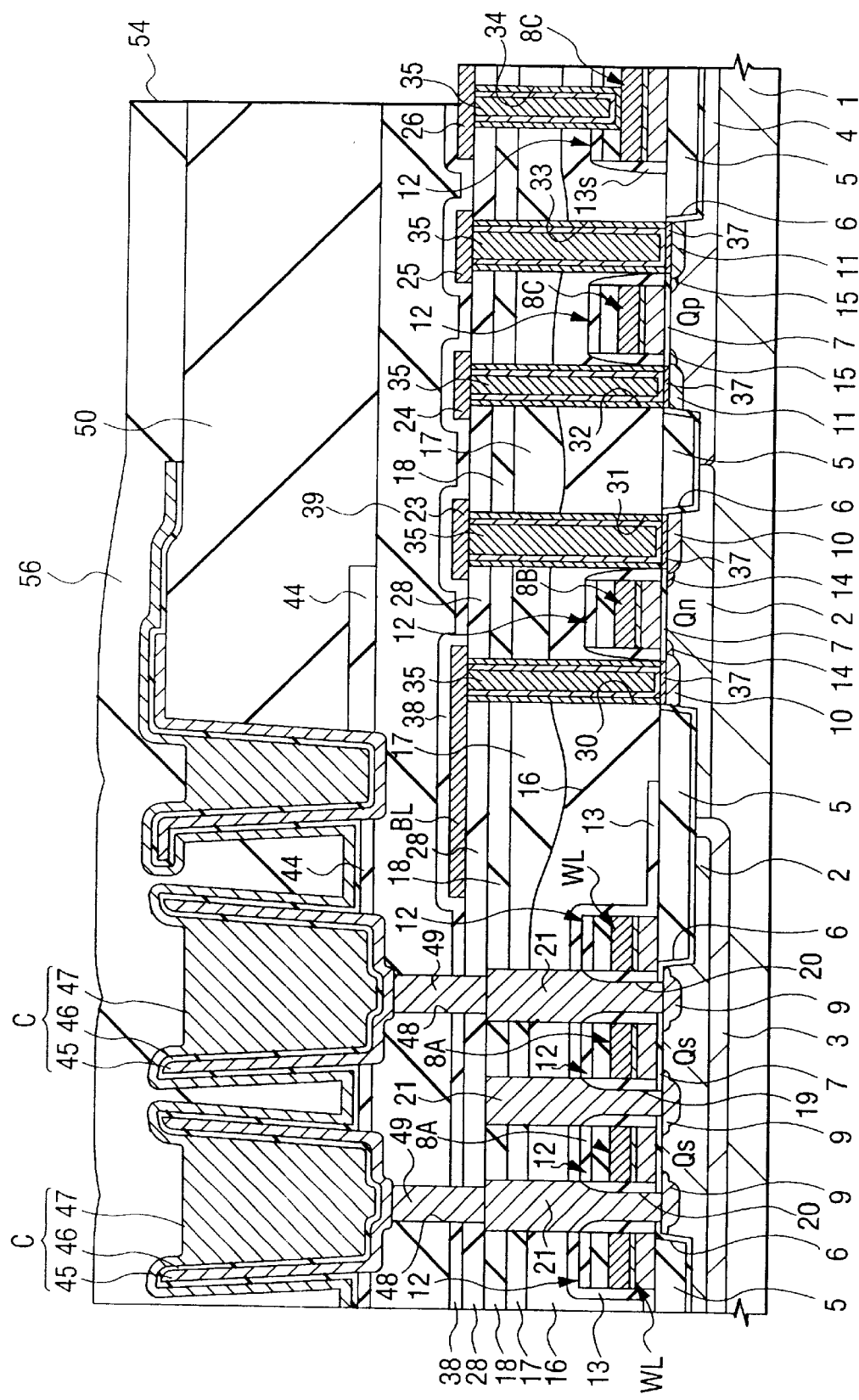
FIG. 49 is a section of an essential portion of the semiconductor substrate showing the DRAM manufacturing process subsequent to FIG. 48.

Next, as shown in FIG. 49, the layer insulating film 56 is formed over the information storing capacity elements C, and then the layer insulating film 56 of the peripheral circuit, the silicon oxide film 50, the SOG film 39 and the silicon oxide film 39 are etched by using the photoresist film as the mask, to form the through holes 54 over the first layer wiring lines 26. The layer insulating film 56 is formed of a silicon oxide film deposited by the CVD method, for example, to have a thickness of about 600 nm.

Figure 50:
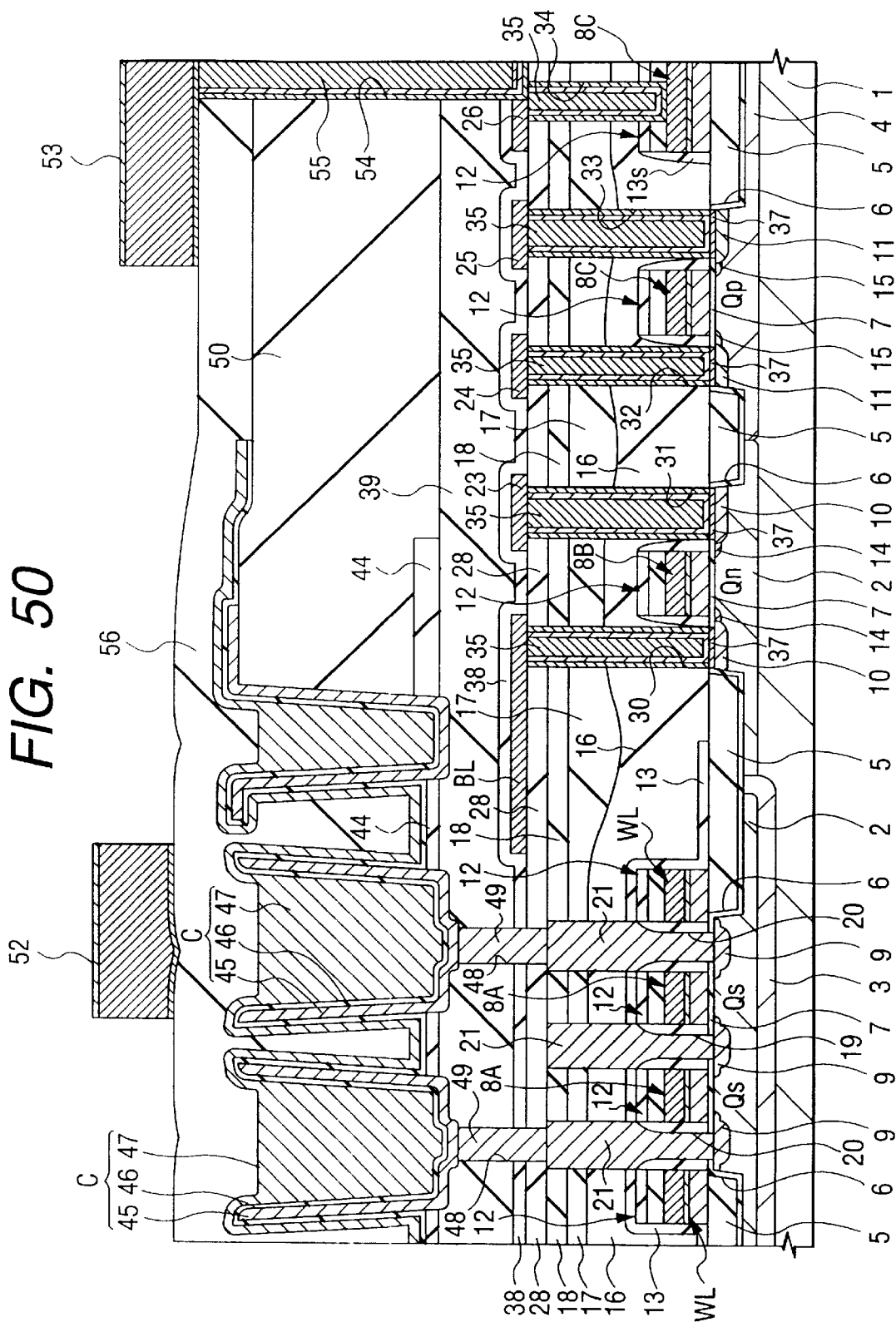
FIG. 50 is a section of an essential portion of the semiconductor substrate showing the DRAM manufacturing process subsequent to FIG. 49.

Next, as shown in FIG. 50, the plugs 55 are formed in the through holes 54, and the second layer wiring lines 52 and 53 are formed over the layer insulating film 56. The plugs 55 are formed by depositing the Ti film over the layer insulating film 56, for example, by the sputtering method,by depositing the TiN film and the W film thereover by the CVD method, and then by etching back (or dry-etching) those films and leaving them only in the through holes 54. The second layer wiring lines 52 and 53 are formed by depositing a Ti film having a thickness of about 50 nm, an Al (aluminum) film having a thickness of about 500 nm, a Ti film having a thickness of about 50 nm and a TiN film having a thickness of about 50 nm sequentially over the layer insulating film 56 by the sputtering method, and then by patterning those films by the dry-etching treatment using a photoresist film as the mask.

After the capacity insulating film of the information storing capacity elements C was formed, there is involved no step accompanied by a high heat treatment. Therefore, the material for the second layer wiring lines 52 and 53 to be formed over the layer insulating film 56 can be exemplified by the conductive material which is composed mainly of Al having a low electric resistance although inferior in the heat resistance to the refractory metal or its nitride. Since the problem of the film scrape is not caused because of no step accompanied by the hot heat treatment, on the other hand, the Ti film can be used for the barrier metal at the portion interfacing the layer insulating film 56 when the second layer wiring lines 52 and 53 are to be formed over the layer insulating film 56 made of silicon oxide.

Figure 51:
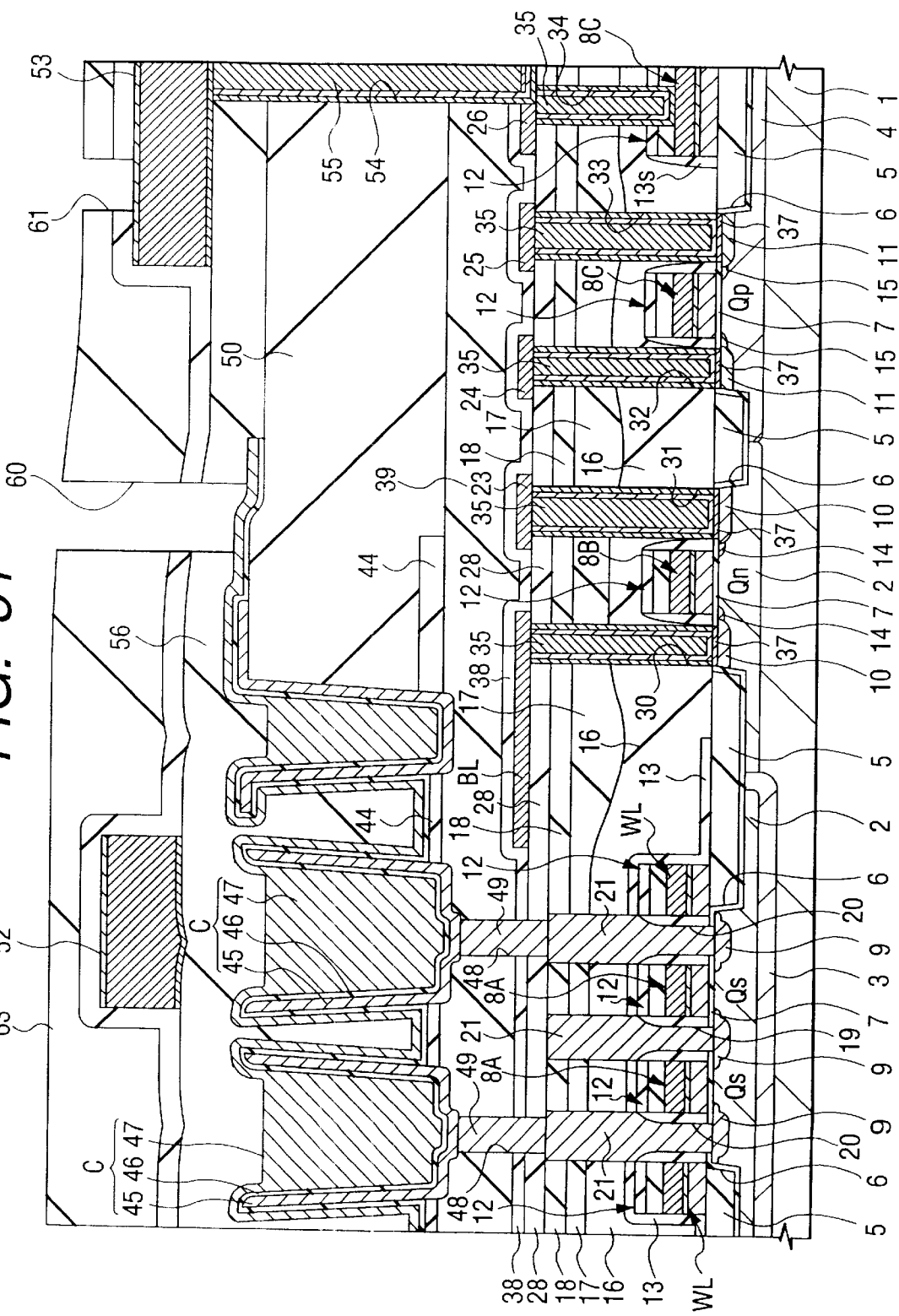
FIG. 51 is a section of an essential portion of the semiconductor substrate showing the DRAM manufacturing process subsequent to FIG. 50.

Next, as shown in FIG. 51, after the second layer insulating film 63 was formed over the second layer wiring lines 52 and 53, the layer insulating films 63 and 56 over the information storing capacity elements C are etched to form the through holes 60, and the layer insulating film 63 over the second wiring lines 53 of the peripheral circuit is etched to form the through holes 61. The second layer insulating film 63 is constructed, for example, to include a silicon oxide film having a thickness of about 300 nm deposited by the CVD method, an SOG film having a thickness of about 400 nm spin-applied to the former, and a silicon oxide film having a thickness of about 300 nm deposited thereover by the CVD method. The SOG film forming a portion of the layer insulating film 63 is baked at a temperature of about 400° C. so as to prevent deteriorations of the second layer wiring lines 52 and 53 made mainly of Al and the capacity insulating film of the information storing capacity elements C.

After this, the plugs 62 are formed in the through holes 60 and 61, and the third layer wiring lines 57, 58 and 59 are then formed over the layer insulating film, thus completing substantially the aforementioned DRAM shown in FIG. 3. The plugs 62 are made of the same conductive material (i.e., the W film/ the TiN film/ the Ti film) as that of the aforementioned plugs 55, for example, and the third layer wiring lines 57, 58 and 59 are formed of the same conductive material (i.e., the TiN film/ the Ti film/ the Al film/ the Ti film) as that of the second layer wiring lines 52 and 53, for example. Here, a high water-resistance dense insulating film (i.e., a two-layered insulating film composed of a silicon oxide film deposited by the plasma CVD method and a silicon nitride film) is deposited over the third layer wiring lines 57, 58 and 59, although not shown.

Although our invention has been specifically described in connection with its embodiments, it should not be limited thereto but could naturally be modified in various manners without departing from the gist thereof.

For example, the foregoing embodiments have been described on the case in which the information storing capacity elements have the cylindrical shape, but the invention should not be limited thereto but could be variously applied to fin type information storing capacity elements, for example.

On the other hand, the foregoing embodiments have been described on the case in which the invention is applied to the gate electrodes having the poly-metal structure, but the invention should not be limited thereto. The invention could also be applied to the case in which the gate electrodes are either constructed to have the so-called "polycide structure", in which a silicide film such as tungsten silicide is formed over a low-resistance polycrystalline silicon film, or made of only a metal film such as tungsten.

On the other hand, the foregoing embodiments have been described on the case in which the connection holes for electrically connecting the bit lines and the memory cell selecting MISFETs have the rectangular top plan shape. However, the invention should not be limited thereto, but the connection holes may have an ordinary circular shape. In this modification, the bit lines and the connection holes are electrically connected by extending the bit lines partially in a planar direction to intersect their extending direction, and by laying the extending portions over the connection holes. Alternatively, the two may be electrically connected by extending such a region of the active region to have the memory cell selecting MISFETs in the bit line direction as to form the connections holes for the bit lines, by forming the connection holes in the extended portion and by laying the straight bit lines over the connection holes.

In the description thus far made, our invention has been described on the case in which it is applied to the DRAM technique or the field of application of its background, but it should not be limited thereto. The invention could be applied to another semiconductor integrated circuit device such as another memory circuit chip such as a SRAM (Static Random Access Memory) or a flash memory (EEPROM: Electrically Erasable Programmable ROM), a logic circuit chip such as microprocessor, or a logic memory circuit chip having a logic circuit and a memory circuit on a common semiconductor chip.

The effects to be obtained by a representative of the invention disclosed herein will be briefly described in the following.

(1) According to the invention, the thickness can be made smaller than the case in which the cap insulating film is formed of only the silicon nitride film, so that the aspect ratio of the connection holes can be reduced. As a result, the conductive film can be easily buried in the connection holes to avoid the problems such as the increase in the electric resistance and the defective conduction, as might otherwise be caused due to shortage of the burial of the conductive film, so that the yield and reliability of the semiconductor integrated circuit device can be improved.

(2) According to the invention, the silicon nitride film of the cap insulating film can be thinned to avoid the problem that the cap insulating film may otherwise be separated or bulged by the heat treatment after the cap insulating film was formed. As a result, the yield and reliability of the semiconductor integrated circuit device can be improved.

(3) According to the invention, the cap insulating film over the gate electrodes has the laminated structure of the silicon oxide film and the silicon nitride film, and the stopper layer to be formed over the semiconductor substrate and the cap insulating film is formed of the silicon nitride film. As a result, the silicon nitride film of the stopper layer can be thinned to lower the contact resistance sufficiently even when the spacing between the adjoining gate electrodes is small. Moreover, the total thickness of the cap insulating film can be reduced to reduce the aspect ratio of the connection holes.

What is claimed is:

1. A process for manufacturing a semiconductor integrated circuit device, comprising the steps of:

(a) coating a semiconductor substrate with a first conductive film, a first insulating film and a second insulating film sequentially and patterning the same to form a plurality of first conductive film patterns;

(b) forming a third insulating film over the semiconductor substrate after said step (a), over the side walls of said first conductive film patterns and over said second insulating film, and forming a fourth insulating film over said third insulating film;

(c) after said step (b), forming a mask with a first opening between the adjoining ones of said plurality of first conductive film patterns over said fourth insulating film, and etching said fourth insulating film, as exposed from the first opening of said mask, under such a condition that said fourth insulating film is more easily etched off than said third and second insulating films, to form a second opening in said fourth insulating film; and (d) after said step (c), anisotropically etching said third insulating film, as exposed from the second opening of said fourth insulating film, under such a condition that said third insulating film is more easily etched off than said first insulating film and said fourth insulating film, to form a third opening for exposing the upper face of said semiconductor substrate, in the third insulating film between said adjoining first conductive film patterns.

2. A semiconductor integrated circuit device manufacturing process according to claim 1, wherein the etching of said step (c) is stopped so that the fourth insulating film exposed from said first opening may be removed whereas the first insulating film over said adjoining first conductive film patterns may not be exposed.

3. A semiconductor integrated circuit device manufacturing process according to claim 1, wherein the etching of said step (d) is stopped so that the third insulating film exposed from said second opening may be removed to expose the semiconductor substrate without completely removing the first insulating film over said adjoining first conductive film patterns.

4. A semiconductor integrated circuit device manufacturing process according to claim 1, wherein said first insulating film and said fourth insulating film are formed of a silicon oxide film whereas said second insulating film and said third insulating film are formed of a silicon nitride film.

5. A semiconductor integrated circuit device manufacturing process according to claim 1, wherein the sum of the thickness of said second insulating film and the thickness of said third insulating film is larger than the value which is calculated by dividing the thickness of the fourth insulating film, which exists from the upper face of the third insulating film over said semiconductor substrate to the upper face of the third insulating film over said first conductive film patterns, by the ratio of the etching rate of said fourth insulating film to said second insulating film and said third insulating film.

6. A semiconductor integrated circuit device manufacturing process according to claim 1, wherein the thickness of said first insulating film is larger than the value which is calculated by dividing the thickness of said third insulating film by the ratio of the etching rate of said third insulating film to said first insulating film.

7. A semiconductor integrated circuit device manufacturing process according to claim 1, wherein the thickness of said third insulating film is smaller than one half of the gap between said adjoining first conductive film patterns.

8. A semiconductor integrated circuit device manufacturing process according to claim 1, further comprising, before said step (a): (e) forming trenches in said semiconductor substrate; and (f) burying said trenches with an insulating film.

9. A semiconductor integrated circuit device manufacturing process according to claim 1, wherein the step of forming said fourth insulating film includes coating a SOG film.

10. A semiconductor integrated circuit device manufacturing process according to claim 1, wherein the step of forming said fourth insulating film includes the steps of: coating an SOG film; coating a silicon oxide film thereover; and polishing the silicon oxide film.

11. A semiconductor integrated circuit device manufacturing process according to claim 1, wherein the step of forming said fourth insulating film includes the steps of: coating a boron/phosphor silicate glass film; re-flowing the boron/phosphor silicate glass film; and polishing the upper face of the re-flown boron/phosphor silicate glass film.

12. A semiconductor integrated circuit device manufacturing process according to claim 1, wherein the step of coating the semiconductor substrate with said first conductive film includes the steps of: coating a polycrystalline silicon film; and forming a silicide film thereover.

13. A semiconductor integrated circuit device manufacturing process according to claim 1, wherein the step of coating the semiconductor substrate with said first conductive film includes the steps of: coating a polycrystalline silicon film; forming a barrier conductive film over the polycrystalline Si film; and forming a refractory metal film over the barrier conductive film.

14. A semiconductor integrated circuit device manufacturing process according to claim 13, wherein said barrier conductive film is a barrier conductive metal compound film.

15. A semiconductor integrated circuit device manufacturing process according to claim 14, wherein said barrier conductive metal compound film is a tungsten nitride film.

16. A semiconductor integrated circuit device manufacturing process according to claim 1, wherein, in said step (a), the first conductive film is coated over the semiconductor substrate, the first insulating film is coated over the first conductive film and the second insulating film is coated over the first insulating film, and wherein said patterning of step (a) includes the steps of: patterning said first insulating film and said second insulating film by using a photoresist film as the etching mask, and then removing said photoresist film; and patterning the first conductive film by using said first insulating film and said second insulating film patterned as the etching mask, to form said plurality of first conductive film patterns.

17. A process for manufacturing a semiconductor integrated circuit device, comprising the steps of:
  (a) coating a semiconductor substrate with a polycrystalline silicon films and then coating the polycrystalline silicon film with a barrier conductive film and the barrier conductive film with a refractory metal film to form a first conductive film;
  (b) forming a first insulating film for protecting said first conductive film over the first conductive film;
  (c) subjecting the semiconductor substrate after said step (b) to a heat treatment;
  (d) after said step (b), forming a second insulating film over said first insulating film for protecting said first conductive film;
  (e) patterning said second insulating film, said first insulating film and said first conductive film to form a plurality of conductive film patterns; and
  (f) after said step (e), washing and then oxidizing the semiconductor substrate.

18. A semiconductor integrated circuit device manufacturing process according to claim 17, further comprising:
  (g) forming a third insulating film over said semiconductor substrate after said step (f), on the side walls of said first conductive film patterns and over said second insulating film, and then forming a fourth insulating film over said third insulating film;
  (h) after said step (g), forming a mask with a first opening between the adjoining ones of said plurality of first conductive film patterns over said fourth insulating film, and etching said fourth insulating film, as exposed from the first opening of said mask, under such a condition that said fourth insulating film is more easily etched off than said third and second insulating films, to form a second opening in said fourth insulating film; and
  (i) after said step (h), anisotropically etching said third insulating film, as exposed from the second opening of said fourth insulating film, under such a condition that said third insulating film is more easily etched off than said first insulating film and said fourth insulating film, to form a third opening for exposing the upper face of said semiconductor substrate, in the third insulating film between said adjoining first conductive film patterns.

19. A semiconductor integrated circuit device manufacturing process according to claim 17, wherein said first conductive film protecting first insulating film is formed by the plasma CVD method.

20. A semiconductor integrated circuit device manufacturing process according to claim 17, wherein said barrier conductive film is made of tungsten nitride; and in that said washing treatment uses a washing liquid containing hydrogen peroxide.

21. A semiconductor integrated circuit device manufacturing process according to claim 17, wherein said first conductive film protecting first insulating film is formed of a silicon oxide film; and in that said second insulating film is made of silicon nitride.

22. A semiconductor integrated circuit device manufacturing process according to claim 17, wherein said barrier conductive film is a barrier conductive metal compound film.

23. A semiconductor integrated circuit device manufacturing process according to claim 22, wherein said barrier conductive metal compound film is a tungsten nitride film.

24. A process for manufacturing a semiconductor integrated circuit device, comprising:
(a) forming a gate insulating film over a semiconductor substrate and then forming a first conductive film;
(b) forming a first insulating film over said first conductive film;
(c) forming a second insulating film over said first insulating film;
(d) patterning said second insulating film, said first insulating film and said first conductive film, to form a plurality of word lines and a plurality of gate electrodes over said semiconductor substrate, and a cap insulating film composed of said first insulating film and said second insulating film over said word lines and said gate electrodes;
(e) forming a third insulating film over said semiconductor substrate, on the side walls of said word, on the side walls of said gate electrodes and over said cap insulating film, after said step (d), and then forming a fourth insulating film over said third insulating film;
(f) after said step (e), forming a mask with a first opening between the adjoining ones of said plurality of word lines over said fourth insulating film, and etching said fourth insulating film, as exposed from the first opening of said mask, under such a condition that said fourth insulating film is more easily etched off than said third and second insulating films, to form a second opening in said fourth insulating film
(g) after said step (f), anisotropically etching said third insulating film, as exposed from the second opening of said fourth insulating film, under such a condition that said third insulating film is more easily etched off than said first insulating film and said fourth insulating film, to form a third opening for exposing the upper face of said semiconductor substrate, in the third insulating film between said adjoining word lines;
(h) burying a conductive film in said plurality of connection holes;
(i) forming bit lines to be electrically connected with the bit line connecting conductive film of said conductive film; and
(j) forming information storing capacity elements to be electrically connected with the capacity element connecting conductive film of said conductive film.

25. A semiconductor integrated circuit device manufacturing process according to claim 24, further comprising, prior to said step (a), forming trenches in the isolating regions of said semiconductor substrate and then coating the semiconductor substrate including the trenches with an insulating film; and removing said insulating film to leave it in said trenches to form the buried insulating film in said trenches thereby to form trench isolating regions.

26. A semiconductor integrated circuit device manufacturing process according to claim 24, wherein the step of forming said first conductive film includes the steps of coating a polycrystalline silicon film; coating said polycrystalline silicon film with a barrier conductive film; and coating said barrier conductive film with a refractory metal film.

27. A semiconductor integrated circuit device manufacturing process according to claim 26, wherein the barrier conductive film is made of tungsten nitride, and wherein the process further comprises the steps of: performing a heat treatment after the step of forming said first insulating film to densify the tungsten nitride of which said barrier conductive film is made; and after said step (d), performing a washing treatment by using a washing liquid containing an aqueous solution of hydrogen peroxide, and then an oxidizing treatment.

28. A semiconductor integrated circuit device manufacturing process according to claim 26, wherein said barrier conductive film is a barrier conductive metal compound film.

29. A semiconductor integrated circuit device manufacturing process according to claim 28, wherein said barrier conductive metal compound film is a tungsten nitride film.

30. A semiconductor integrated circuit device manufacturing process according to claim 24, wherein said first insulating film is formed by the plasma CVD method whereas said second insulating film is formed by the low-pressure CVD method.

31. A semiconductor integrated circuit device manufacturing process according to claim 24, wherein said first insulating film is formed of a silicon oxide film whereas said second insulating film is made of silicon nitride.

32. A semiconductor integrated circuit device manufacturing process according to claim 24, wherein in the top plan size of said bit line connecting conductive film, the size of said word lines in the extending direction is longer than that of said word lines in the intersecting direction so that said bit line connecting conductive film overlaps the isolating regions in a top plan.

33. A process for manufacturing a semiconductor integrated circuit device, comprising the steps of:
(a) forming a first conductive film, a first insulating film and a second insulating film sequentially over a semiconductor substrate and patterning the same to form first conductor patterns in a first region and second conductor patterns in a second region;
(b) forming a third insulating film over the side walls of said first conductor patterns and said second conductor patterns;
(c) doping the surface of said semiconductor substrate in said second region with a first conduction type impurity in self-alignment with said third insulating film;
(d) forming a fourth insulating film over said third insulating film in said first and second regions to bury said first region between said first conductor patterns;
(e) forming a first opening in said fourth insulating film in said first region between said first conductor patterns under such a condition that said fourth insulating film is more easily etched off than said third insulating film; and
(f) forming a second opening in said third insulating film, as exposed in said first opening.

34. A process for manufacturing a semiconductor integrated circuit device, comprising the steps of:
(a) forming a first conductive film, a first silicon oxide film and a first silicon nitride film sequentially over a semiconductor substrate and patterning the same to form first conductor patterns in a first region and second conductor patterns in a second region;

(b) forming a second silicon nitride film over the side walls of said first conductor patterns and said second conductor patterns;

(c) doping the surface of said semiconductor substrate in said second region with an N-type first impurity in self-alignment with said second silicon nitride film;

(d) forming a second silicon oxide film over said second silicon nitride film in said first and second regions to bury said first region between said first conductor patterns;

(e) forming a first opening in said second silicon oxide film in said first region between said first conductor patterns under such a condition that said second silicon oxide film is more easily etched off than said second silicon nitride film; and (f) forming a second opening in said second silicon nitride film, as exposed in said first opening, to expose said semiconductor substrate.

35. A semiconductor integrated circuit device manufacturing process according to claim 34, further comprising, between said steps (a) and (b), (g) doping the surface of said semiconductor substrate in said second region with an N-type second impurity in self-alignment with said second conductor patterns.

36. A semiconductor integrated circuit device manufacturing process according to claim 34, further comprising, between said steps (b) and (c), (h) anisotropically etching said second silicon nitride film to form a first side wall insulating film on the side walls of said second conductor patterns, wherein the doping of said semiconductor substrate surface with said first impurity is performed in self-alignment with said first side wall insulating film.

37. A semiconductor integrated circuit device manufacturing process according to claim 34, wherein a second side wall insulating film is formed on the side walls of said first conductor patterns at the steps of forming said first and second openings.

38. A process for manufacturing a semiconductor integrated circuit device that has a memory cell array region and a peripheral circuit region, comprising the steps of:

(a) forming a first conductive film, a first insulating film and a second insulating film sequentially over a semiconductor substrate, and patterning the same to form first conductor patterns in said memory cell array region and second conductor patterns in said peripheral circuit region;

(b) forming a third insulating film over the semiconductor substrate after said step (a), over the side walls of said first conductor patterns and said second conductor patterns;

(c) anisotropically etching said third insulating film in said peripheral circuit region to form side walls;

(d) forming a fourth insulating film over said third insulating film over said semiconductor substrate;

(e) forming a first mask with a first opening, in said memory cell array region, between adjoining ones of said first conductor patterns, over said fourth insulating film, and etching said fourth insulating film exposed from said first opening of said first mask, under such a condition that said fourth insulating film is more easily etched off than said third insulating film, to form a second opening in said fourth insulating film;

(f) anisotropically etching said third insulating film in said memory cell array region, under such a condition that said third insulating film is more easily etched off than said first and said fourth insulating films, to form a third opening for exposing the surface of said semiconductor substrate, in said third insulating film between said adjoining ones of said first conductor patterns;

(g) burying a second conductive film in said second opening and said third opening;

(h) forming a second mask with a fourth opening formed in said peripheral circuit region, over said fourth insulating film, and etching said fourth insulating film exposed from said fourth opening of said second mask to form fifth openings in said fourth insulating film for exposing the surface of said semiconductor substrate; and (i) burying a third conductive film in said fifth openings.

39. A semiconductor integrated circuit device manufacturing process according to claim 38, further comprising the steps, after step (i), of:

(j) forming bit lines, in said memory cell array region, to be electrically connected with a bit line connecting conductive film portion of said second conductive film; and (k) forming information storing capacity elements, in said memory cell array region, to be electrically connected with a capacity element connecting conductive film portion of said second conductive film.

40. A semiconductor integrated circuit device manufacturing process according to claim 38, wherein said first conductor patterns in said memory cell array region comprise word lines.

41. A semiconductor integrated circuit device manufacturing process according to claim 40, wherein a length of said first opening of said first mask in an intersecting direction of word lines is larger than a space between adjacent word lines, so that said first opening overlaps the word lines in a top plan.

42. A semiconductor integrated circuit device manufacturing process according to claim 38, including the further steps, prior to the step (a), of forming trenches in isolation regions of said semiconductor substrate and then coating said semiconductor substrate including said trenches with a trench insulating film; and removing said trench insulating film to leave it in said trenches thereby to form trench isolation regions.

43. A semiconductor integrated circuit device manufacturing process according to claim 42, wherein said fifth openings, in said peripheral circuit region, do not overlap said trench isolation regions.

* * * * *